(12) United States Patent
Lin et al.

(10) Patent No.: US 12,107,013 B2
(45) Date of Patent: Oct. 1, 2024

(54) SEMICONDUCTOR DEVICES AND METHODS OF MANUFACTURING THEREOF

(71) Applicant: Taiwan Semicondutor Manufacturing Company Limited, Hsinchu (TW)

(72) Inventors: Shih-Yao Lin, New Taipei (TW); Chih-Han Lin, Hsinchu (TW); Shu-Yuan Ku, Zhubei (TW); Shu-Uei Jang, Hsinchu (TW); Ya-Yi Tsai, Hsinchu (TW); I-Wei Yang, Yilan County (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 70 days.

(21) Appl. No.: 17/166,558

(22) Filed: Feb. 3, 2021

(65) Prior Publication Data
US 2021/0335674 A1  Oct. 28, 2021

Related U.S. Application Data

(60) Provisional application No. 63/016,594, filed on Apr. 28, 2020.

(51) Int. Cl.
*H01L 21/8234* (2006.01)
*H01L 27/088* (2006.01)

(52) U.S. Cl.
CPC ......... *H01L 21/823481* (2013.01); *H01L 21/823431* (2013.01); *H01L 27/0886* (2013.01)

(58) Field of Classification Search
CPC ..... H01L 21/823481; H01L 21/823431; H01L 27/0886; H01L 29/785
See application file for complete search history.

(56) References Cited

U.S. PATENT DOCUMENTS

| | | | |
|---|---|---|---|
| 9,601,492 B1 * | 3/2017 | Deng | H01L 29/0653 |
| 2016/0233298 A1 * | 8/2016 | Webb | H01L 21/823821 |
| 2018/0047634 A1 * | 2/2018 | Jun | H01L 21/823481 |
| 2018/0308949 A1 * | 10/2018 | Lin | H01L 21/823431 |

(Continued)

FOREIGN PATENT DOCUMENTS

| | | |
|---|---|---|
| TW | 201743446 A | 12/2017 |
| TW | 201913887 A | 4/2019 |
| TW | 201919110 A | 5/2019 |

*Primary Examiner* — Tuan A Hoang
(74) *Attorney, Agent, or Firm* — FOLEY & LARDNER LLP

(57) ABSTRACT

A semiconductor device includes a first semiconductor fin extending along a first direction. The semiconductor device includes a second semiconductor fin also extending along the first direction. The semiconductor device includes a dielectric structure disposed between the first and second semiconductor fins. The semiconductor device includes a gate isolation structure vertically disposed above the dielectric structure. The semiconductor device includes a metal gate layer extending along a second direction perpendicular to the first direction, wherein the metal gate layer includes a first portion straddling the first semiconductor fin and a second portion straddling the second semiconductor fin. The gate isolation structure separates the first and second portions of the metal gate layer from each other and includes a bottom portion extending into the dielectric structure.

20 Claims, 49 Drawing Sheets

(56) References Cited

U.S. PATENT DOCUMENTS

| | | | |
|---|---|---|---|
| 2019/0067120 A1* | 2/2019 | Ching | ............. H01L 21/823431 |
| 2019/0148539 A1* | 5/2019 | Yang | ................... H01L 23/5329 |
| | | | 257/401 |
| 2020/0006075 A1* | 1/2020 | Wang | .............. H01L 21/823481 |
| 2020/0058649 A1 | 2/2020 | Ching et al. | |
| 2020/0066718 A1 | 2/2020 | Li et al. | |
| 2020/0091145 A1* | 3/2020 | Guha | .............. H01L 21/823437 |

* cited by examiner

SEMICONDUCTOR DEVICES AND METHODS OF MANUFACTURING THEREOF

CROSS-REFERENCE TO RELATED APPLICATION

The present application claims priority to U.S. Provisional Application No. 63/016,594, filed on Apr. 28, 2020, which is incorporated by reference herein in its entirety.

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
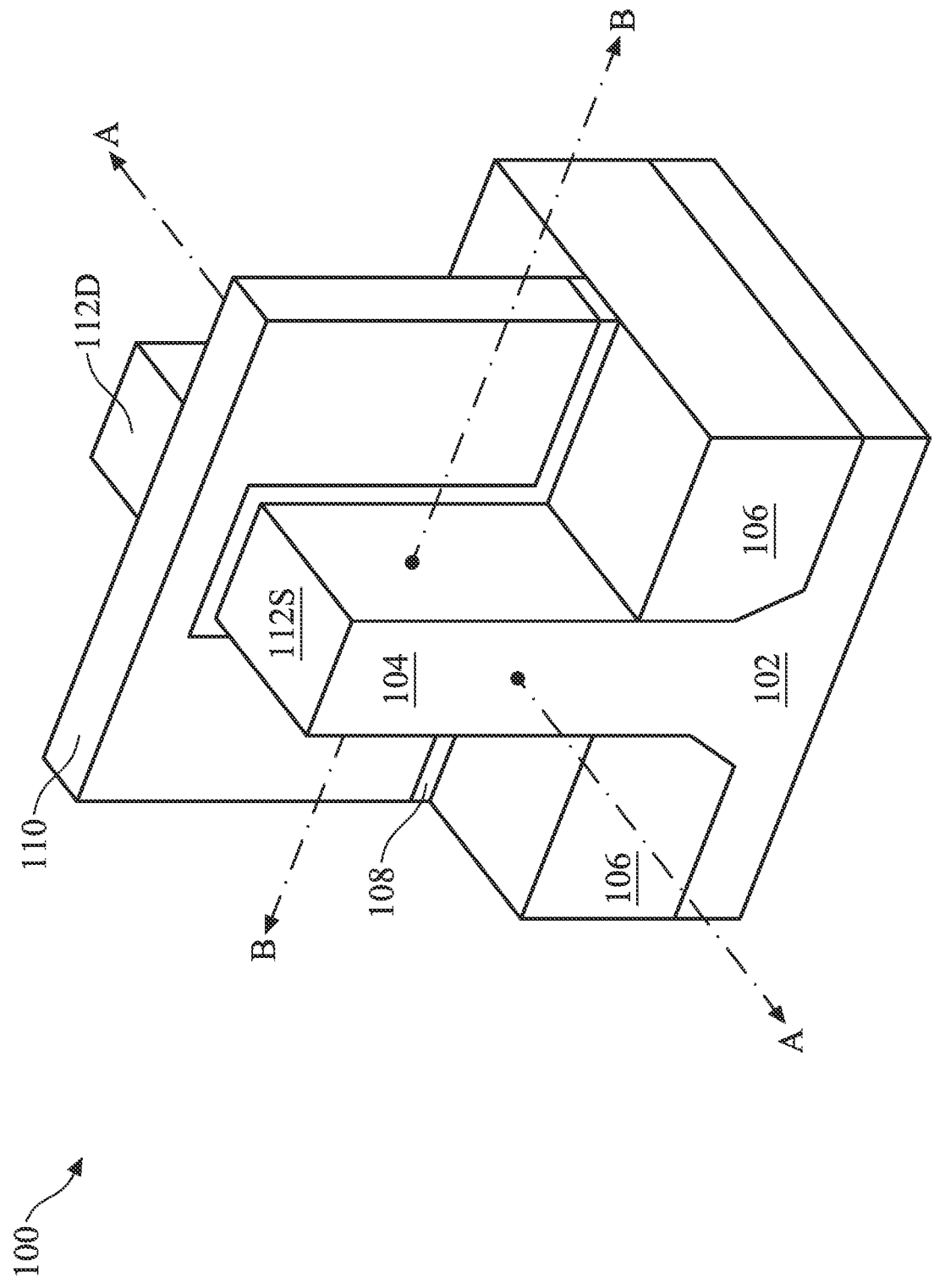
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming a replacement gate of a FinFET device. In some embodiments, a dummy gate structure is formed over a number of fins. The fins can include one or more active fins and one or more dummy fins. Hereinafter, the term "active fin" is referred to as a fin that will be adopted as an active channel to electrically conduct current in a finished semiconductor device (e.g., FinFET device 300 shown below), when appropriately configured and powered; and the term "dummy fin" is referred to as a fin that will not be adopted as an active channel (i.e., a dummy channel) to electrically conduct current in a finished semiconductor device (e.g., FinFET device 300 shown below). Next, gate spacers are formed around the dummy gate structure. After an interlayer dielectric (ILD) layer is formed around the gate spacers to overlay respective source/drain regions for each of the active fins, a portion of the dummy gate structure over at least one of the dummy fins or an isolation region between two adjacent ones of the active fins is removed. In addition to removing the portion of the dummy gate structure, an upper portion of the at least one dummy fin or the isolation region can be removed. Next, the removed portion of the dummy gate structure and the removed upper portion (of the dummy fin or the isolation region) are replaced with a gate isolation structure. Next, the remaining portion of the dummy gate structure is replaced with an active gate structure, which can include one or more metal gate layers.

Metal gate layers over multiple fins formed by the above described method can reduce gate leakage in advanced processing nodes. The gate isolation structure is formed over the dummy fin to disconnect, intercept, cut, or otherwise separate the metal gate layers. Forming the gate isolation structure to cut metal gate layers can allow different portions of the metal gate layers to be electrically coupled to respective active fin(s). In other words, the different portions of the metal gate layers are desired to be electrically isolated from each other.

However, a gate isolation structure formed by the existing technologies, may not completely separate the different portions of the metal gate layers, which can induce a short circuit established therebetween. For example, the existing technologies typically stop the removal process of the dummy gate structure upon exposing the dummy fin or the isolation region, where the dummy fin and the isolation region function as an etch stop layer. Due to processing variation (e.g., where some dummy fins have a shorter height and some other dummy fins have a higher height), a portion of the dummy gate structure, which should have been removed, may still remain on the shorter dummy fins after the removal process. Such a remaining portion of the dummy gate structure may sometimes be referred to as residual dummy gate structure. During the replacement of the active gate structure, such a residual dummy gate structure may also be replaced with a conductive material (e.g., a metal gate layer of the active gate structure), which results in shorting different portions of the metal gate layer that should be electrically isolated from each other. As such, undesired gate leakage may be induced.

By further removing an upper portion of the dummy fin or the isolation region subsequently to it being exposed, even though the above-mentioned processing variation occurs, it can be assured that no portion of the dummy gate structure remains on the dummy fin or the isolation region. A gate isolation structure can be formed over the dummy fin or the isolation region. As such, after replacing the dummy gate structure with an active gate structure, a metal gate layer of the active gate structure can include two portions, separated by the gate isolation structure, that are electrically isolated from each other. In this way, the undesired gate leakage can be avoided. Further, by tuning the etching selectivity of the dummy fin/isolation region to the dummy gate structure, the amount of lateral etching can be advantageously limited, which can prevent a critical dimension (CD) of each of the different portions of the metal gate layer from being suffered (e.g., reduced).

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source region 112S and drain region 112D are in (or extended from) the fin 104 and on opposing sides of the gate dielectric 108 and the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the source/drain regions 112S/112D. Subsequent figures refer to these reference cross-sections for clarity.

Figure 2:
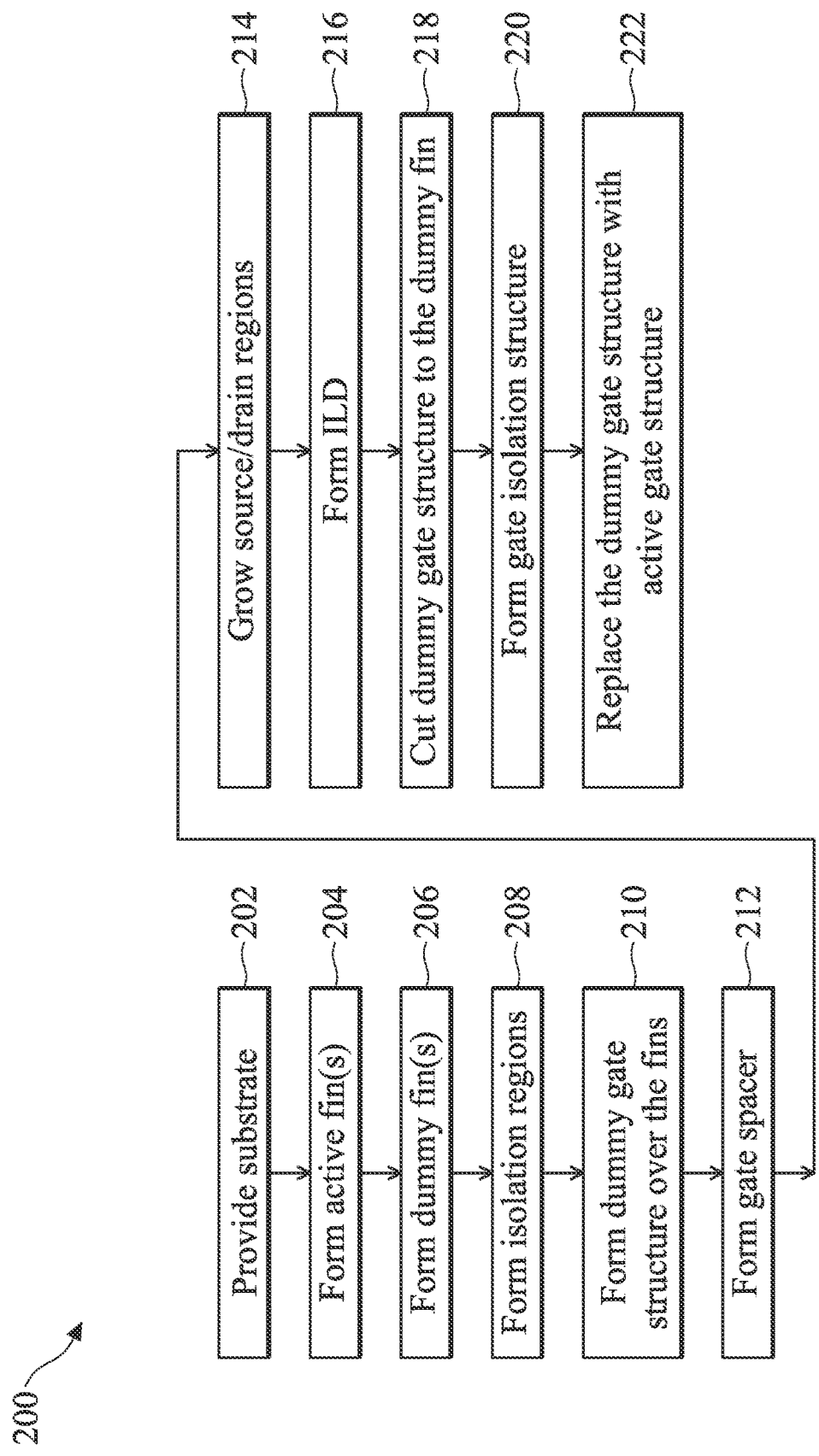
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device (e.g., FinFET device 100), a nanosheet transistor device, a nanowire transistor device, a vertical transistor device, a gate-all-around (GAA) transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5, 6, 7, 8, 9, 10, 11, 12, 13, 14A, 14B, 14C, 14D, 14E, 14F, 15A, 15B, 15C, 15D, 16, 17, 18, 19, and 20, respectively, which will be discussed in further detail below.

In brief overview, the method 200 starts with operation 202 of providing a substrate. The method 200 continues to operation 204 of forming one or more active fins. The method 200 continues to operation 206 of forming one or more dummy fins. The method 200 continues to operation 208 of forming isolation regions. The method 200 continues to operation 210 of forming a dummy gate structure over the fins. The dummy gate structures can include a dummy gate dielectric and a dummy gate disposed above the dummy gate dielectric. The method 200 continues to operation 212 of forming a gate spacer. The gate spacers are extended along sidewalls of the dummy gate structure. The method 200 continues to operation 214 of growing source/drain regions. The method 200 continues to operation 216 of forming an interlayer dielectric (ILD). The method 200 continues to operation 218 of cutting the dummy gate structure, which extends into at least one of the dummy fins. The method 200 continues to operation 220 of forming a gate isolation structure. The method 200 continues to operation 222 of replacing the dummy gate structure with an active gate structure.

Figure 11:
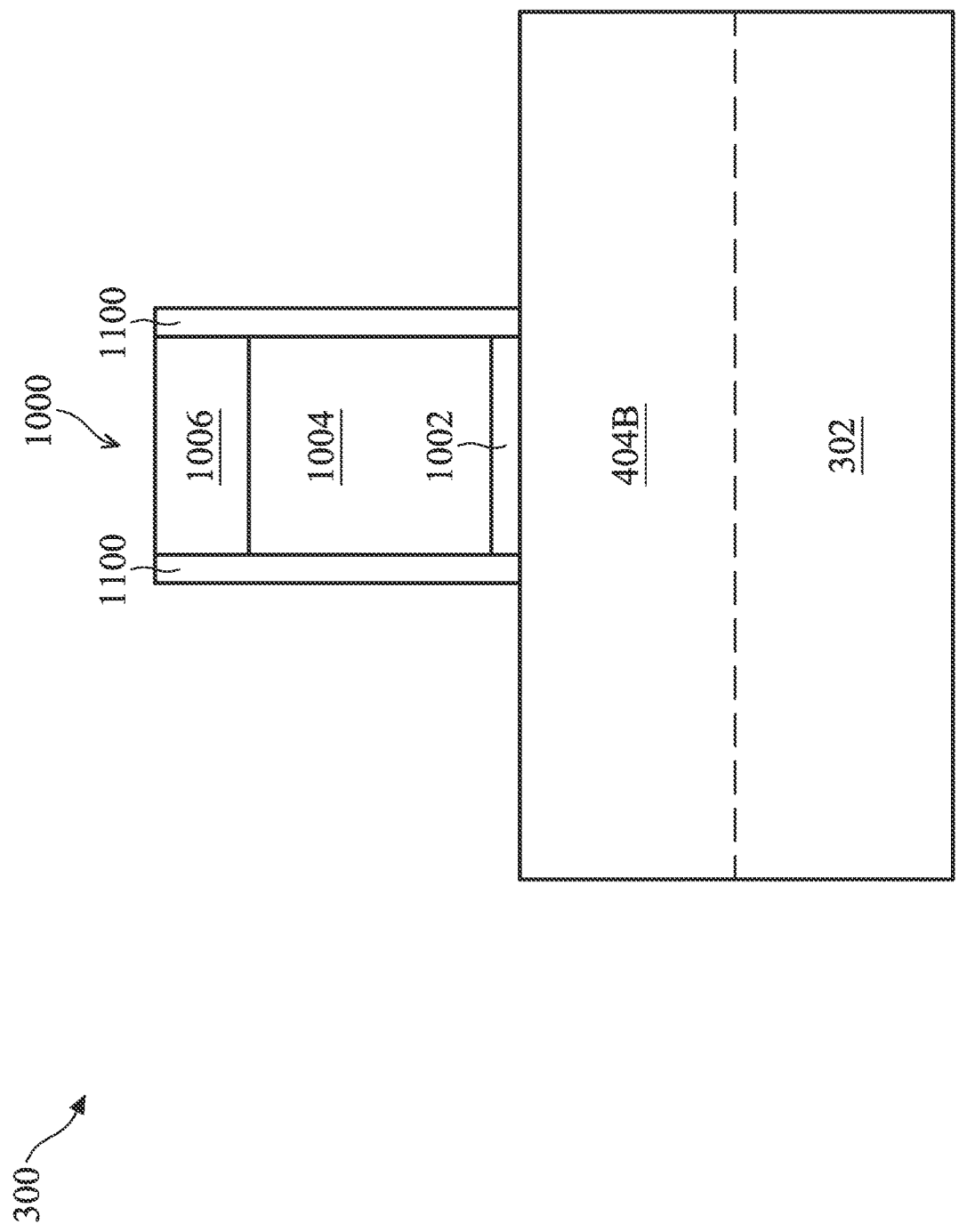
Figure 12:
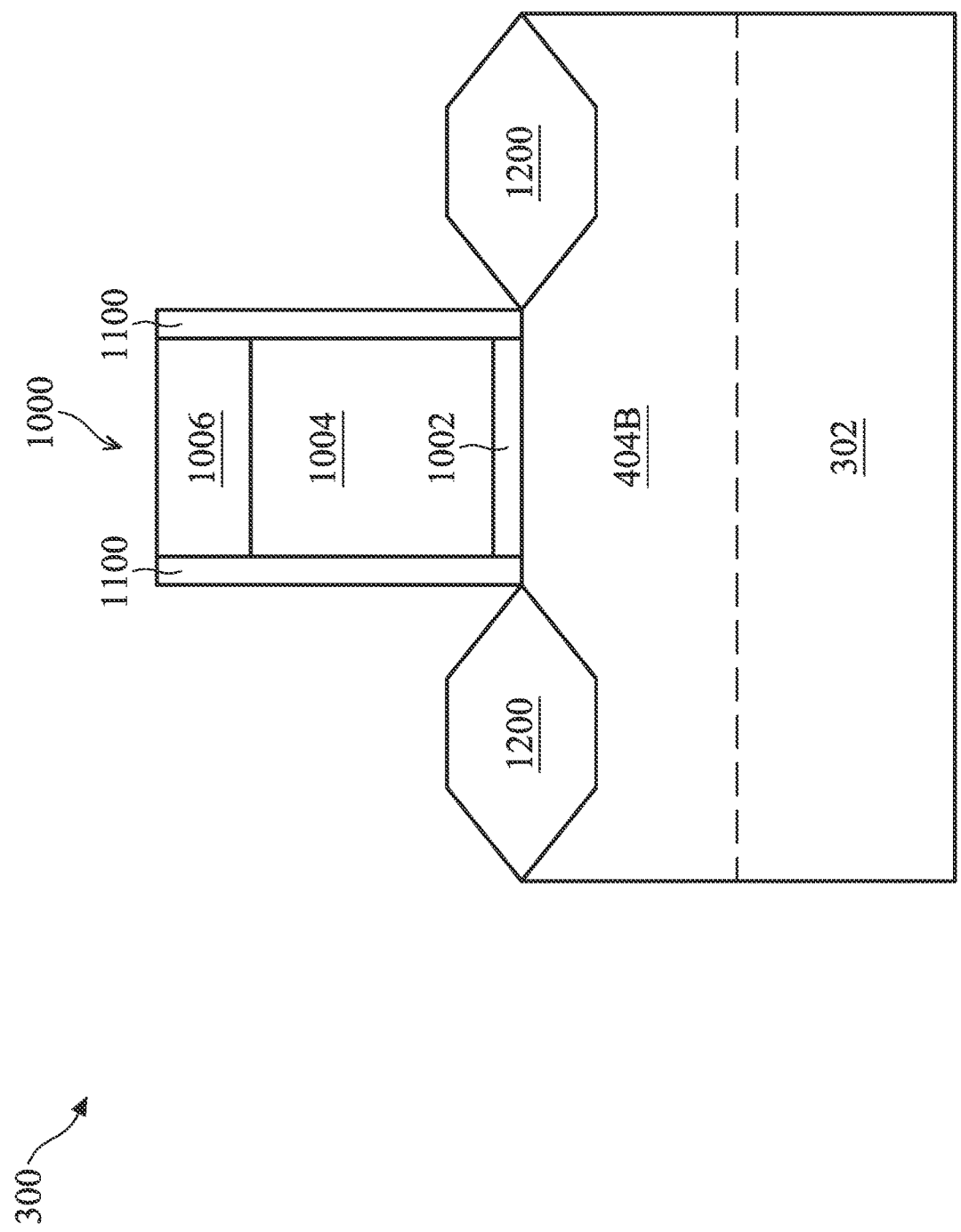
Figure 13:
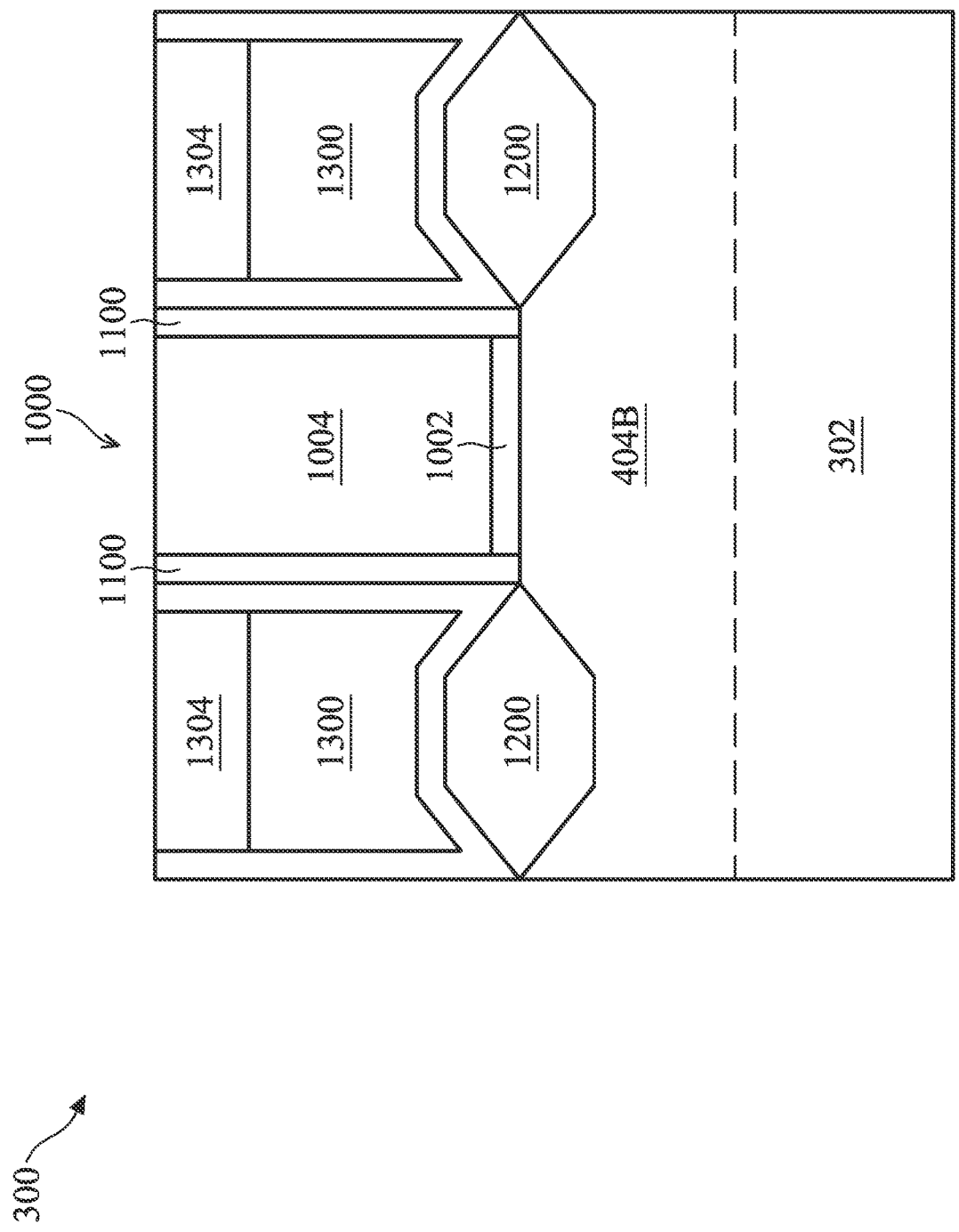

As mentioned above, FIGS. 3-20 each illustrate, in a cross-sectional view, a portion of a FinFET device 300 at various fabrication stages of the method 200 of FIG. 2. The FinFET device 300 is similar to the FinFET device 100 shown in FIG. 1, but with multiple fins. For example, FIGS. 3-10, 14A-F, 16, and 20 illustrate cross-sectional views of the FinFET device 300 along cross-section B-B (as indicated in FIG. 1); FIGS. 11-13 illustrate cross-sectional views of the FinFET device 300 along cross-section A-A (as indicated in FIG. 1); and FIGS. 15A-D and 17-19 illustrate cross-sectional views of the FinFET device 300 along a direction parallel to cross-section B-B. Although FIGS. 3-20 illustrate the FinFET device 300, it is understood the FinFET device 300 may include a number of other devices such as inductors, fuses, capacitors, coils, etc., which are not shown in FIGS. 3-20, for purposes of clarity of illustration.

Figure 3:
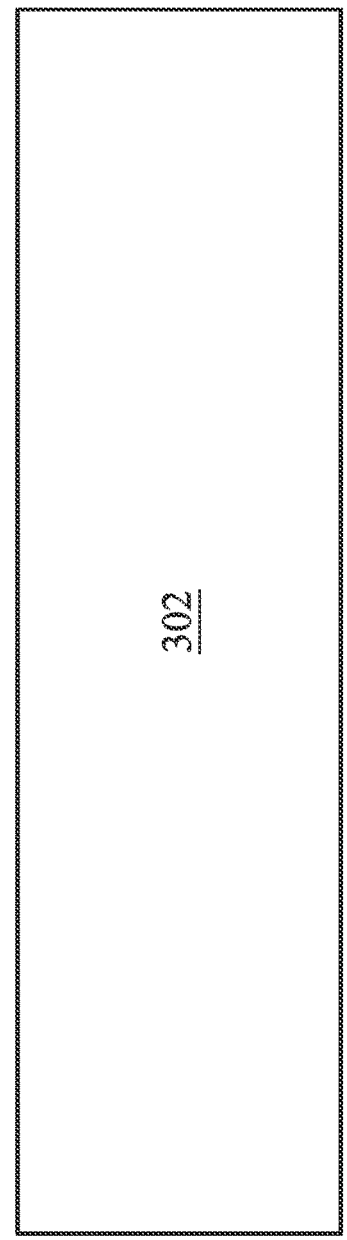
FIGS. 3, 4, 5, 6, 7, 8, 9, 10, 11, 12, 13, 14A, 14B, 14C, 14D, 14E, 14F, 15A, 15B, 15C, 15D, 16, 17, 18, 19, and 20 illustrate cross-sectional views of an example FinFET device (or a portion of the example FinFET device) during various fabrication stages, made by the method of FIG. 2, in accordance with some embodiments.

Corresponding to operation 202 of FIG. 2, FIG. 3 is a cross-sectional view of the FinFET device 300 including a semiconductor substrate 302 at one of the various stages of fabrication. The cross-sectional view of FIG. 3 is cut along the lengthwise direction of an active/dummy gate structure of the FinFET device 300 (e.g., cross-section B-B indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
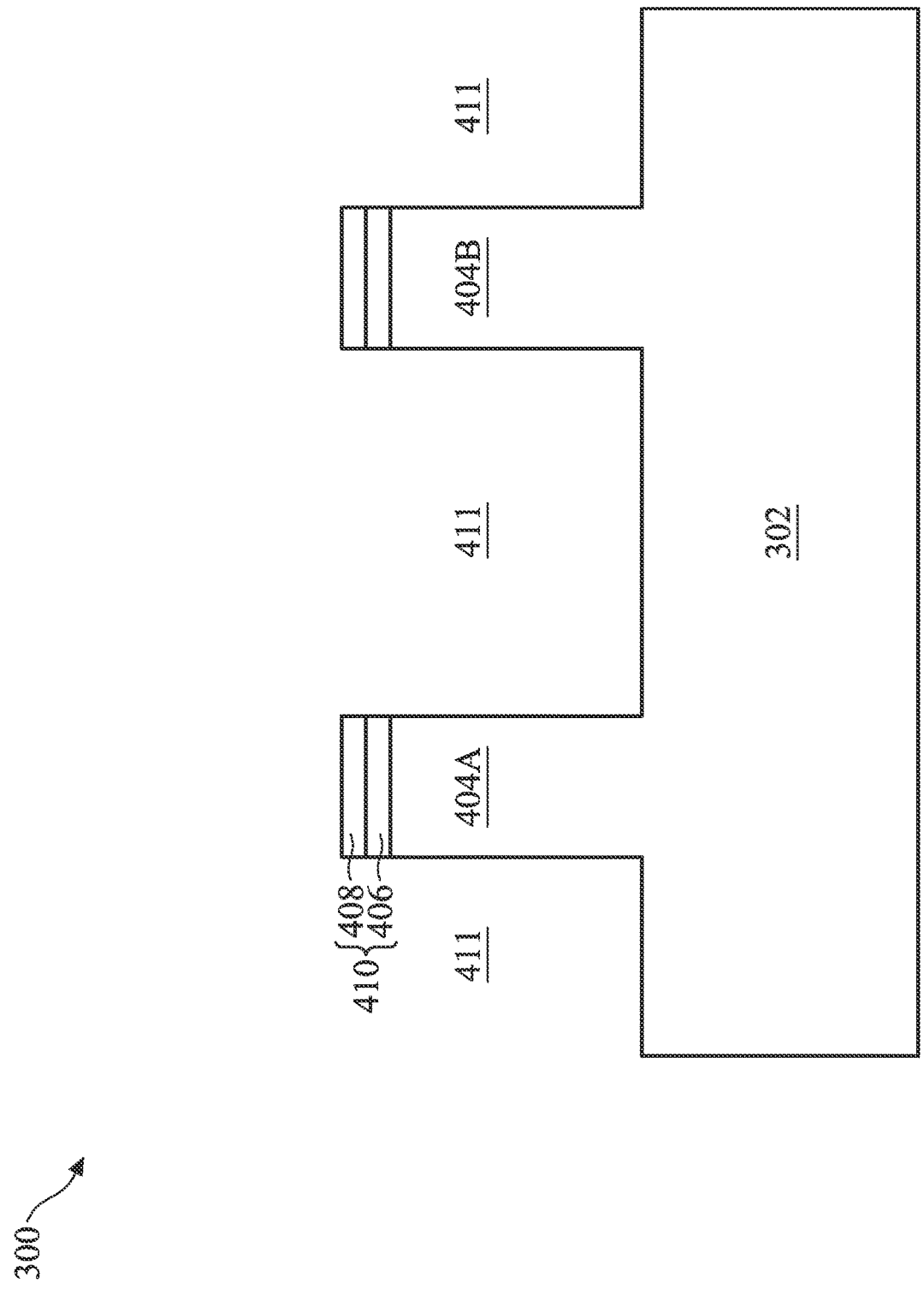

Corresponding to operation 204 of FIG. 2, FIG. 4 is a cross-sectional view of the FinFET device 300 including semiconductor fins 404A and 404B at one of the various stages of fabrication. The cross-sectional view of FIG. 4 is cut along the lengthwise direction of an active/dummy gate structure of the FinFET device 300 (e.g., cross-section B-B indicated in FIG. 1).

The semiconductor fins 404A-B may be each configured as an active fin, which will be adopted as an active (e.g., electrically functional) fin or channel in a respective completed FinFET. Hereinafter, the semiconductor fins 404A-B may sometimes be referred to as "active fins 404A-B." Although two semiconductor fins are shown in the illustrated example, it should be appreciated that the FinFET device 300 can include any number of semiconductor fins while remaining within the scope of the present disclosure.

The semiconductor fins 404A-B are formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. Although only one pad nitride layer 408 is illustrated, a multilayer structure (e.g., a layer of silicon oxide on a layer of silicon nitride) may be formed as the pad nitride layer 408. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining the active fins 404A-B between adjacent trenches 411 as illustrated in FIG. 4. When multiple fins are formed, such a trench may be disposed between any adjacent ones of the fins. In some embodiments, the active fins 404A-B are formed by etching trenches in the substrate 302 using, for example, reactive ion etch (RIE), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the active fins 404A-B.

The active fins 404A-B may be patterned by any suitable method. For example, the active fins 404A-B may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

FIGS. 3 and 4 illustrate an embodiment of forming the active fins 404A-B, but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the active fins 404A-B that include the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the active fins 404A-B may include silicon germanium ($Si_xGe_{1-x}$, where x can be between 0 and 1), silicon carbide, pure silicon, pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
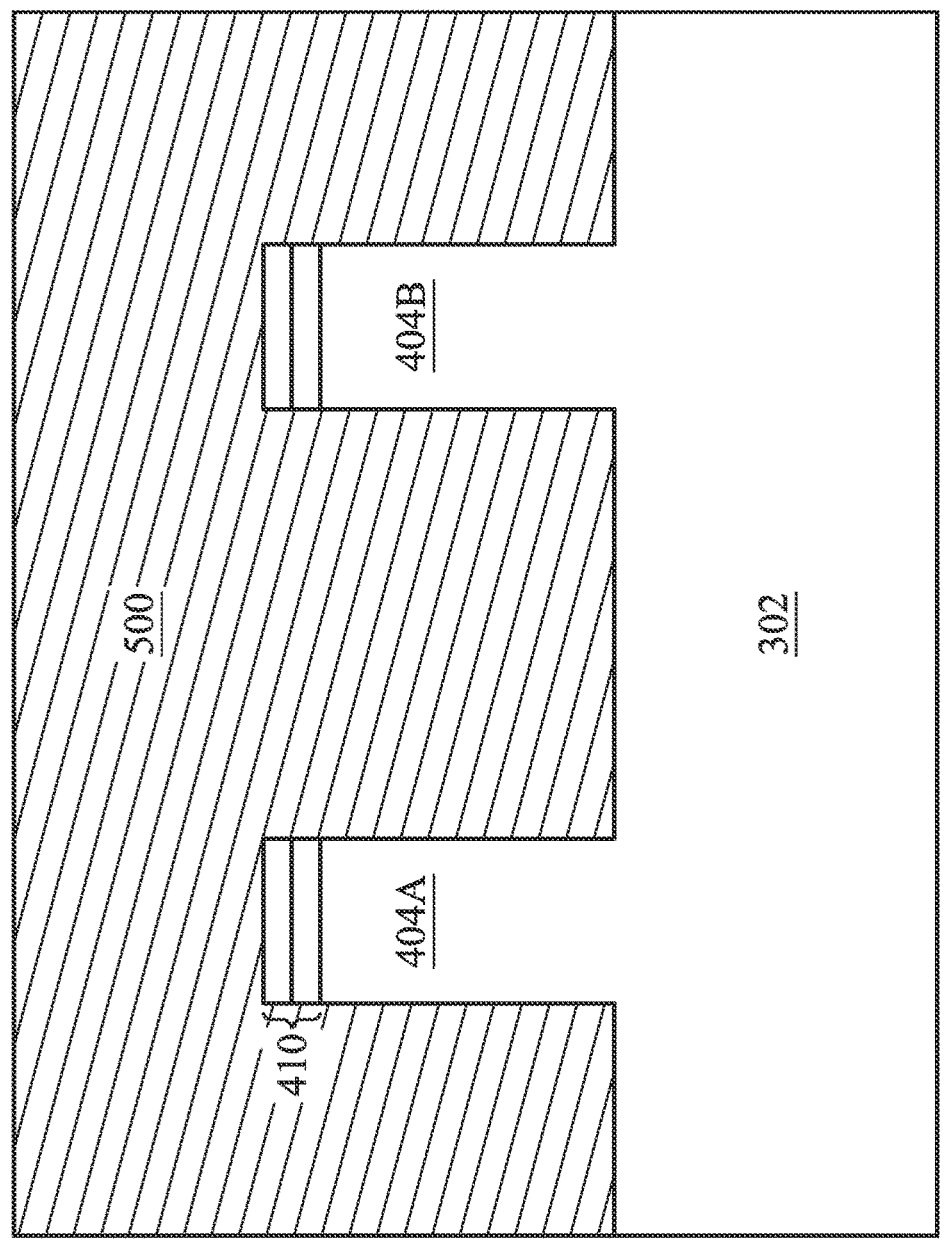
Figure 6:
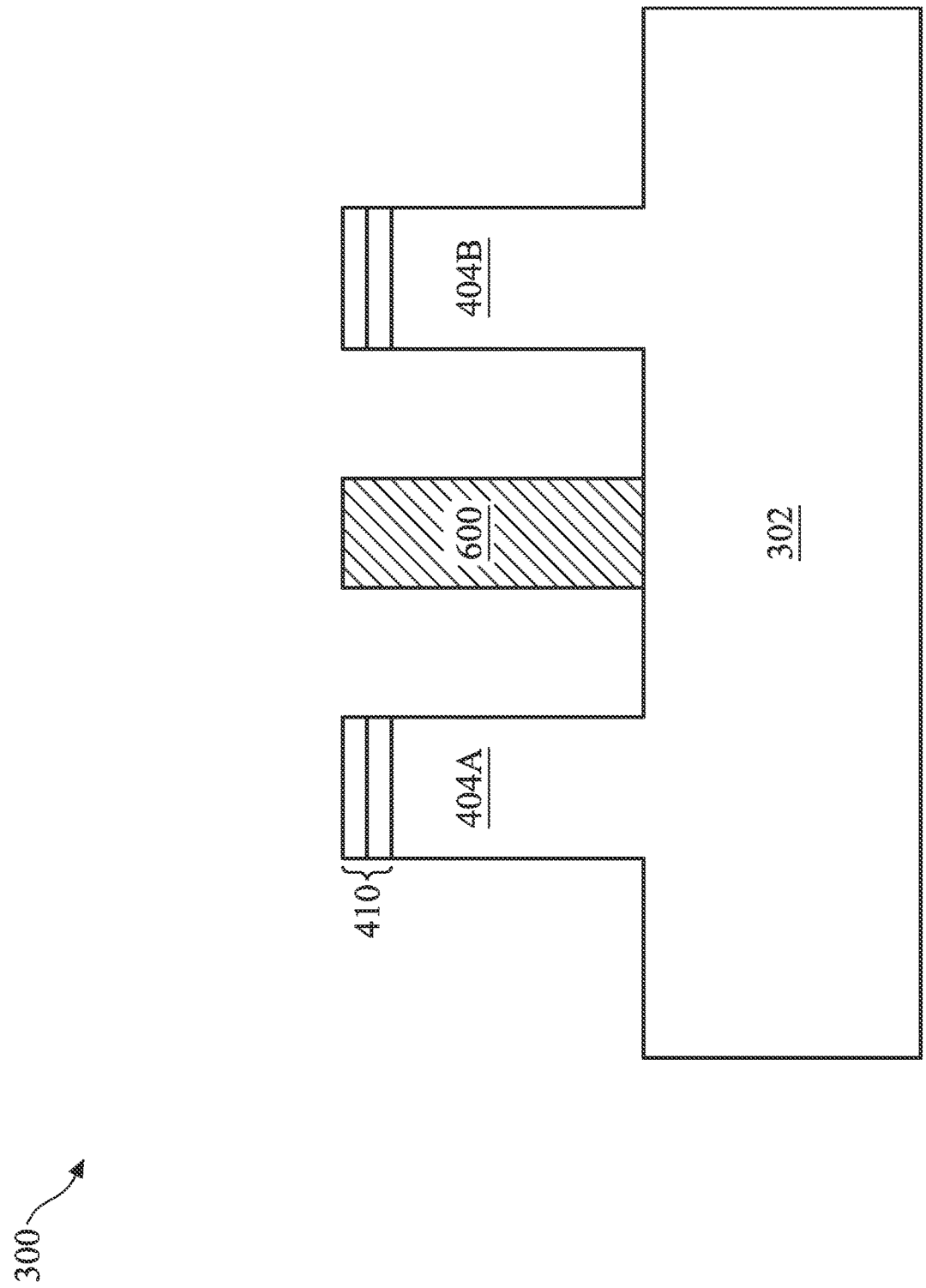

Corresponding to operation 206 of FIG. 2, FIG. 5 is a cross-sectional views of the FinFET device 300 including a dummy channel layer 500 at one of the various stages of fabrication, and FIG. 6 is a cross-sectional views of the FinFET device 300 including a dummy fin 600 at one of the various stages of fabrication. The cross-sectional views of FIGS. 5-6 are each cut along the lengthwise direction of an active/dummy gate structure of the FinFET device 300 (e.g., cross-section B-B indicated in FIG. 1).

Referring first to FIG. 5, the dummy channel layer 500 can include a dielectric material used to form one or more dummy fins. For example, the dielectric material may include silicon oxide, silicon nitride, silicon oxynitride, silicon carbide, silicon carbonitride, silicon oxycarbonitride, silicon oxycarbide, or combinations thereof. In another example, the dielectric material may include group IV-based oxide or group IV-based nitride, e.g., tantalum nitride, tantalum oxide, hafnium oxide, or combinations thereof. The dummy channel layer 500 may be formed using low-pressure chemical vapor deposition (LPCVD) or plasma enhanced chemical vapor deposition (PECVD), for example.

Upon depositing the dummy channel layer 500 overlaying the active fins 404A-B, one or more dummy fins, e.g., 600, may be formed between the active fins 404A-B. For example in FIG. 6, the dummy fin 600 is formed between the active fins 404A and 404B. The dummy fin 600 can be formed by patterning the dummy channel layer 500 using, for example, photolithography and etching techniques. For example, a patterned mask may be formed over the dummy channel layer 500 to mask portions of the dummy channel layer 500 to form the dummy fin 600. Subsequently, unmasked portions of the dummy channel layer 500 may be etched using, for example, reactive ion etch (RIE), neutral beam etch (NBE), the like, or combinations thereof, thereby defining the dummy fin 600 between adjacent active fins 404A-B (or in the trench 411). The etch may be anisotropic, in some embodiments. In some other embodiments, the dummy fin 600 may be formed concurrently with or subsequently to forming isolation regions (e.g., 700 of FIG. 7) between adjacent active fins, which will be discussed below.

In advanced processing nodes, such a dummy fin can be disposed next to one or more active fins (e.g., between two adjacent active fins) to improve the overall design and fabrication of a semiconductor device. For example, dummy fins can be used for optical proximity correction (OPC) to enhance a pattern density and pattern uniformity in the stage of designing the semiconductor device. In another example, adding dummy fins adjacent to active fins can improve chemical-mechanical polishing (CMP) performance when fabricating the semiconductor device. The dummy fin is designed to stay inactive or electrically non-functional, when the semiconductor device is appropriately configured and powered.

Figure 7:
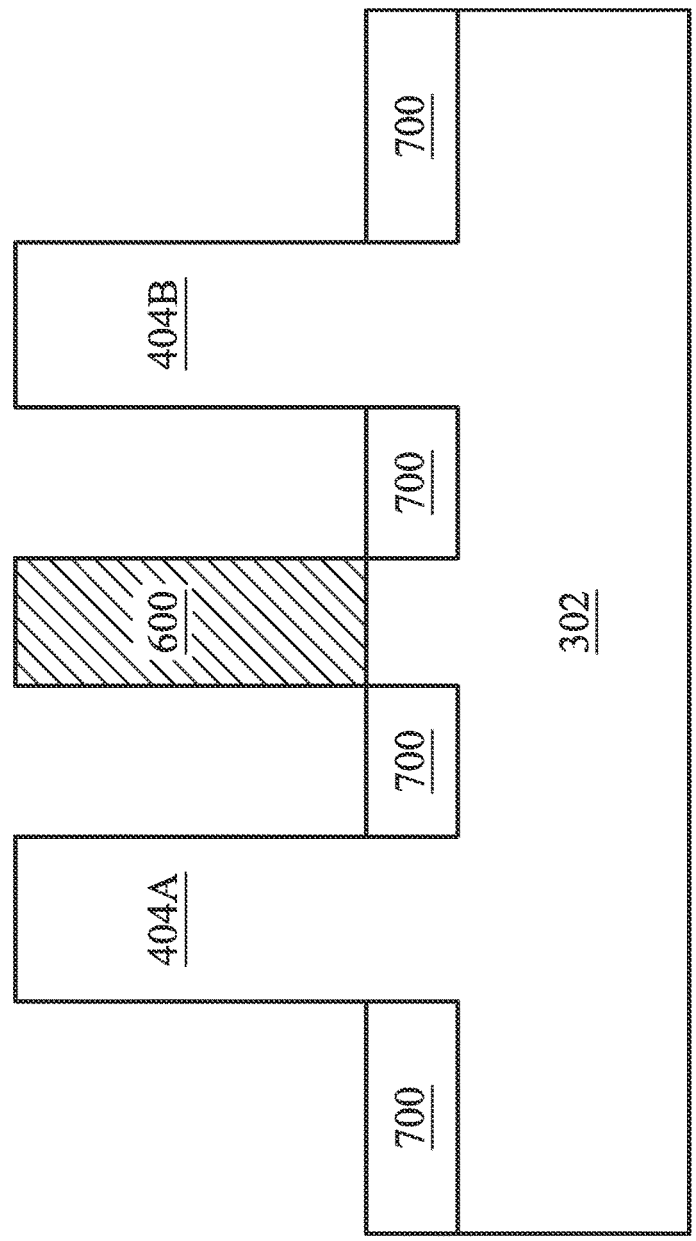

Corresponding to operation 208 of FIG. 2, FIG. 7 is a cross-sectional view of the FinFET device 300 including isolation regions 700 at one of the various stages of fabrication. The cross-sectional view of FIG. 7 is cut along the lengthwise direction of an active/dummy gate structure of the FinFET device 300 (e.g., cross-section B-B indicated in FIG. 1).

The isolation regions 700, which are formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 700 and a top surface of the fins 404A-B and 600 that are coplanar (not shown). The patterned mask 410 may be removed by the planarization process, in some embodiments.

In some embodiments, the isolation regions 700 include a liner, e.g., a liner oxide (not shown), at the interface between each of the isolation regions 700 and the substrate 302 (active fins 404A-B). In some embodiments, the liner oxide is formed to reduce crystalline defects at the interface between the substrate 302 and the isolation region 700. Similarly, the liner oxide may also be used to reduce crystalline defects at the interface between the active fins 404A-B and the isolation region 700. The liner oxide (e.g., silicon oxide) may be a thermal oxide formed through a thermal oxidation of a surface layer of the substrate 302, although other suitable method may also be used to form the liner oxide.

Next, the isolation regions 700 are recessed to form shallow trench isolation (STI) regions 700, as shown in FIG. 7. The isolation regions 700 are recessed such that the upper portions of the fins 404A-B and 600 protrude from between neighboring STI regions 700. Respective top surfaces of the STI regions 700 may have a flat surface (as illustrated), a convex surface, a concave surface (such as dishing), or combinations thereof. The top surfaces of the STI regions 700 may be formed flat, convex, and/or concave by an appropriate etch. The isolation regions 700 may be recessed using an acceptable etching process, such as one that is selective to the material of the isolation regions 700. For example, a dry etch or a wet etch using dilute hydrofluoric (DHF) acid may be performed to recess the isolation regions 700.

Figure 8:
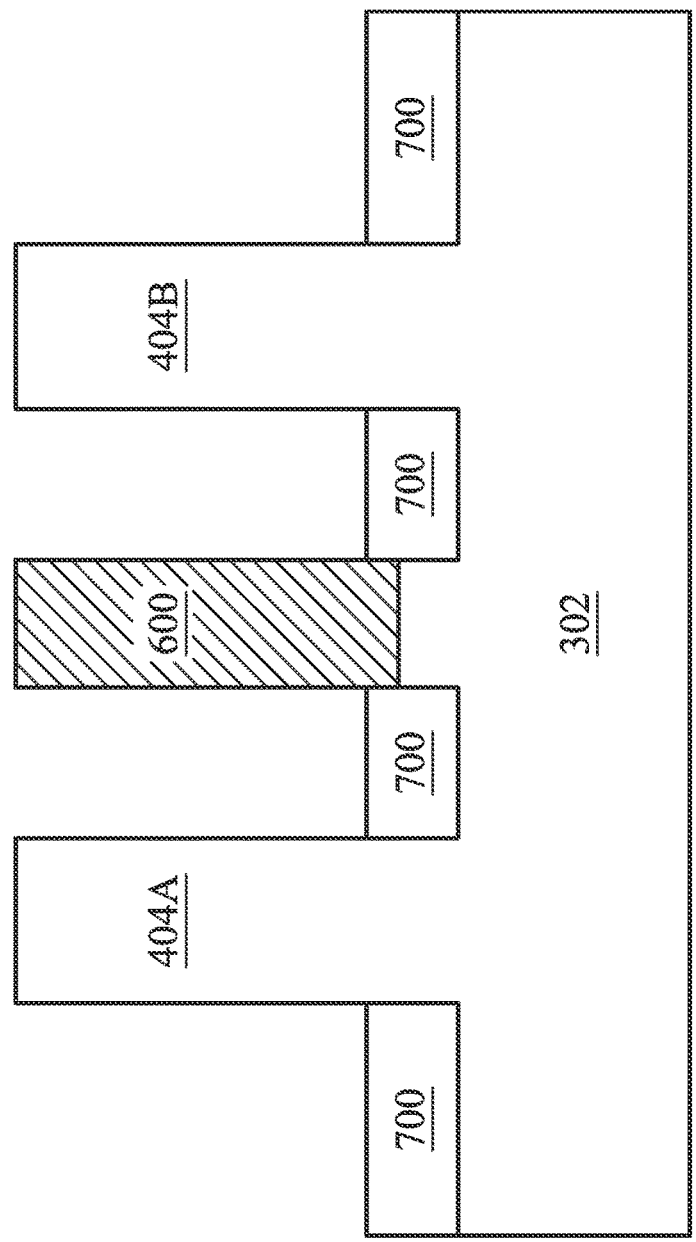
Figure 9:
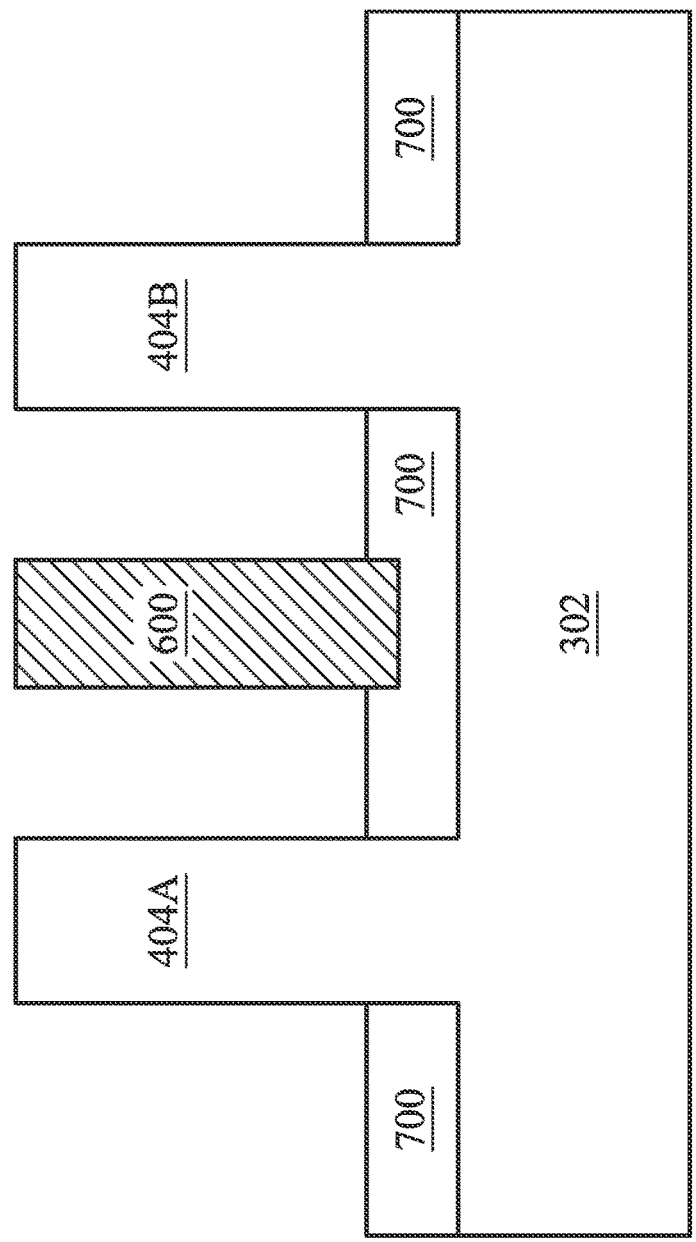

In some other embodiments, the dummy fin 600 may be formed concurrently with or subsequently to the formation of the isolation regions 700 to cause various profiles of the dummy fin 600 (with respect to the isolation regions 700) to be formed, which will be respectively discussed below with reference to FIGS. 8 and 9.

For example, when forming the active fins 404A-B (FIG. 4), one or more other active fins may also be formed in the trench 411. The insulation material of the isolation regions 700 may be deposited over the active fins, followed by a CMP process to planarize the top surfaces of the isolation regions 700 and the active fins, which include the active fins 404A-B and the active fins formed in the trench 411. Subsequently, an upper portion of the active fins formed in the trench 411 may be partially removed to form cavities. The cavities are then filled with the dielectric material of the dummy channel layer 500, followed by another CMP process to form the dummy fin 600. The isolation regions 700 are recessed to form the shallow trench isolation (STI) regions 700, as shown in FIG. 8. Using such a method to form the dummy fin 600, the dummy fin 600 can be formed on the substrate 302 and a bottom surface of the dummy fin 600 is below the top surface of the isolation regions 700, as shown in FIG. 8. Depending on how much of the isolation regions 700 is recessed, the bottom surface of the dummy fin 600 may be above the top surface of the isolation regions 700, while remaining within the scope of the present disclosure.

In another example, after forming the active fins 404A-B (FIG. 4), the insulation material of the isolation regions 700 may be deposited over the active fins 404A-B in a controlled deposition rate, thereby causing cavities to be spontaneously formed in the trench 411. The cavities are then filled with the dielectric material of the dummy channel layer 500, followed by a CMP process to form the dummy fin 600. The isolation regions 700 are recessed to form the shallow trench isolation (STI) regions 700, as shown in FIG. 9. Using such a method to form the dummy fin 600, the dummy fin 600 can be formed on the isolation regions 700 and a bottom surface of the dummy fin 600 is embedded in the corresponding isolation region 700, as shown in FIG. 9.

In yet another example, after forming the active fins 404A-B (FIG. 4) and depositing the insulation material of the isolation regions 700 over the active fins 404A-B, a patterned mask may be formed over the isolation regions 700 to expose portions of the isolation regions 700 to form the dummy fin 600 (e.g., in the trench 411). Subsequently, the exposed portions of the isolation regions 700 may be etched using, for example, reactive ion etch (RIE), neutral beam etch (NBE), the like, or combinations thereof, thereby defining cavities. The cavities are then filled with the dielectric material of the dummy channel layer 500, followed by a CMP process to form the dummy fin 600, which is similar to the illustrated embodiment of FIG. 9.

Figure 10:
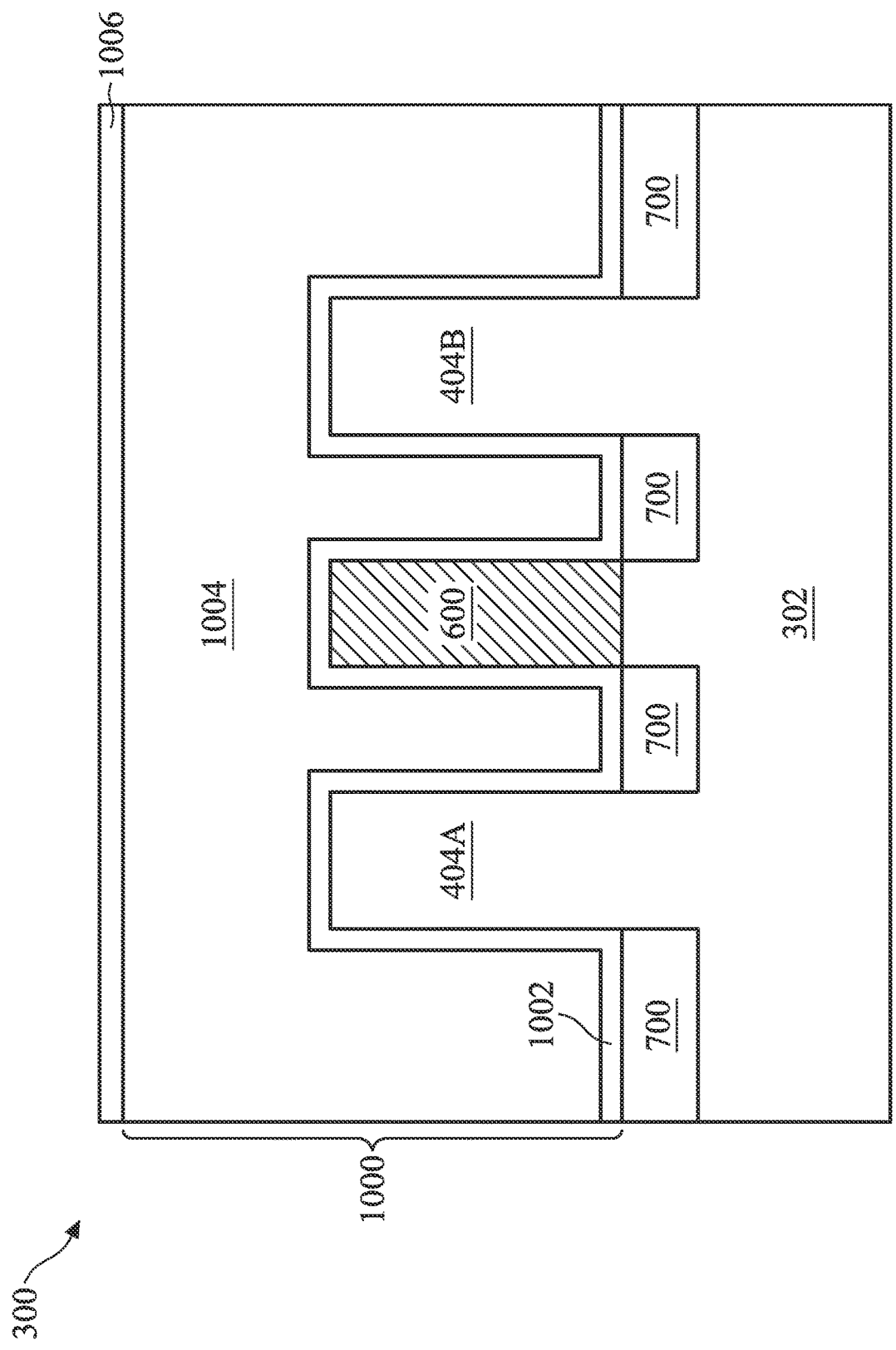

Corresponding to operation 210 of FIG. 2, FIG. 10 is a cross-sectional view of the FinFET device 300 including a dummy gate structure 1000 at one of the various stages of fabrication. The cross-sectional view of FIG. 10 is cut along the lengthwise direction of the dummy gate structure 1000 (e.g., cross-section B-B indicated in FIG. 1). In the example of FIG. 10 (and the following figures), the dummy gate structure 1000 is formed to overlay a respective portion of each of the fins (e.g., active fins 404A-B, dummy fin 600) that are illustrated in FIG. 7. It should be understood that the dummy gate structure 1000 can also be formed over the fins that are illustrated in FIGS. 8-9, while remaining within the scope of the present disclosure.

The dummy gate structure 1000 includes a dummy gate dielectric 1002 and a dummy gate 1004, in some embodiments. A mask 1006 may be formed over the dummy gate structure 1000. To form the dummy gate structure 1000, a dielectric layer is formed on the active fins 404A-B and dummy fin 600. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques to form the mask 1006. The pattern of the mask 1006 then may be transferred to the gate layer and the dielectric layer by a suitable etching technique to form the dummy gate 1004 and the underlying dummy gate dielectric 1002, respectively. The dummy gate 1004 and the dummy gate dielectric 1002 straddle or otherwise cover a respective portion (e.g., a channel region) of each of the active fins 404A-B and the dummy fin 600. For example, when one dummy gate structure is formed, a dummy gate and dummy gate dielectric of the dummy gate structure may straddle respective central portions of the fins. The dummy gate 1004 may also have a lengthwise direction (e.g., direction B-B of FIG. 1) perpendicular to the lengthwise direction (e.g., direction of A-A of FIG. 1) of the fins.

The dummy gate dielectric 1002 is shown to be formed over the active fins 404A-B and the dummy fin 600 (e.g., over the respective top surfaces and the sidewalls of the fins) and over the STI regions 700 in the example of FIG. 10. In other embodiments, the dummy gate dielectric 1002 may be formed by, e.g., thermal oxidization of a material of the fins, and therefore, may be formed over the fins but not over the STI regions 700. It should be appreciated that these and other variations are still included within the scope of the present disclosure.

FIGS. 11-13 illustrate the cross-sectional views of further processing (or making) of the FinFET device 300 along the lengthwise direction (e.g., cross-section A-A indicated in FIG. 1) of one of the active fins 404A-B. As a representative example, one dummy gate structure (e.g., 1000) is illustrated over the active fin 404B in FIGS. 11-13. It should be appreciated that more or less than one dummy gate structure can be formed over the fin 404B (and each of the other fins, e.g., 404A, 600), while remaining within the scope of the present disclosure.

Corresponding to operation 212 of FIG. 2, FIG. 11 is a cross-sectional view of the FinFET device 300 including a gate spacer 1100 formed around (e.g., along and contacting the sidewalls of) the dummy gate structure 1000. The cross-sectional view of FIG. 11 is cut along the lengthwise direction of the active fin 404B (e.g., cross-section A-A indicated in FIG. 1).

For example, the gate spacer 1100 may be formed on opposing sidewalls of the dummy gate structure 1000. Although the gate spacer 1100 is shown as a single layer in the example of FIG. 11 (and the following figures), it should be understood that the gate spacer can be formed to have any number of layers while remaining within the scope of the present disclosure. The gate spacer 1100 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 1100. The shapes and formation methods of the gate spacer 1100 as illustrated in FIG. 11 are merely non-limiting examples, and other shapes and formation methods are possible. These and other variations are fully intended to be included within the scope of the present disclosure.

Corresponding to operation 214 of FIG. 2, FIG. 12 is a cross-sectional view of the FinFET device 300 including a number (e.g., 2) of source/drain regions 1200 at one of the various stages of fabrication. The cross-sectional view of FIG. 12 is cut along the lengthwise direction of the active fin 404B (e.g., cross-section A-A indicated in FIG. 1).

The source/drain regions 1200 are formed in recesses of the active fin 404B adjacent to the dummy gate structures 1000, e.g., between adjacent dummy gate structures 1000 and/or next to a dummy gate structure 1000. The recesses are formed by, e.g., an anisotropic etching process using the dummy gate structures 1000 as an etching mask, in some embodiments, although any other suitable etching process may also be used.

The source/drain regions 1200 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 12, the epitaxial source/drain regions 1200 may have surfaces raised from the top surface of the active fin 404B (e.g. raised above the non-recessed portions of the active fin 404B) and may have facets. In some embodiments, the source/drain regions 1200 of the adjacent fins may merge to form a continuous epitaxial source/drain region (not shown). In some embodiments, the source/drain regions 1200 of the adjacent fins may not merge together and remain separate source/drain regions 1200 (not shown). In some embodiments, when the resulting FinFET device is an n-type FinFET, the source/drain regions 1200 can include silicon carbide (SiC), silicon phosphorous (SiP), phosphorous-doped silicon carbon (SiCP), or the like. In some embodiments, when the resulting FinFET device is a p-type FinFET, the source/drain regions 1200 comprise SiGe, and a p-type impurity such as boron or indium.

The epitaxial source/drain regions 1200 may be implanted with dopants to form source/drain regions 1200 followed by an annealing process. The implanting process may include forming and patterning masks such as a photoresist to cover the regions of the FinFET device 300 that are to be protected from the implanting process. The source/drain regions 1200 may have an impurity (e.g., dopant) concentration in a range from about $1\times10^{19}$ cm$^{-3}$ to about $1\times10^{21}$ cm$^{-3}$. P-type impurities, such as boron or indium, may be implanted in the source/drain regions 1200 of a P-type transistor. N-type impurities, such as phosphorous or arsenide, may be implanted in the source/drain regions 1200 of an N-type transistor. In some embodiments, the epitaxial source/drain regions 1200 may be in situ doped during their growth.

Corresponding to operation 216 of FIG. 2, FIG. 13 is a cross-sectional view of the FinFET device 300 including an interlayer dielectric (ILD) 1300 at one of the various stages of fabrication. The cross-sectional view of FIG. 13 is cut along the lengthwise direction of the active fin 404B (e.g., cross-section A-A indicated in FIG. 1).

In some embodiments, prior to forming the ILD 1300, a contact etch stop layer (CESL) 1302 is formed over the structure, as illustrated in FIG. 13. The CESL 1302 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 1300 is formed over the CESL 1302 and over the dummy gate structures 1000. In some embodiments, the ILD 1300 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 1300 is formed, an optional dielectric layer 1304 is formed over the ILD 1300. The dielectric layer 1304 can function as a protection layer to prevent or reduces the loss of the ILD 1300 in subsequent etching processes. The dielectric layer 1304 may be formed of a suitable material, such as silicon nitride, silicon carbonitride, or the like, using a suitable method such as CVD, PECVD, or FCVD. After the dielectric layer 1304 is formed, a planarization process, such as a CMP process, may be performed to achieve a level upper surface for the dielectric layer 1304. The CMP may also remove the mask 1006 and portions of the CESL 1302 disposed over the dummy gate 1004 (FIG. 12). After the planarization process, the upper surface of the dielectric layer 1304 is level with the upper surface of the dummy gate 1004, in some embodiments.

An example gate-last process (sometimes referred to as replacement gate process) can then performed to replace the dummy gate structure 1000 with an active gate structure (which may also be referred to as a replacement gate structure or a metal gate structure). Prior to replacing the dummy gate structure, a portion of the dummy gate structure disposed between the active fins can be replaced with an isolation structure so as to separate the active gate structure into different portions that are electrically coupled to the active fins, respectively. FIGS. 14A-20 illustrate the cross-sectional views of further processing (or making) of the FinFET device 300, which will be discussed in more detail as follows.

Corresponding to operation 218 of FIG. 2, FIGS. 14A, 14B, 14C, 14D, 14E, 14F, 15A, 15B, 15C, and 15D are each a cross-sectional view of the FinFET device 300 in which the dummy gate structure 1000 is cut, intercepted, or otherwise disconnected to form a cavity (trench, or otherwise opening) 1400 at one of the various stages of fabrication.

Figure 14A:
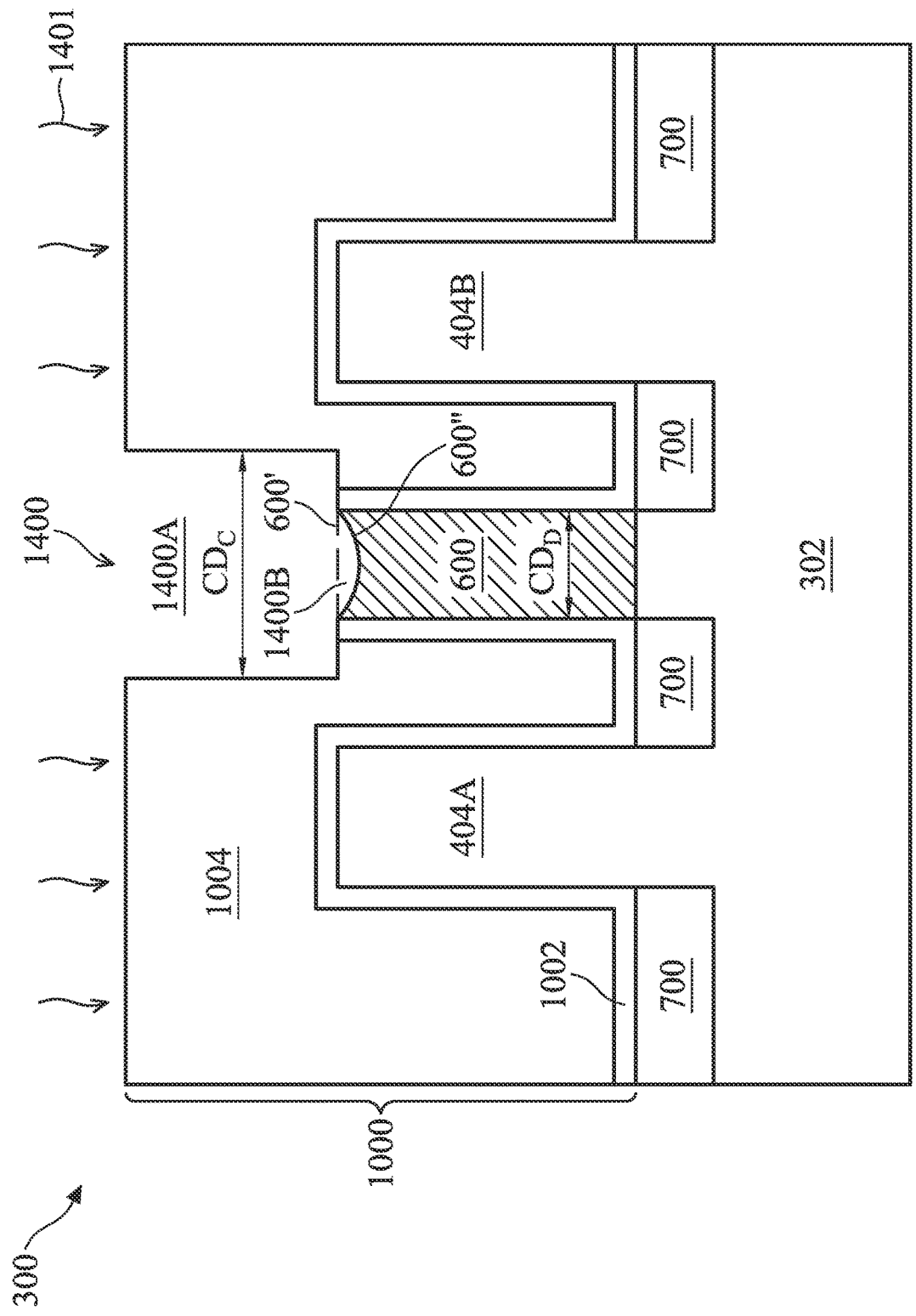
Figure 14B:
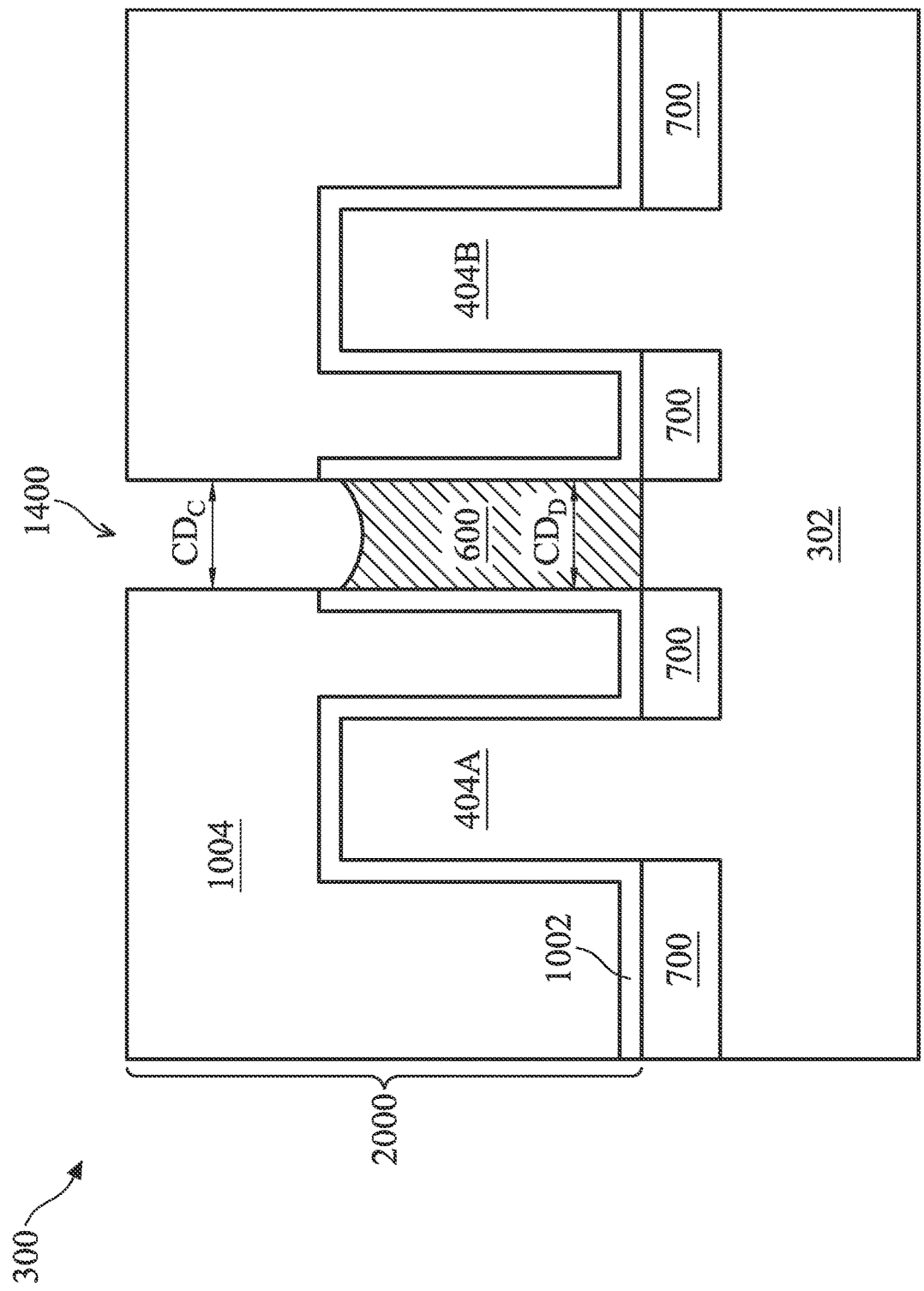
Figure 14C:
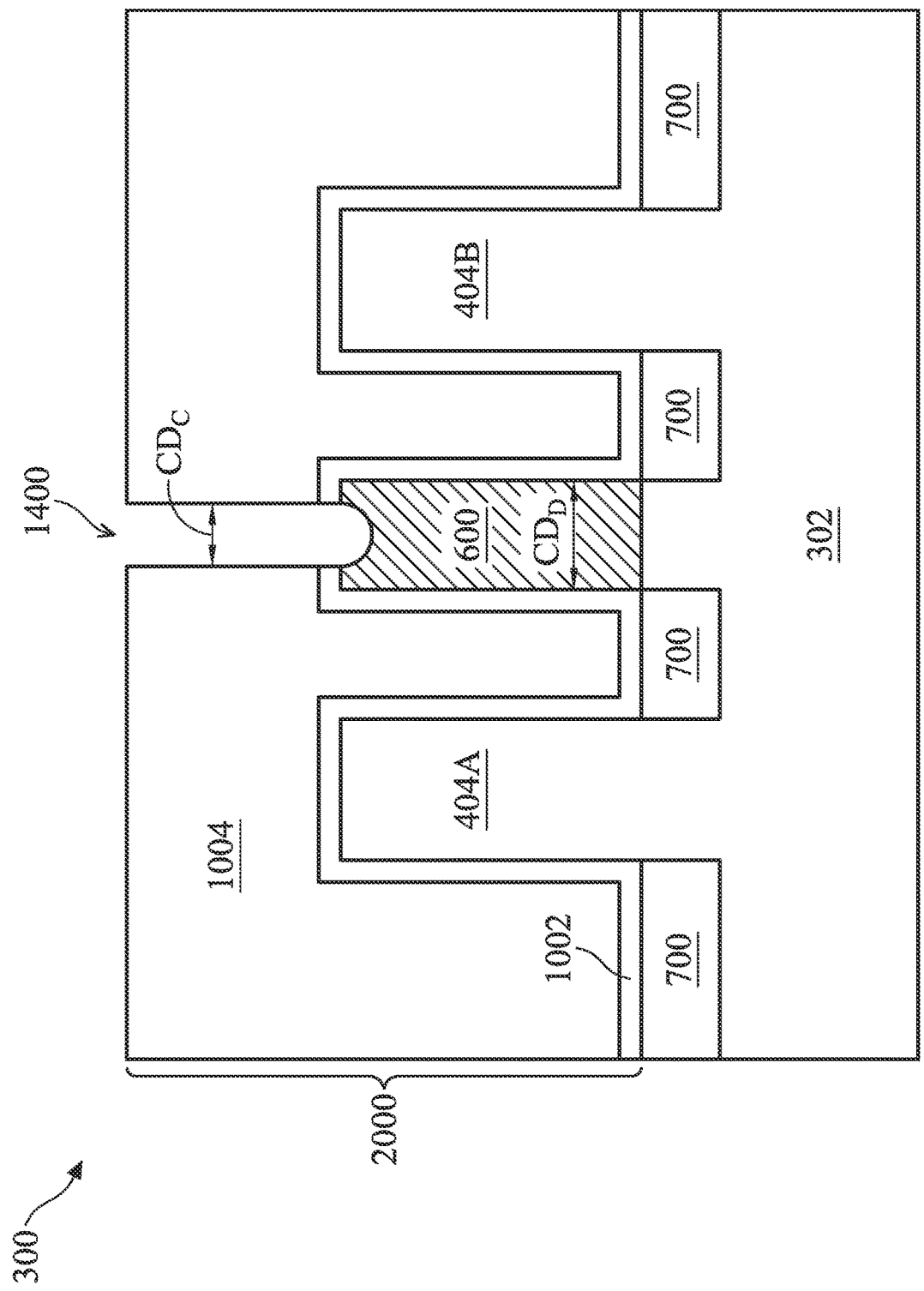
Figure 14D:
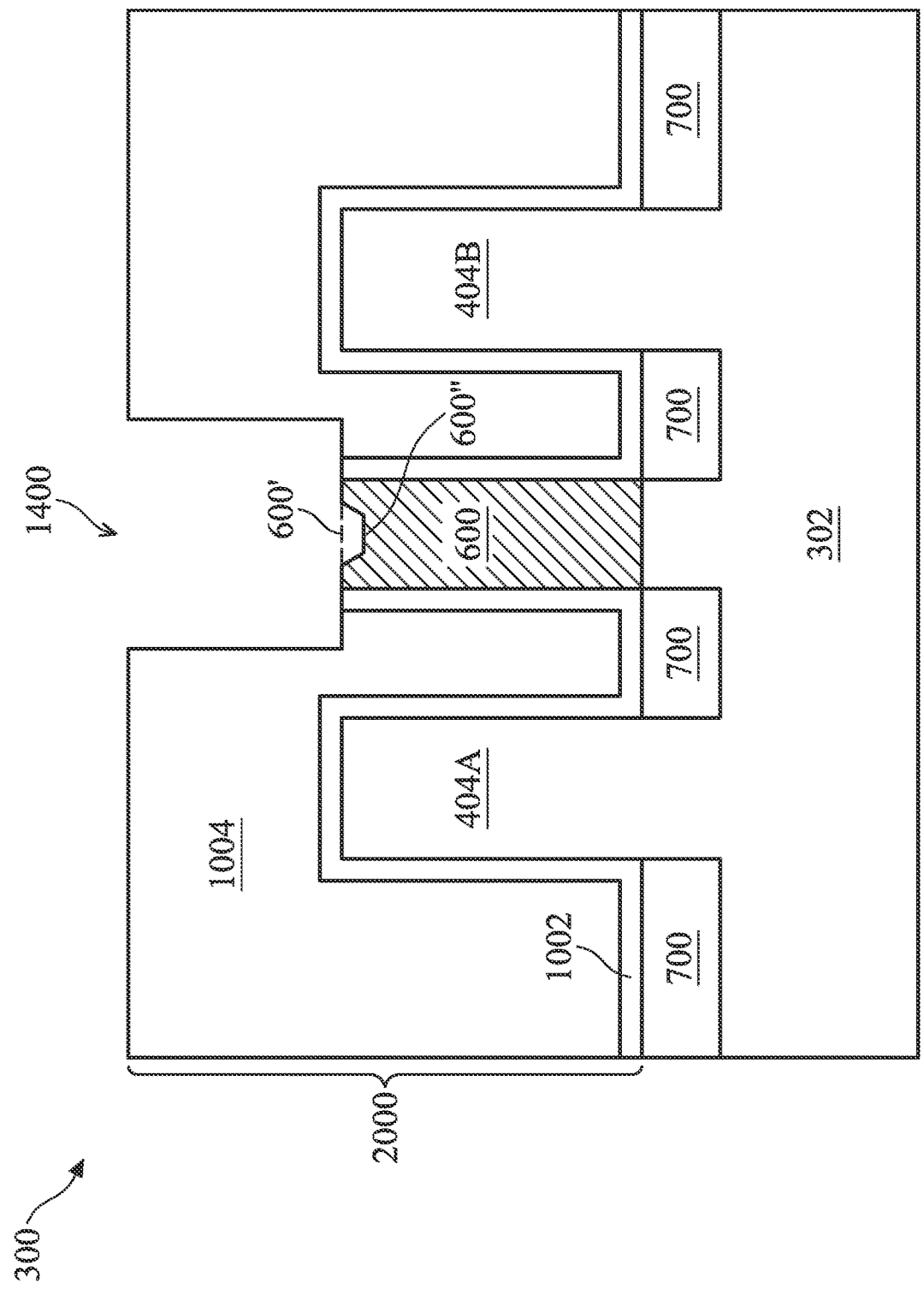
Figure 14E:
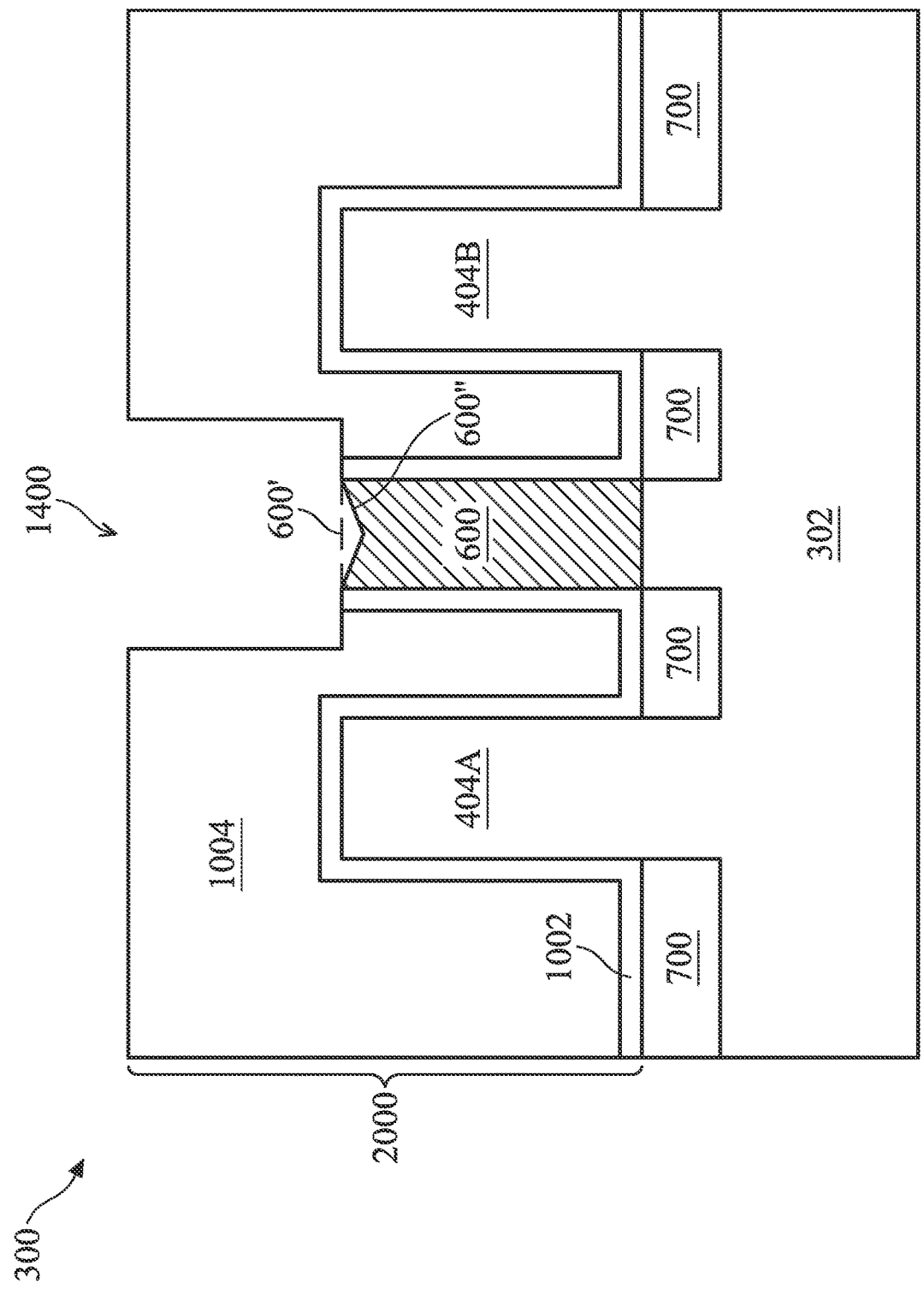
Figure 14F:
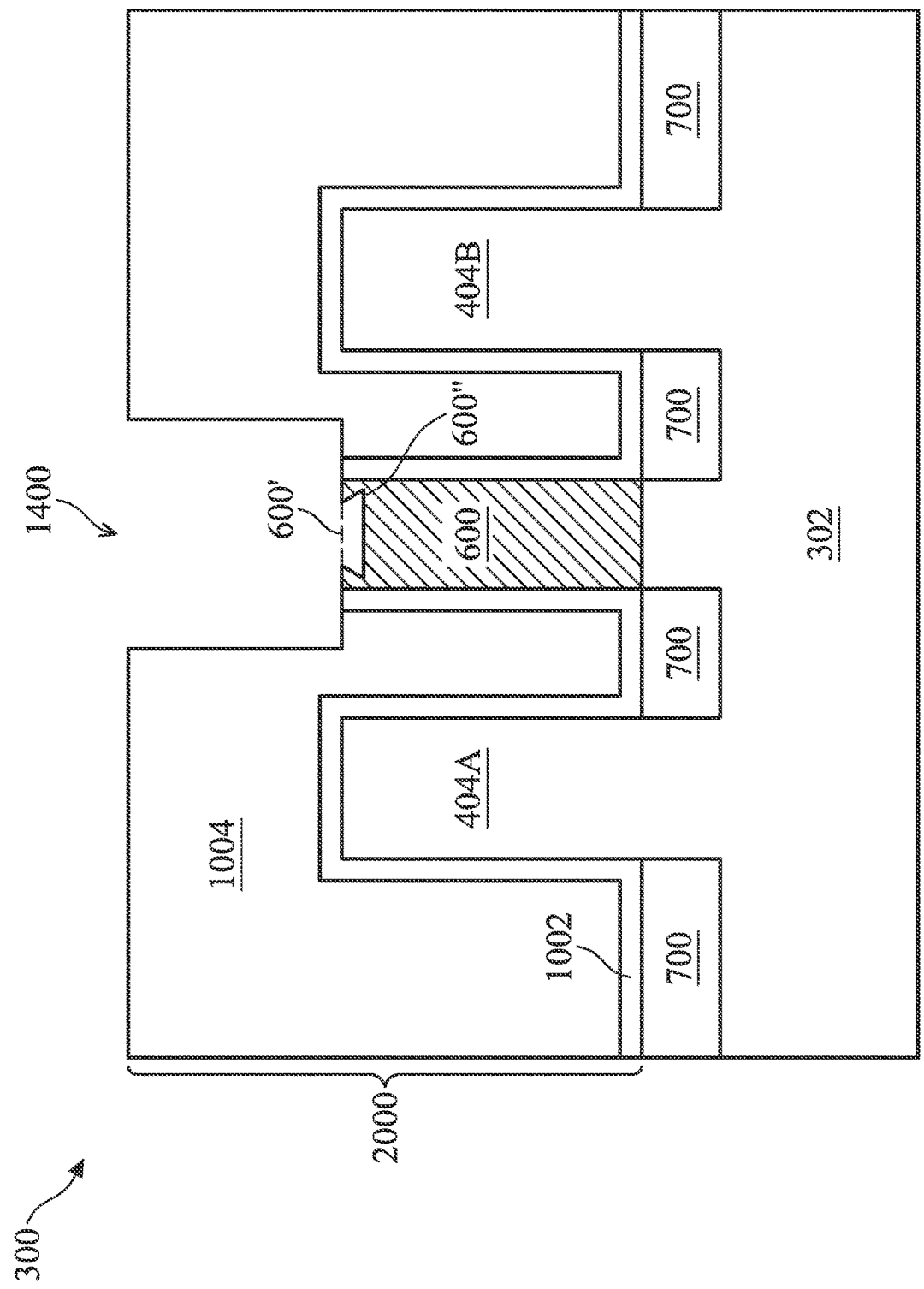

The cross-sectional views of FIGS. 14A-F are each cut along the lengthwise direction of the dummy gate structure 1000 (e.g., cross-section B-B indicated in FIG. 1); and the cross-sectional views of FIGS. 15A-D are each cut along a lengthwise direction of the dummy fin 600 (e.g., a direction in parallel with the cross-section A-A indicated in FIG. 1). Specifically, FIGS. 14A-C illustrate various embodiments of the cavity 1400 that have respective different critical dimensions (CD's) along the lengthwise direction of the dummy gate structure 1000 (hereinafter "$CD_C$") with respect to a critical dimension of the dummy fin 600 along the same direction (hereinafter "$CD_D$"). FIGS. 14D-F illustrate various other embodiments of the cavity 1400 when its $CD_C$ is greater than a corresponding $CD_D$. The cross-sectional views of FIGS. 15A-D, cut along the lengthwise direction of the dummy fin 600, correspond to the cross-sectional views of FIGS. 14A, 14D, 14E, and 14F, respectively.

Figure 15A:
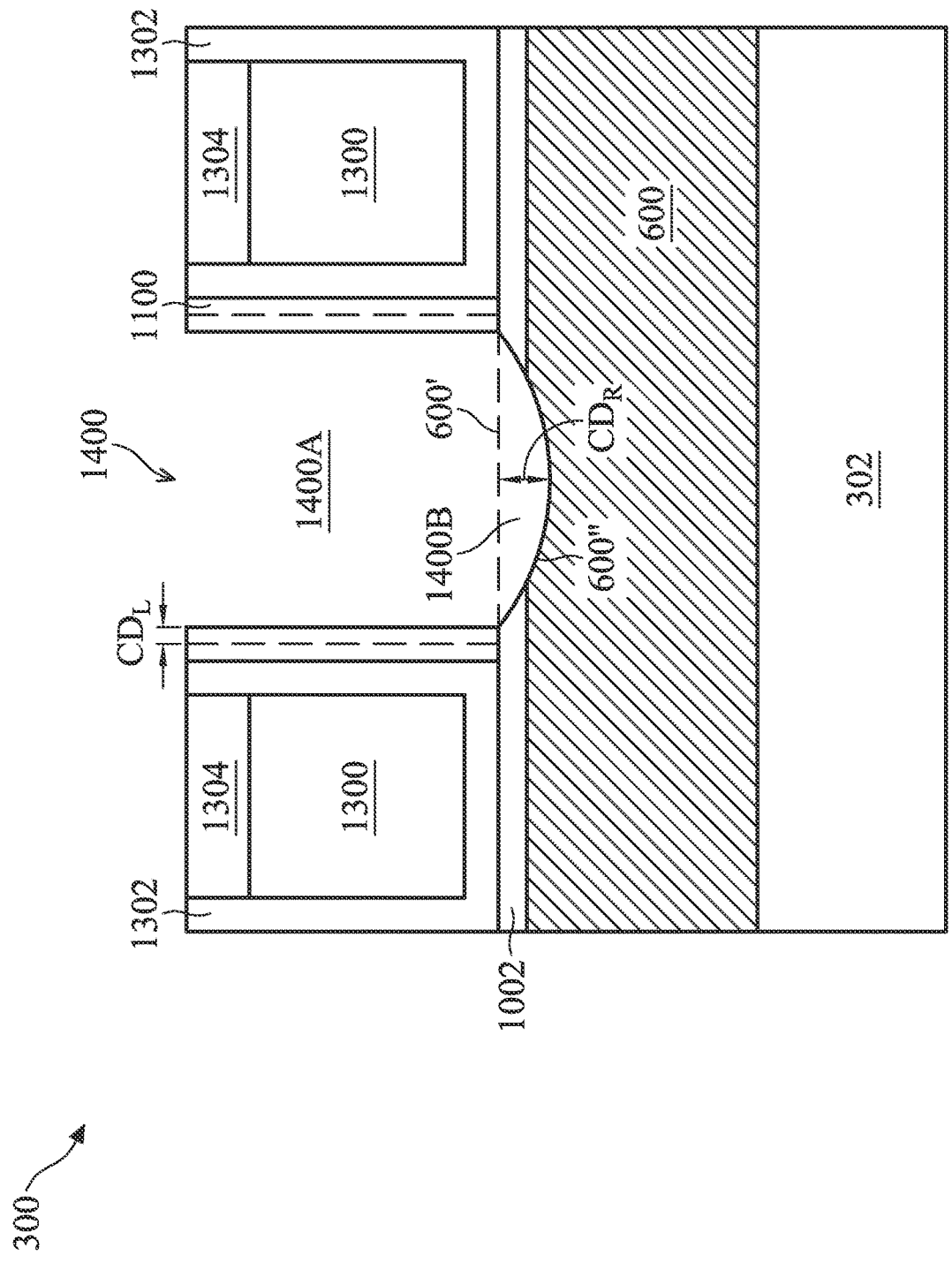

To form the cavity 1400, a mask (not shown) may be formed over the dummy gate structure 1000 to expose a portion of the dummy gate structure 1000 desired to be removed (e.g., the portion disposed over the dummy fin 600), followed by an etching processes 1401 to remove the portion of the dummy gate structure 1000, as illustrated in FIG. 14A. During the removal of the dummy gate structure 1000, the dummy fin 600 may function as an "interim" etch stop layer to trigger a controlled amount of etch on the dummy fin 600. For example, the etching process 1401 may be configured to remove the portion of the dummy gate structure 1000 so as to partially expose a top surface 600' of the dummy fin, which may be substantially flat along its lengthwise direction, as indicated by dotted lines in FIGS. 14A and 15A. Upon the top surface 600' being partially exposed, the etching process 1401 may be configured to further etch an upper portion of the dummy fin 600 to cause a portion of the top surface 600" (e.g., the portion being exposed) to recess or otherwise extend into the dummy fin 600. Thus, the cavity 1400 may be formed to include a first portion 1400A and a second portion 1400B. As illustrated in FIG. 15A, the first portion 1400A can be disposed in a region surrounded by the gate spacer 1100; and the second portion 1400B can be disposed in a region below the gate spacer 1100.

The etching process 1401 may include one or more operations to collectively or respectively etch the dummy gate structure 1000 and the dummy fin 600. For example, the etching process 1401 can include a single operation that first etches the dummy gate structure 1000 and then the dummy fin 600. In another example, the etching process 1401 can include a first operation that etches the dummy gate structure 1000 and a second operation that etches the dummy fin 600.

In existing technologies, the etching rate for the dummy gate structure 1000 is significantly higher than the dummy fin 600, where almost only the dummy gate structure 1000 is etched. This can result in an undesired, large amount of lateral etch (e.g., along the lengthwise direction of the dummy gate structure 1000). For example when process variation occurs, a relatively large amount of lateral etch (or otherwise over etch) may occur to the dummy gate structure around the higher dummy fins while some shorter dummy fins still have not been exposed yet. As such, the critical dimension ($CD_c$) of the cavity 1400 may be disadvantageously increased, which may in turn reduce the respective critical dimensions of different portions of an active gate structure on the opposite sides of the cavity 1400 (or a gate isolation structure filling up the cavity 1400).

To control the etch amount on the dummy fin 600, in some embodiments, the etching process 1401 may be configured to etch the dummy gate structure 1000 in a slightly higher etching rate than the dummy fin 600 (e.g., no more than 2 times higher). In some other embodiments, the etching process 1401 may be configured to etch the dummy gate structure 1000 and the dummy fin 600 in a substantially similar etching rate. In other words, the etching process 1401 may have an etching selectivity of the dummy gate structure to the dummy fin not higher than a certain threshold. In this way, the over etch, if any, may be "embedded" into the dummy fin, instead of laterally penetrating into the dummy gate structure, which can in turn cover the process variation while assuring that no residual dummy gate structure will be formed over the dummy fin.

The etching process 1401 may be configured to have at least some anisotropic etching characteristic to limit the undesired lateral etch. For example, the etching process 1401 can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof to control the above-described etching rates. As a non-limiting example, a source power of 10 watts to 3000 watts, a bias power of 0 watts to 3000 watts, a pressure of 1 millitorr to 5 torr, and an etch gas flow of 0 standard cubic centimeters per minute to 5000 standard cubic centimeters per minute may be used in the etching process 1401. However, it is noted that source powers, bias powers, pressures, and flow rates outside of these ranges are also contemplated.

In another example, the etching process 1401 can include a wet etching process, which can have a certain amount of isotropic characteristic, in combination with the plasma etching process. In such a wet etching process, a main etch chemical such as hydrofluoric acid (HF), fluorine ($F_2$), and other suitable main etch chemicals and combinations thereof can be used with assistive etch chemicals such as sulfuric acid ($H_2SO_4$), hydrogen chloride (HCl), hydrogen bromide (HBr), ammonia ($NH_3$), phosphoric acid ($H_3PO_4$), and other suitable assistive etch chemicals and combinations thereof as well as solvents such as deionized water, alcohol, acetone, and other suitable solvents and combinations thereof to control the above-described etching rates.

In some embodiments, the cavity 1400 may be formed to have the critical dimension $CD_C$ greater than the critical dimension $CD_D$ of the dummy fin 600, as shown in the example of FIG. 14A. FIG. 14B illustrates another example of the cavity 1400 where $CD_C$ is approximately equal to $CD_D$; and FIG. 14C illustrates yet another example of the cavity 1400 where $CD_C$ is less than $CD_D$. For example, a ratio of $CD_C$ to $CD_D$ may range from about 0.7 to about 1.3. When the ratio is too large, subsequent process windows may be adversely impacted (e.g., the process window to form a metal gate layer over the adjacent active fins 404A and 404B), which may in turn decrease the density of transistors that can formed within a defined area. On the other hand, when the ratio is too small, a gate isolation structure to be formed in the cavity 1400 may not reach the desired function to electrically isolate the different portions of a metal gate layer over the active fins 404A and 404B, respectively. As a non-limiting example, $CD_C$ may range from about 10 angstroms (Å) to about 5000 Å; and $CD_D$ may range from about 5 Å to several millimeters. Although the cavity 1400 is shown to have inner sidewalls that are perpendicular to the pre-recessed top surface 600' of the dummy fin 600, it should be understood that the inner sidewalls may be tilted away from such a perpendicular direction while remaining within the scope of the present disclosure. For example, the cavity 1400 may have an upper portion that is laterally wider or narrower than its lower portion, for example.

The cross-sectional views of FIG. 14A and the corresponding FIG. 15A illustrate the cavity 1400 as having a curvature-based profile for at least a portion of its bottom surface (e.g., the top surface 600" of the dummy fin 600) that recesses into the dummy fin 600. For example, the portion of the bottom surface presents a convex profile. In some embodiments, any point of this portion of the bottom surface is on or below the pre-recessed top surface 600' of the dummy fin 600, in which a critical dimension, $CD_R$ (FIG. 15A), is defined as a difference between the top surface 600' and 600". As a non-limiting example, $CD_R$ can range from about 3 Å to about 300 Å.

Figure 15B:
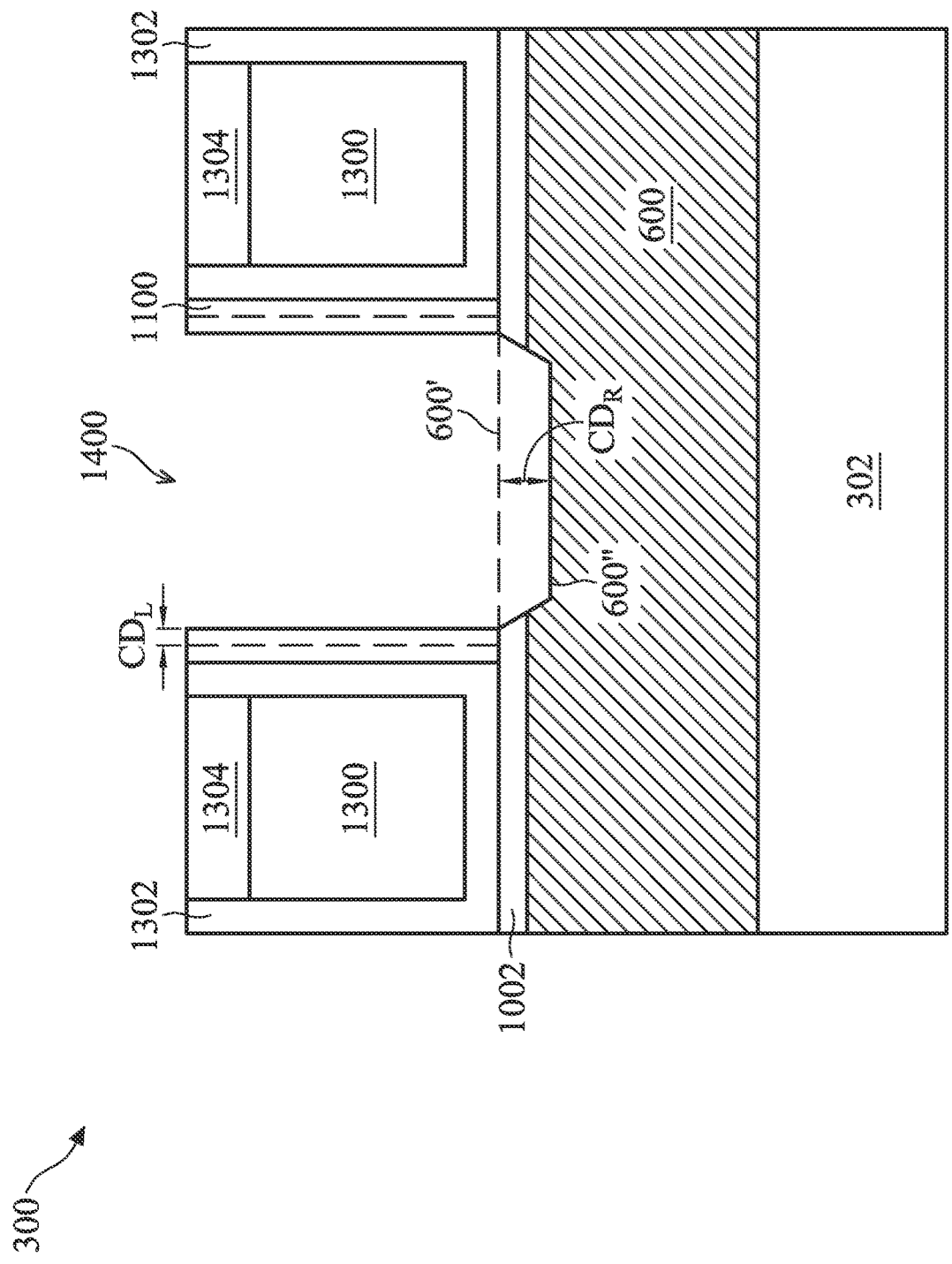
Figure 15C:
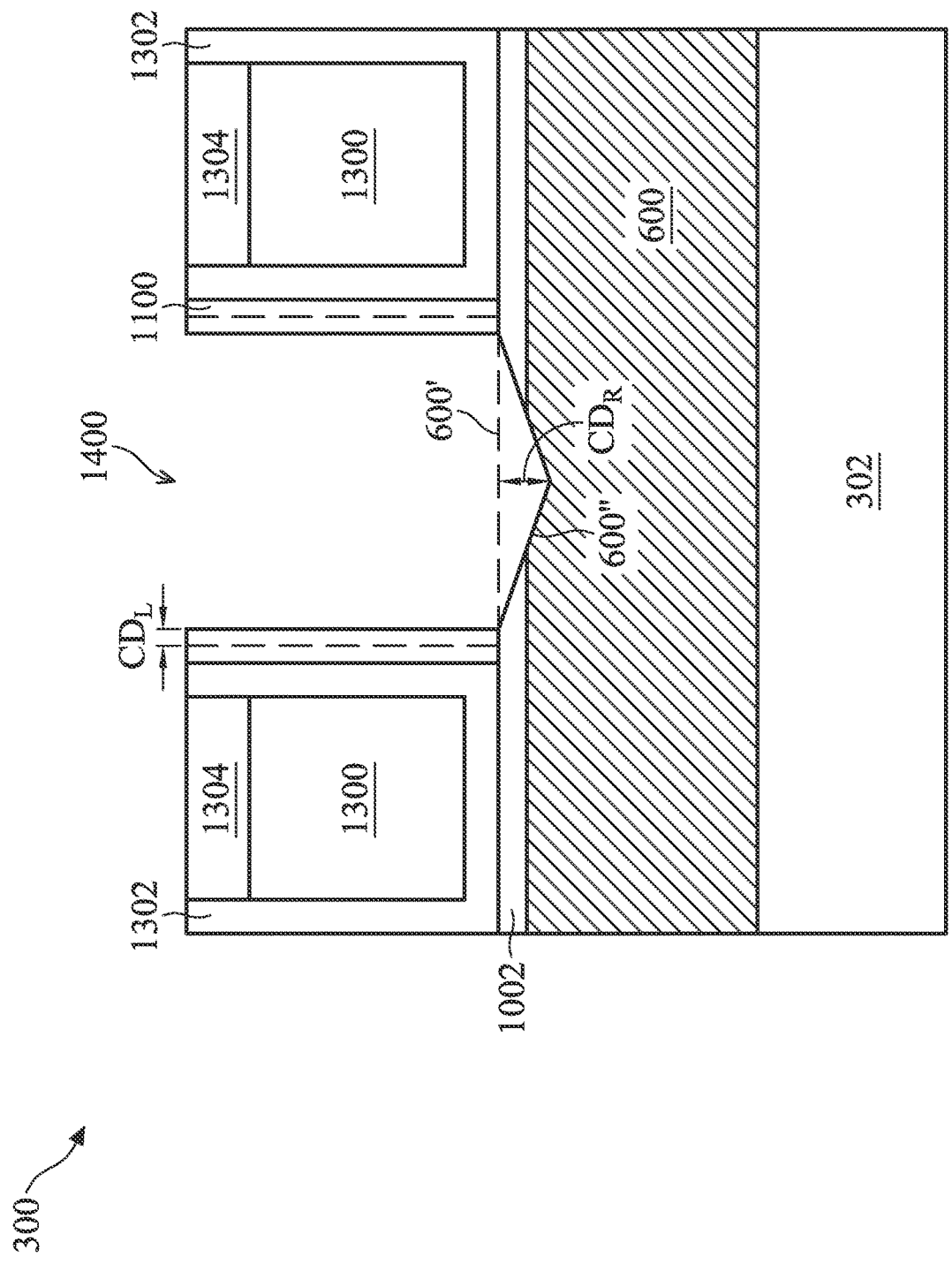
Figure 15D:
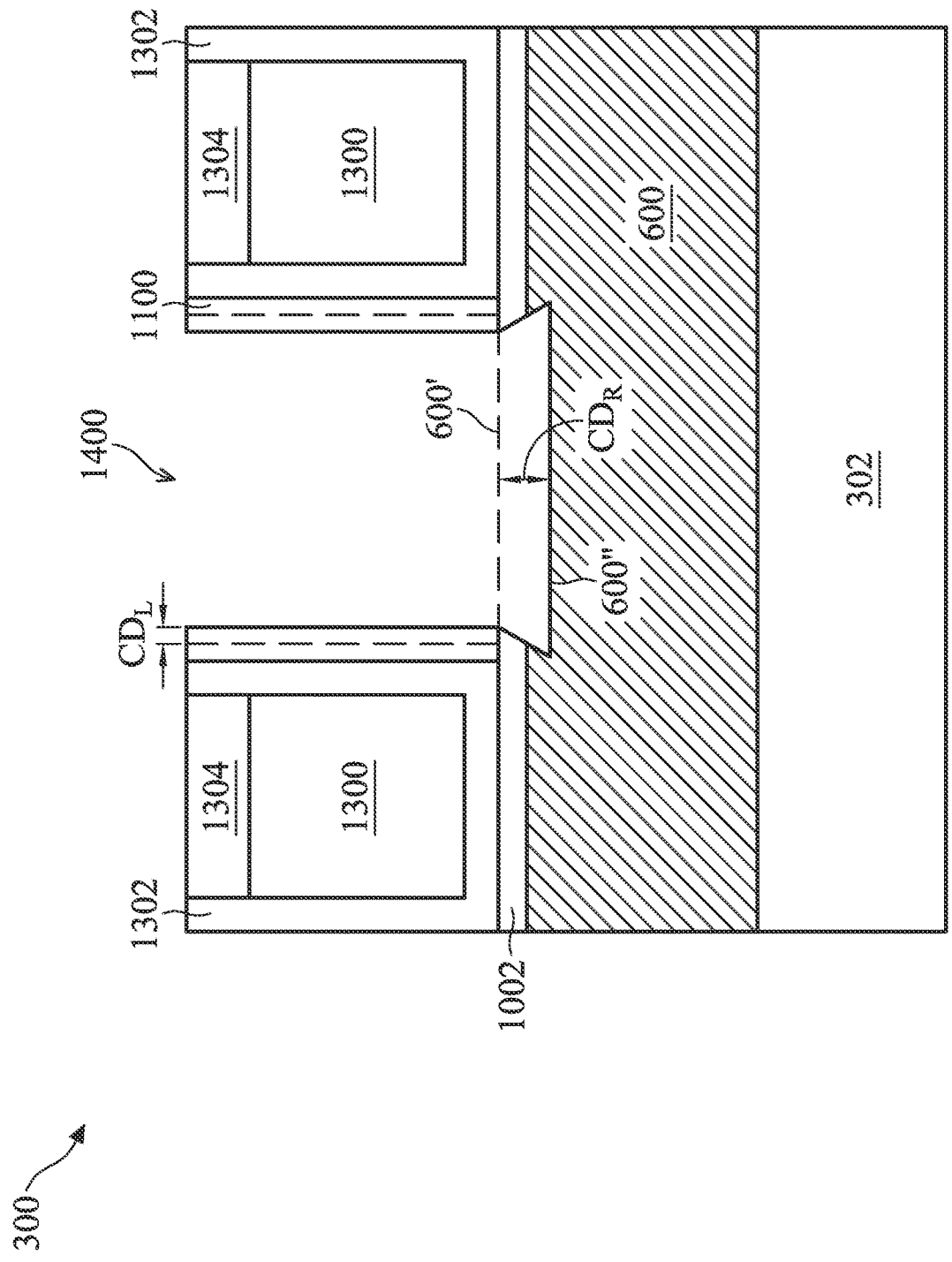

The cross-sectional views of FIGS. 14D-F illustrate various other embodiments of the cavity 1400, cut along the lengthwise direction of the dummy gate structure 1000, that have respective different profiles on their bottom surface; and the cross-sectional views of FIGS. 15B-D, cut along the lengthwise direction of the dummy fin 600, correspond to the cross-sectional views of FIGS. 14D, 14E, and 14F, respectively. Although the $CD_C$ of the cavity 1400 shown in FIGS. 14D-F is greater than a corresponding $CD_D$, it should be noted that the $CD_C$ can be equal to or less than the $CD_D$ (similar to the examples shown in FIGS. 14B-C) while remaining within the scope of the present disclosure.

For example in FIGS. 14D and 15B, the cavity 1400 has a portion of its bottom surface (e.g., the top surface 600") with a trapezoid-based profile that recesses into the dummy fin 600. As illustrated, the portion of the bottom surface has a base and two legs, wherein the two legs are tilted away from each other. In some embodiments, any point of this portion of the bottom surface is on or below the pre-recessed top surface 600' of the dummy fin 600, in which $CD_R$ (FIG. 15B), a difference between the top surface 600' and 600" can range from about 3 Å to about 300 Å, as a non-limiting example.

For example in FIGS. 14E and 15C, the cavity 1400 has a portion of its bottom surface (e.g., the top surface 600") with a valley-based profile that recesses into the dummy fin 600. As illustrated, the portion of the bottom surface has two edges, wherein the two edges point to each other. In some embodiments, any point of this portion of the bottom surface is on or below the pre-recessed top surface 600' of the dummy fin 600, in which $CD_R$ (FIG. 15C), a difference between the top surface 600' and 600" can range from about 3 Å to about 300 Å, as a non-limiting example.

For example in FIGS. 14F and 15D, the cavity 1400 has a portion of its bottom surface (e.g., the top surface 600") with another trapezoid-based profile that recesses into the dummy fin 600. As illustrated, the portion of the bottom surface has a base and two legs, wherein the two legs are tilted toward each other. In some embodiments, any point of this portion of the bottom surface is on or below the pre-recessed top surface 600' of the dummy fin 600, in which $CD_R$ (FIG. 15D), a difference between the top surface 600' and 600" can range from about 3 Å to about 300 Å, as a non-limiting example.

In some embodiments, during the process (e.g., the etching process 1401) of forming the cavity 1400, the gate spacer 1100 may be trimmed to have a thinner width, as indicated by dotted lines in FIGS. 15A-D. For example, when the gate spacer 1100 is formed of a material that has a relatively high etch selectivity with respect to the dummy fin 600, the gate spacer 1100 may be trimmed less; and in comparison, when the gate spacer 1100 is formed of a material that has a relatively low etch selectivity with respect to the dummy fin 600, the gate spacer 1100 may be trimmed more. Such loss of the gate spacer 1100 can be characterized with a critical dimension, $CD_L$ (FIGS. 15A-D), which can range from about 0 Å to about 500 Å, as a non-limiting example.

Figure 16:
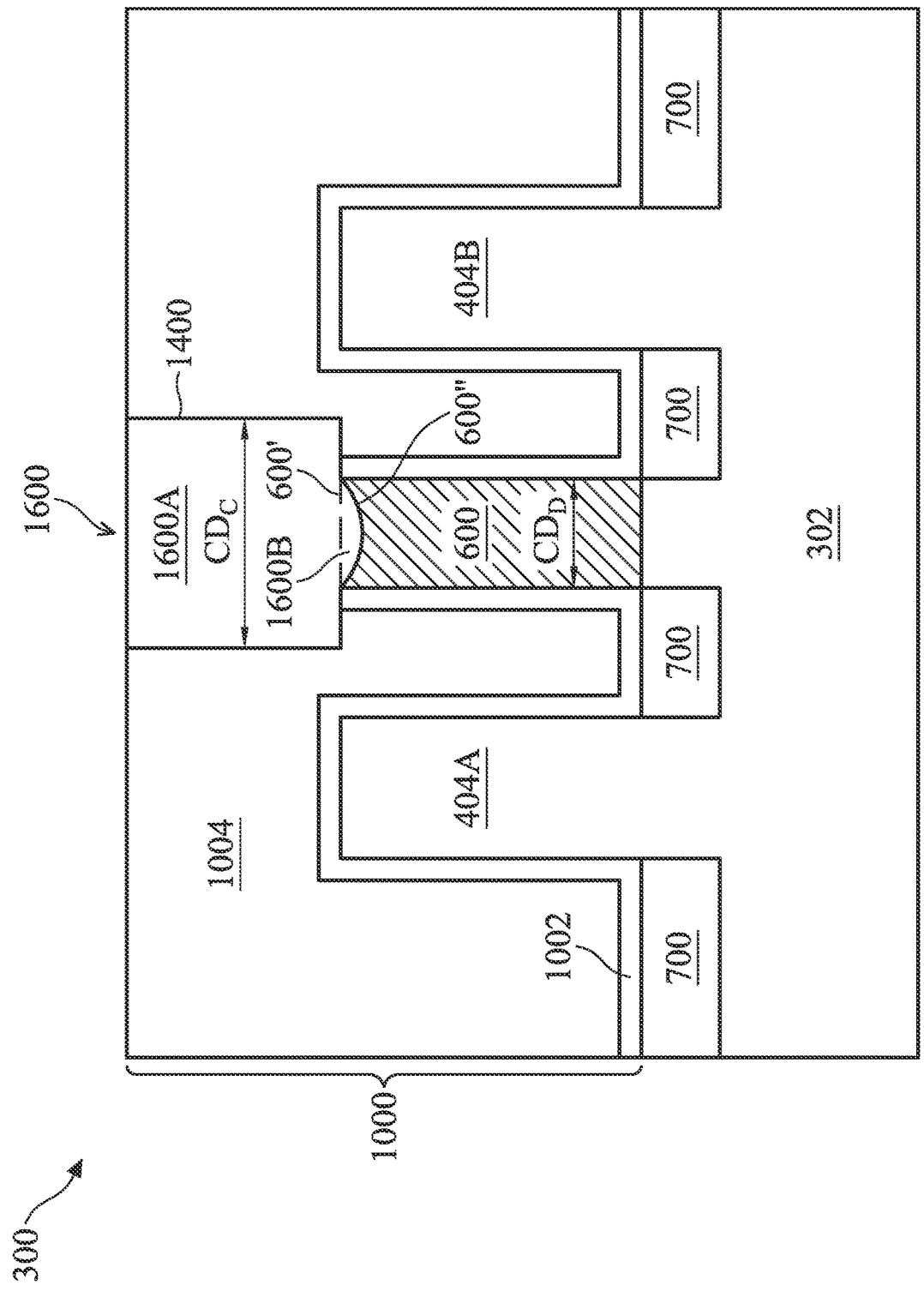
Figure 17:
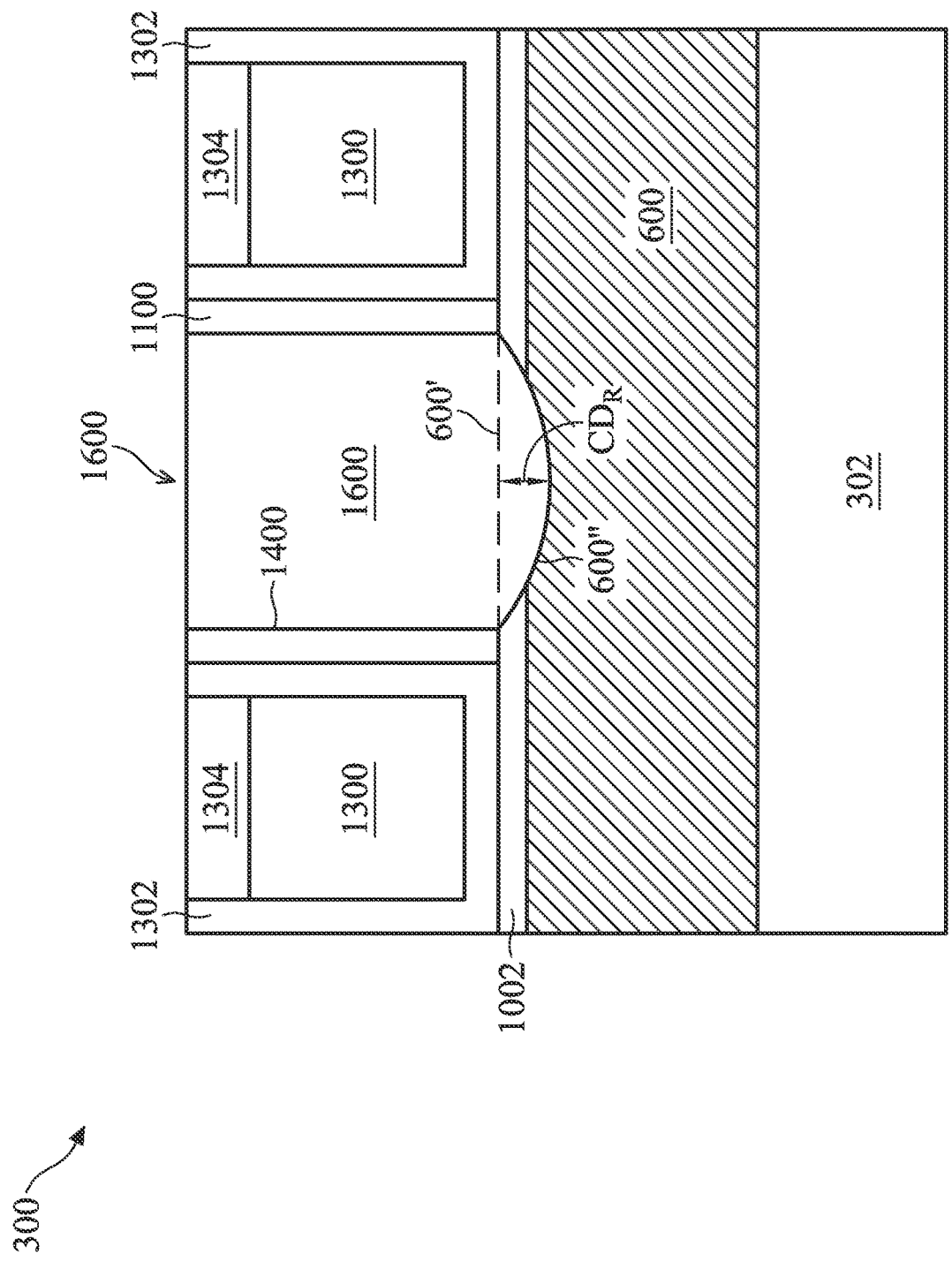

Corresponding to operation 220 of FIG. 2, FIGS. 16 and 17 are cross-sectionals view of the FinFET device 300 including a gate isolation structure 1600 at one of the various stages of fabrication. The cross-sectional view of FIG. 16 is cut along the lengthwise direction of the dummy gate structure 1000 (e.g., cross-section B-B indicated in FIG. 1); and the cross-sectional view of FIG. 17, corresponding to FIG. 16, is cut along the lengthwise direction of the dummy fin 600 (e.g., a direction in parallel with cross-section A-A indicated in FIG. 1).

The gate isolation structure 1600 is formed by filling the cavity 1400 with a dielectric material, which can thus inherit the profile (or dimensions) of the cavity 1400. For example, the gate isolation structure 1600 can include a first portion 1600A and a second portion 1600B, wherein the second portion 1600B extends into the dummy fin 600, as illustrated in FIGS. 16-17. Specifically, the gate isolation structure 1600 can also be characterized with $CD_C$ and $CD_R$. The example cavity 1400 shown in FIGS. 14A and 15A is used as a representative example for the following discussions of the gate isolation structure 1600. Accordingly, $CD_C$ of the gate isolation structure 1600 is also greater than $CD_D$; the gate isolation structure 1600 also has a bottom surface with at least a portion of it having a curvature-based profile; and $CD_R$ may also range from about 3 Å to about 300 Å.

The dielectric material that is used to form the gate isolation structure 1600 may include, for example, silicon oxide, silicon nitride, silicon oxynitride, silicon carbide, silicon carbonitride, silicon oxycarbonitride, silicon oxycarbide, or combinations thereof. The gate isolation structure 1600 can be formed by depositing the dielectric material in the cavity 1400 using any suitable method, such as CVD, PECVD, or FCVD. After the deposition, a CMP may be performed to remove any excess dielectric material from the remaining dummy gate structure 1000.

Figure 18:
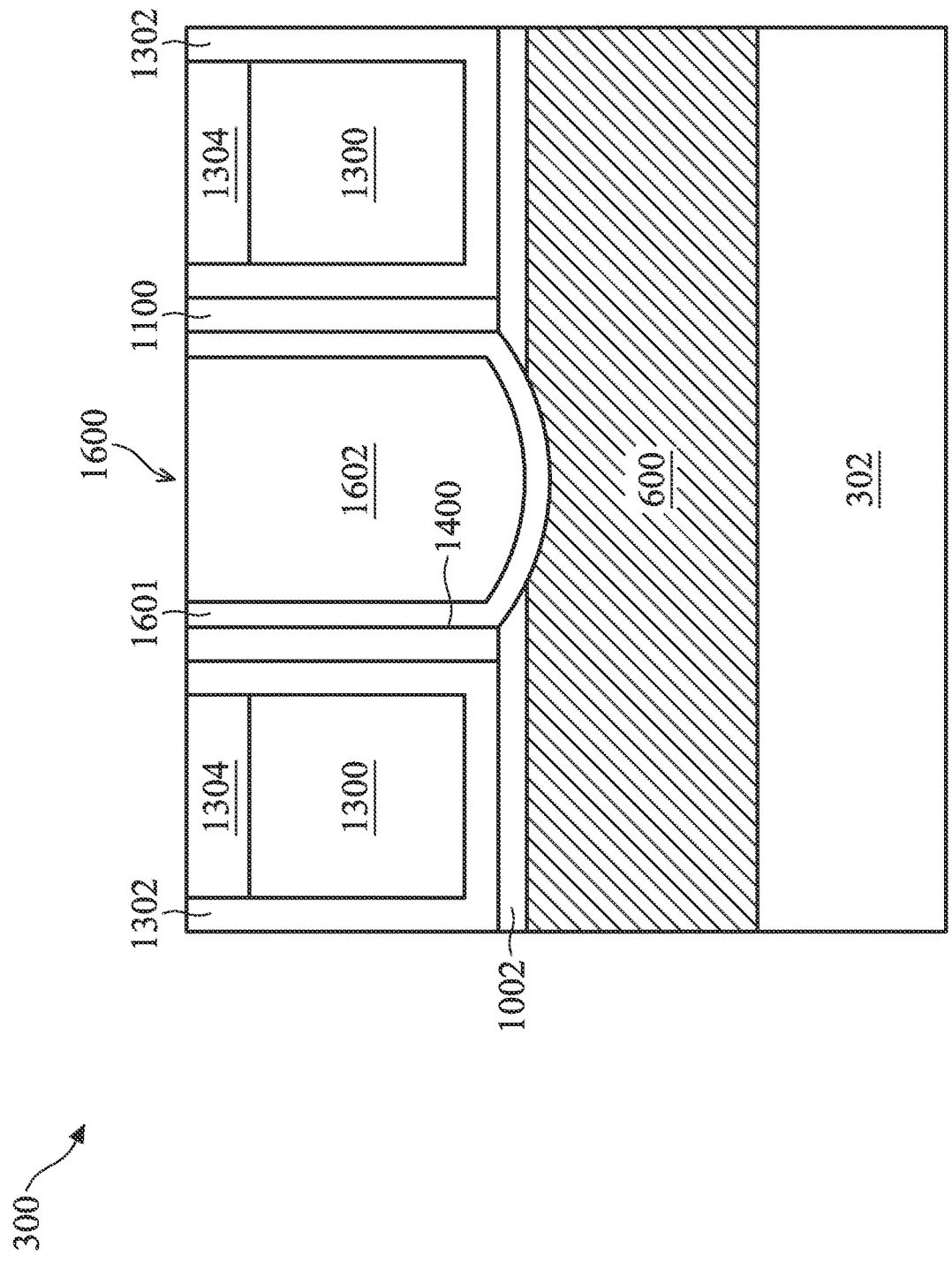
Figure 19:
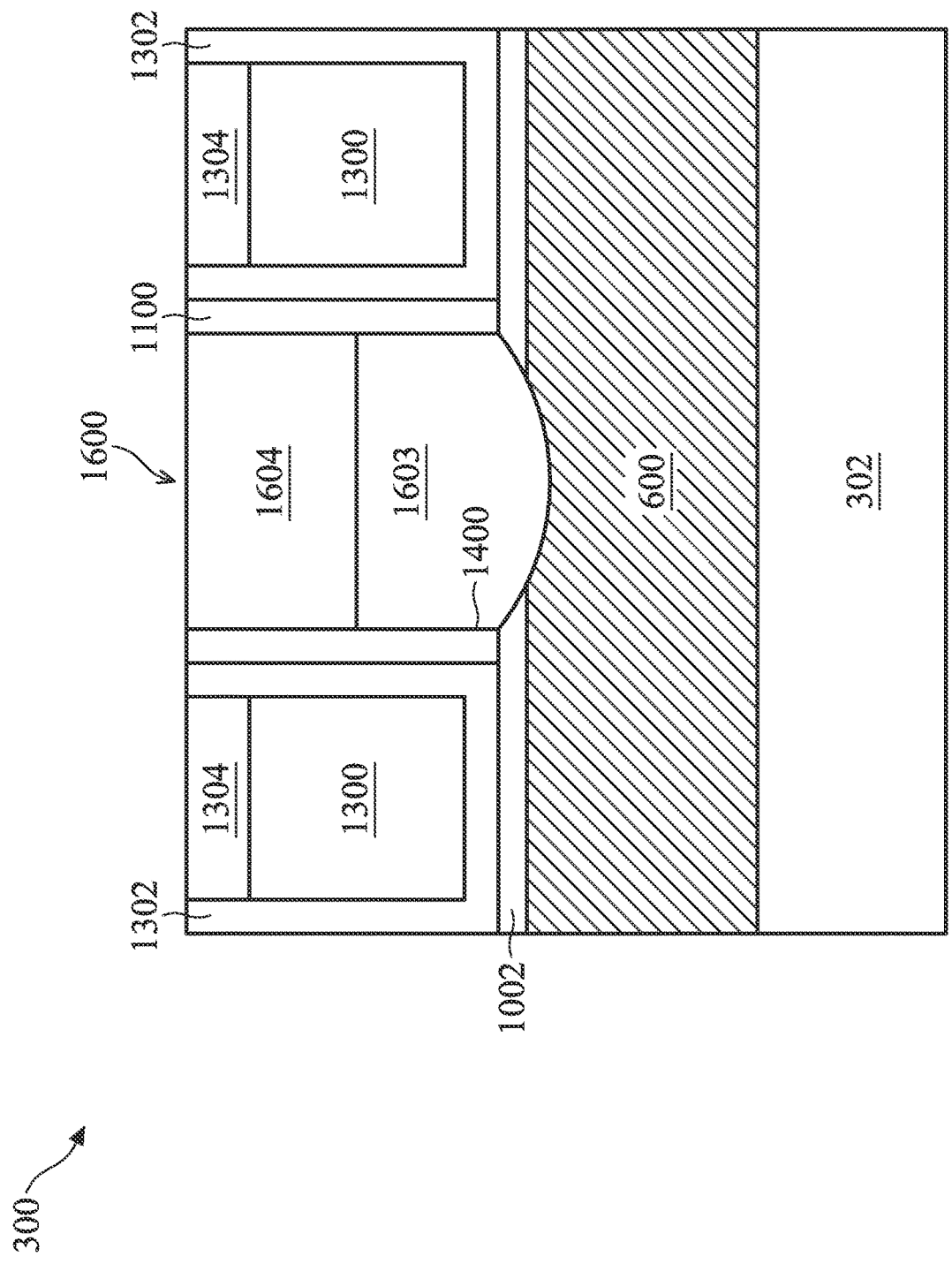

In comparison with the example of FIGS. 16-17 where the gate isolation structure 1600 fills the cavity 1400 with a single dielectric piece (which can include one or more dielectric materials listed above), FIGS. 18 and 19 illustrate various other embodiments of the gate isolation structure 1600 that includes multiple pieces, respectively. Each of the pieces may include, for example, silicon oxide, silicon nitride, silicon oxynitride, silicon carbide, silicon carbonitride, silicon oxycarbonitride, silicon oxycarbide, or combinations thereof. In the example of FIG. 18, the gate isolation structure 1600 includes a first piece 1601, which is formed as a conformal layer lining the cavity 1400, and a second piece 1602, which fills the cavity 1400 with the first piece coupled therebetween. In the example of FIG. 19, the gate isolation structure 1600 includes a first piece 1603, which fills a lower portion of the cavity 1400, and a second piece 1604, which fills an upper portion of the cavity 1400.

Figure 20:
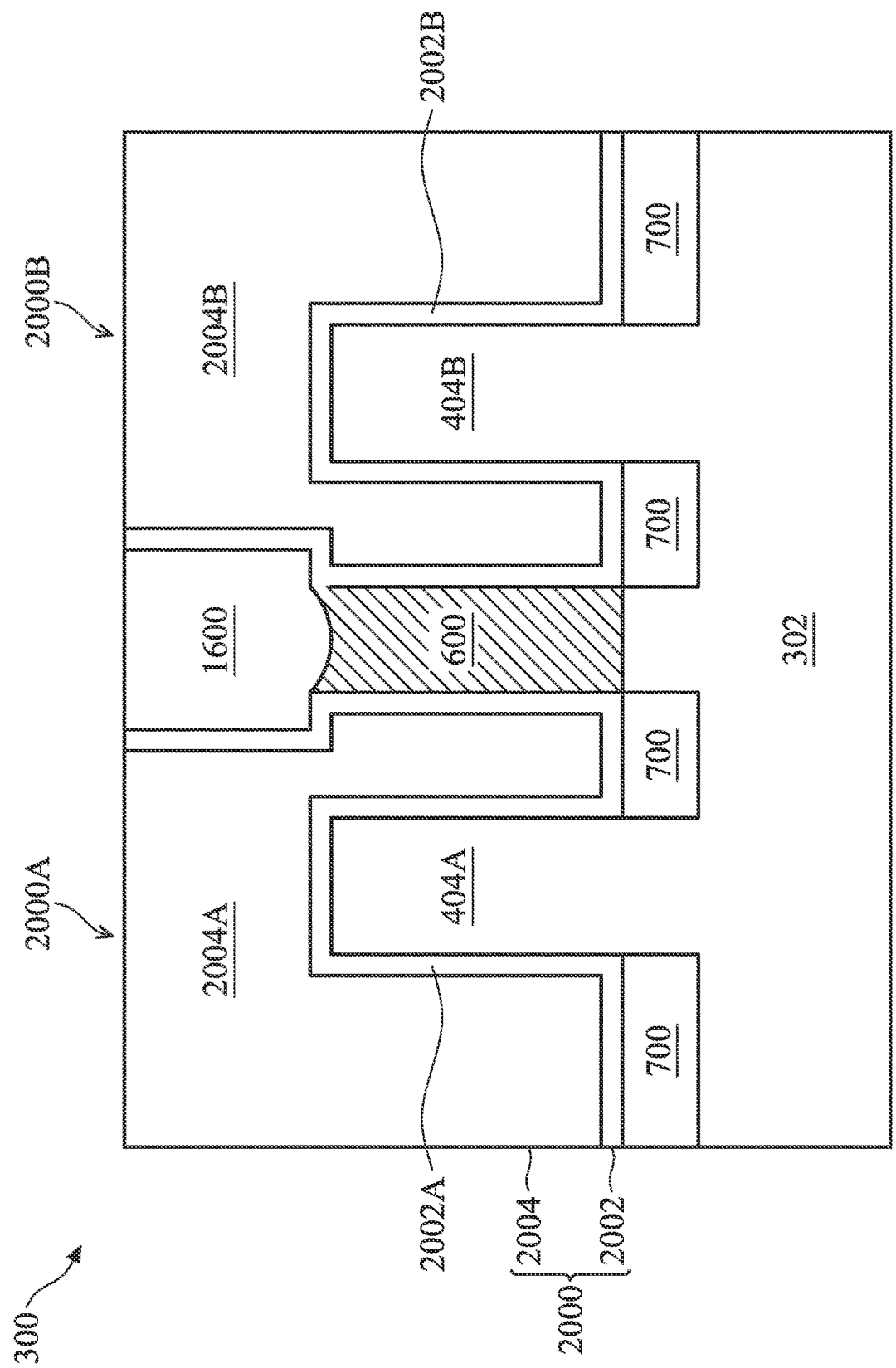

Corresponding to operation 222 of FIG. 2, FIG. 20 is a cross-sectional view of the FinFET device 300 including an active gate structure 2000 at one of the various stages of fabrication. The cross-sectional view of FIG. 20 is cut along a lengthwise direction of the active gate structure 2000 (e.g., cross-section B-B indicated in FIG. 1).

The active gate structure 2000 may be formed by replacing the dummy gate structure 1000. As illustrated, the active gate structure 2000 may include two portions 2000A and 2000B that are separated by the gate isolation structure 1600 and the dummy fin 600. The portion 2000A can overlay the active fin 404A, and the portion 2000B can overlay the active fin 404B. After the active gate structure 2000 is formed, the FinFET device 300 can include a number of transistors. For example, a first active transistor, adopting the active fin 404A as its conduction channel and portion 2000A as its active gate structure, may be formed; and a second active transistor, adopting the active fin 404B as its conduction channel and portion 2000B as its active gate structure, may be formed.

The active gate structure 2000 can include a gate dielectric layer 2002, a metal gate layer 2004, and one or more other layers that are not shown for clarity. For example, the active gate structure 2000 may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layer 2002 is formed in a corresponding gate trench to surround (e.g., straddle) one or more fins. In an embodiment, the gate dielectric layer 2002 can be a remaining portion of the dummy gate dielectric 1002. In another embodiment, the gate dielectric layer 2002 can be formed by removing the dummy gate dielectric 1002, followed by conformal deposition or thermal reaction. In yet another embodiment, the gate dielectric layer 2002 can be formed by removing the dummy gate dielectric 1002, followed by no further processing step (i.e., the gate dielectric layer 2002 may be a native oxide over the active fins 404A-B). The following discussions are directed to the gate dielectric layer 2002 that is formed by removing the dummy gate dielectric 1002 and performing conformal deposition. For example, the gate dielectric layer 2002 of the portion 2000A (sometimes referred to as "gate dielectric layer 2002A") is deposited in a gate trench that is formed by removing a portion of the dummy gate structure 1000 on the left-hand side of the dummy fin 600. The gate dielectric layer 2002A can overlay the top surfaces and the sidewalls of the active fin 404A, and one of the sidewalls of the dummy fin 600. The gate dielectric layer 2002 of the portion 2000B (sometimes referred to as "gate dielectric layer 2002B") is deposited in a gate trench that is formed by removing a portion of the dummy gate structure 1000 on the right-hand side of the dummy fin 600. The gate dielectric layer 2002B can overlay the top surfaces and the sidewalls of the active fin 404B, and the other of the sidewalls of the dummy fin 600.

The gate dielectric layer 2002 includes silicon oxide, silicon nitride, or multilayers thereof. In example embodiments, the gate dielectric layer 2002 includes a high-k dielectric material, and in these embodiments, the gate dielectric layer 2002 may have a k value greater than about 7.0, and may include a metal oxide or a silicate of Hf, Al, Zr, La, Mg, Ba, Ti, Pb, or combinations thereof. The formation methods of gate dielectric layer 2002 may include molecular beam deposition (MBD), atomic layer deposition (ALD), PECVD, and the like. A thickness of the gate dielectric layer 2002 may be between about 8 Å and about 20 Å, as an example.

The metal gate layer 2004 is formed over the gate dielectric layer 2002. The metal gate layer 2004 of the portion 2000A (sometimes referred to as "metal gate layer 2004A") is deposited in the gate trench over the gate dielectric layer 2002A; and the metal gate layer 2004 of the portion 2000B (sometimes referred to as "metal gate layer 2004B") is deposited in the gate trench over the gate dielectric layer 2002B. The metal gate layer 2004 may be a P-type work function layer, an N-type work function layer, multi-layers thereof, or combinations thereof, in some embodiments. Accordingly, the metal gate layer 2004 is sometimes referred to as a work function layer. For example, the metal gate layer 2004 may be an N-type work function layer. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

By forming the gate isolation structure 1600 extending into the dummy fin 600, the function of the gate isolation structure 1600, i.e., electrically isolating the metal gate layers 2004A and 2004B, can be assured. Extending the etching process (of forming the cavity 1400) to an upper portion of the dummy fin 600 can assure no void exists between the gate isolation structure 1600 and the dummy fin 600, when forming the metal gate layers 2004A and 2004B. As such, a merge of these two metal gate layers 2004A and 2004B (e.g., below the gate isolation structure 1600) can be advantageously avoided. Accordingly, the gate isolation structure 1600 can remain electrically isolating the metal layers (of the respective active gate structures) disposed on the opposite sides of the gate isolation structure 1600.

Figure 21:
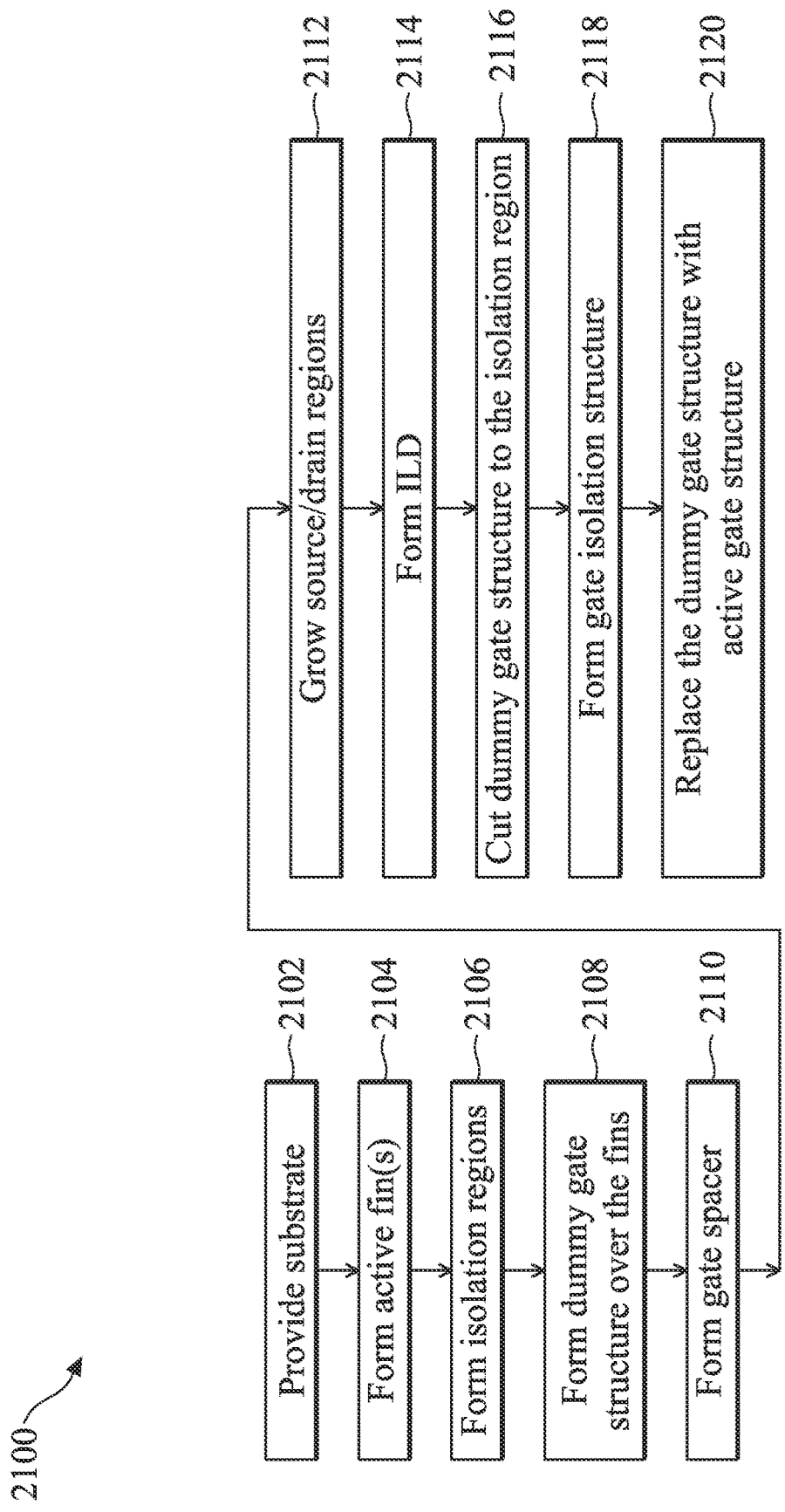
FIG. 21 illustrates a flow chart of another example method for making a non-planar transistor device, in accordance with some embodiments.

FIG. 21 illustrates a flowchart of another method 2100 to form a non-planar transistor device, according to one or more embodiments of the present disclosure. For example, at least some of the operations (or steps) of the method 2100 can be used to form a FinFET device (e.g., FinFET device 100), a nanosheet transistor device, a nanowire transistor device, a vertical transistor device, a gate-all-around (GAA) transistor device, or the like. It is noted that the method 2100 is merely an example, and is not intended to limit the present disclosure. Accordingly, it is understood that additional operations may be provided before, during, and after the method 2100 of FIG. 21, and that some other operations may only be briefly described herein. In some embodiments, operations of the method 2100 may be associated with cross-sectional views of an example FinFET device at various fabrication stages as shown in FIGS. 22, 23, 24, 25, 26, 27, 28, 29A, 29B, 29C, 29D, 30A, 30B, 30C, 30D, 31, 32, 33, 34, and 35, respectively, which will be discussed in further detail below.

In brief overview, the method 2100 starts with operation 2102 of providing a substrate. The method 2100 continues to operation 2104 of forming one or more active fins. The method 2100 continues to operation 2106 of forming isolation regions. The method 2100 continues to operation 2108 of forming a dummy gate structure over the fins. The dummy gate structures can include a dummy gate dielectric and a dummy gate disposed above the dummy gate dielectric. The method 2100 continues to operation 2110 of forming a gate spacer. The gate spacers are extended along sidewalls of the dummy gate structure. The method 2100 continues to operation 2112 of growing source/drain regions. The method 2100 continues to operation 2114 of forming an interlayer dielectric (ILD). The method 2100 continues to operation 2116 of cutting the dummy gate structure, which extends into at least one of the isolation regions. The method 2100 continues to operation 2118 of forming a gate isolation structure. The method 2100 continues to operation 2120 of replacing the dummy gate structure with an active gate structure.

Figure 26:
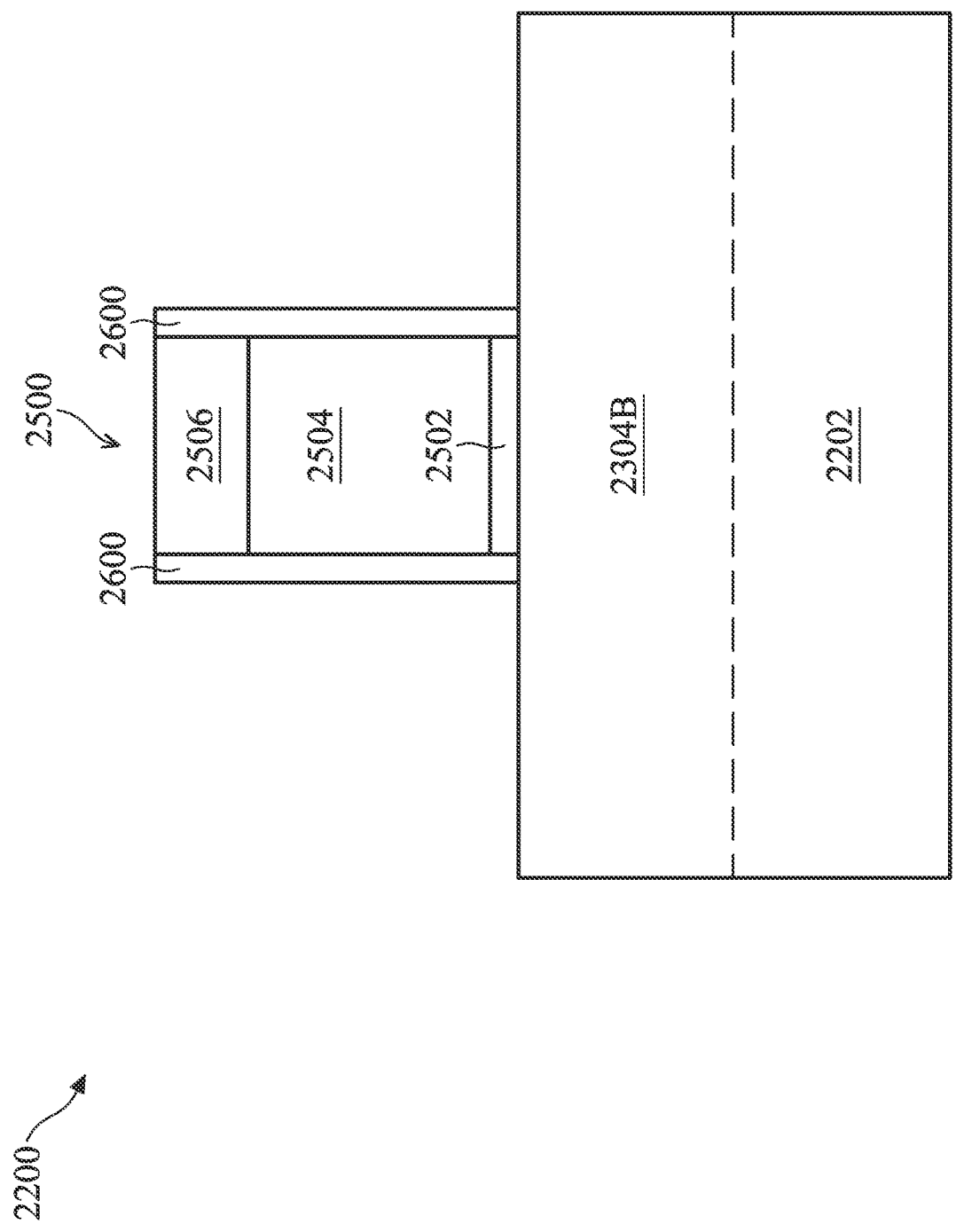
Figure 27:
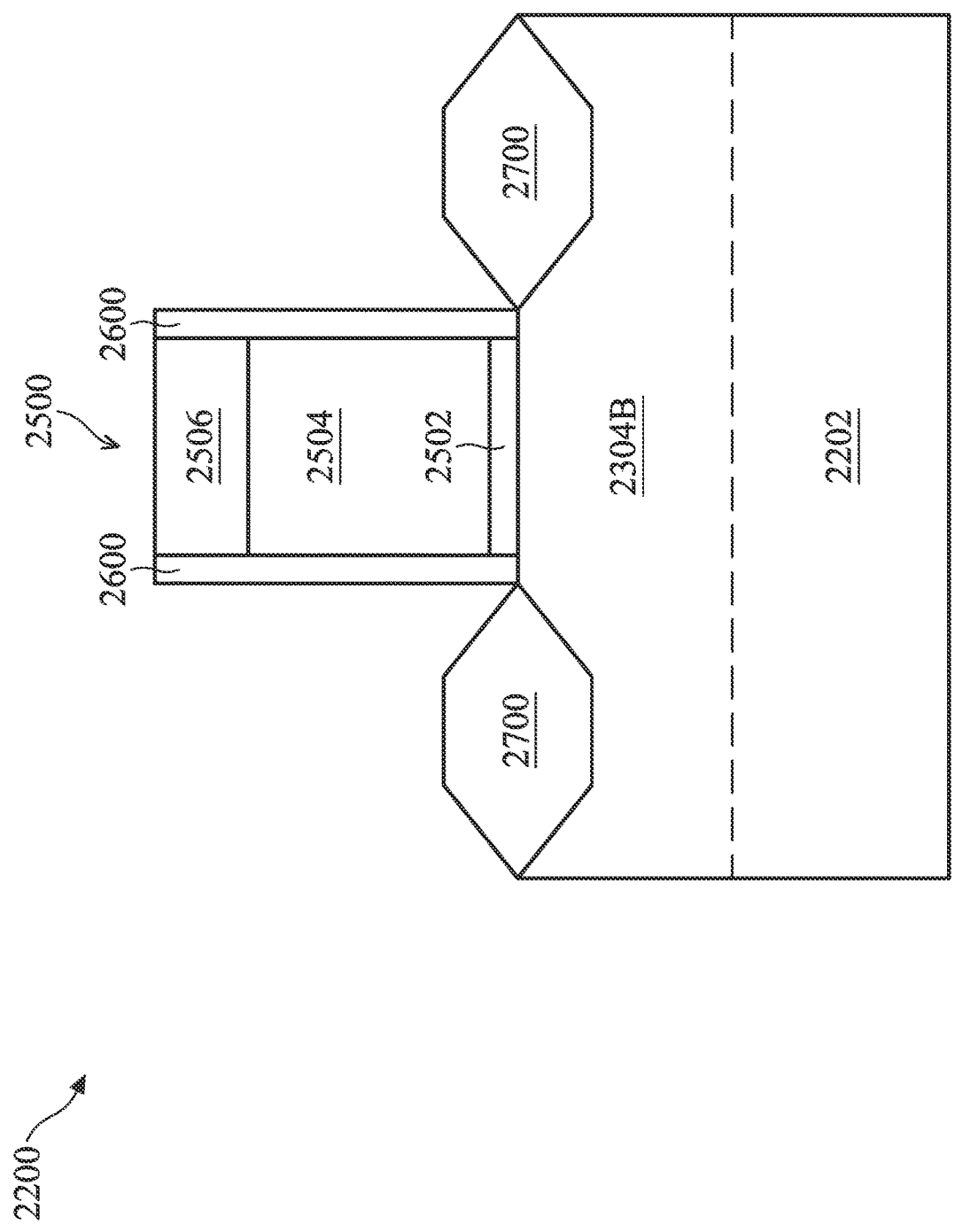
Figure 28:
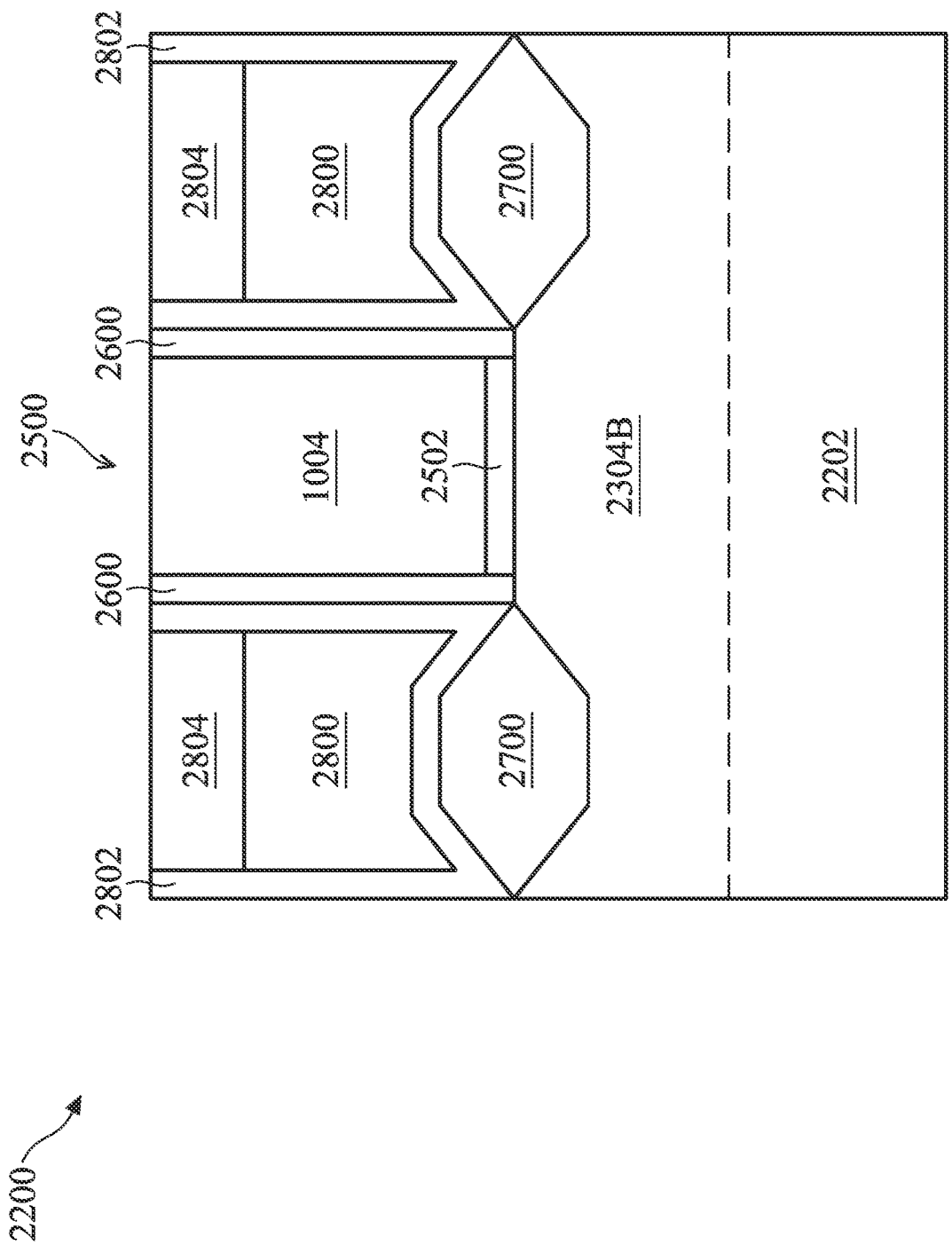

As mentioned above, FIGS. 22-35 each illustrate, in a cross-sectional view, a portion of a FinFET device 2200 at various fabrication stages of the method 2100 of FIG. 21. The FinFET device 2200 is similar to the FinFET device 100 shown in FIG. 1, but with multiple fins. For example, FIGS. 22-25, 29A-D, 31, and 35 illustrate cross-sectional views of the FinFET device 2200 along cross-section B-B (as indicated in FIG. 1); FIGS. 26-28 illustrate cross-sectional views of the FinFET device 2200 along cross-section A-A (as indicated in FIG. 1); and FIGS. 30A-D and 32-34 illustrate cross-sectional views of the FinFET device 2200 along a direction parallel to cross-section B-B. Although FIGS. 22-35 illustrate the FinFET device 2200, it is understood the FinFET device 2200 may include a number of other devices such as inductors, fuses, capacitors, coils, etc., which are not shown in FIGS. 22-35, for purposes of clarity of illustration.

Figure 22:
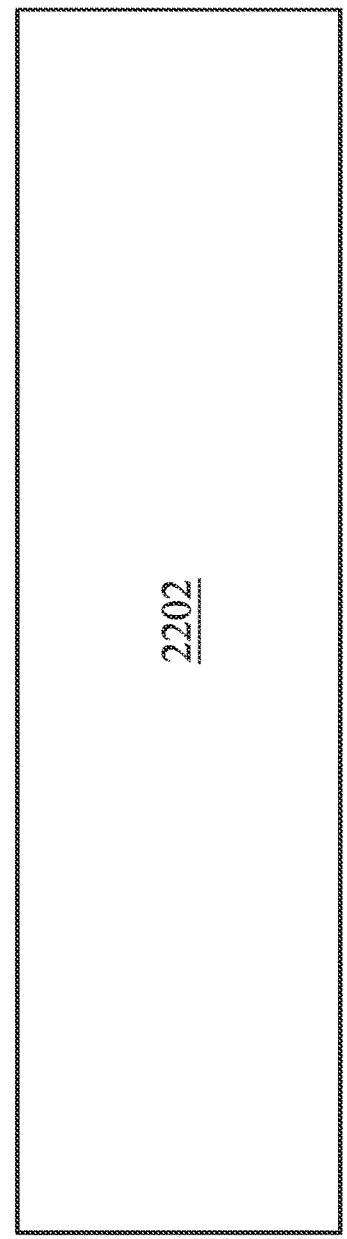
FIGS. 22, 23, 24, 25, 26, 27, 28, 29A, 29B, 29C, 29D, 30A, 30B, 30C, 30D, 31, 32, 33, 34, and 35 illustrate cross-sectional views of an example FinFET device (or a portion of the example FinFET device) during various fabrication stages, made by the method of FIG. 21, in accordance with some embodiments.

Corresponding to operation 2102 of FIG. 21, FIG. 22 is a cross-sectional view of the FinFET device 2200 including a semiconductor substrate 2202 at one of the various stages of fabrication. The cross-sectional view of FIG. 22 is cut along the lengthwise direction of an active/dummy gate structure of the FinFET device 300 (e.g., cross-section B-B indicated in FIG. 1).

The substrate 2202 may be a semiconductor substrate, such as a bulk semiconductor, a semiconductor-on-insulator (SOI) substrate, or the like, which may be doped (e.g., with a p-type or an n-type dopant) or undoped. The substrate 2202 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 2202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 23:
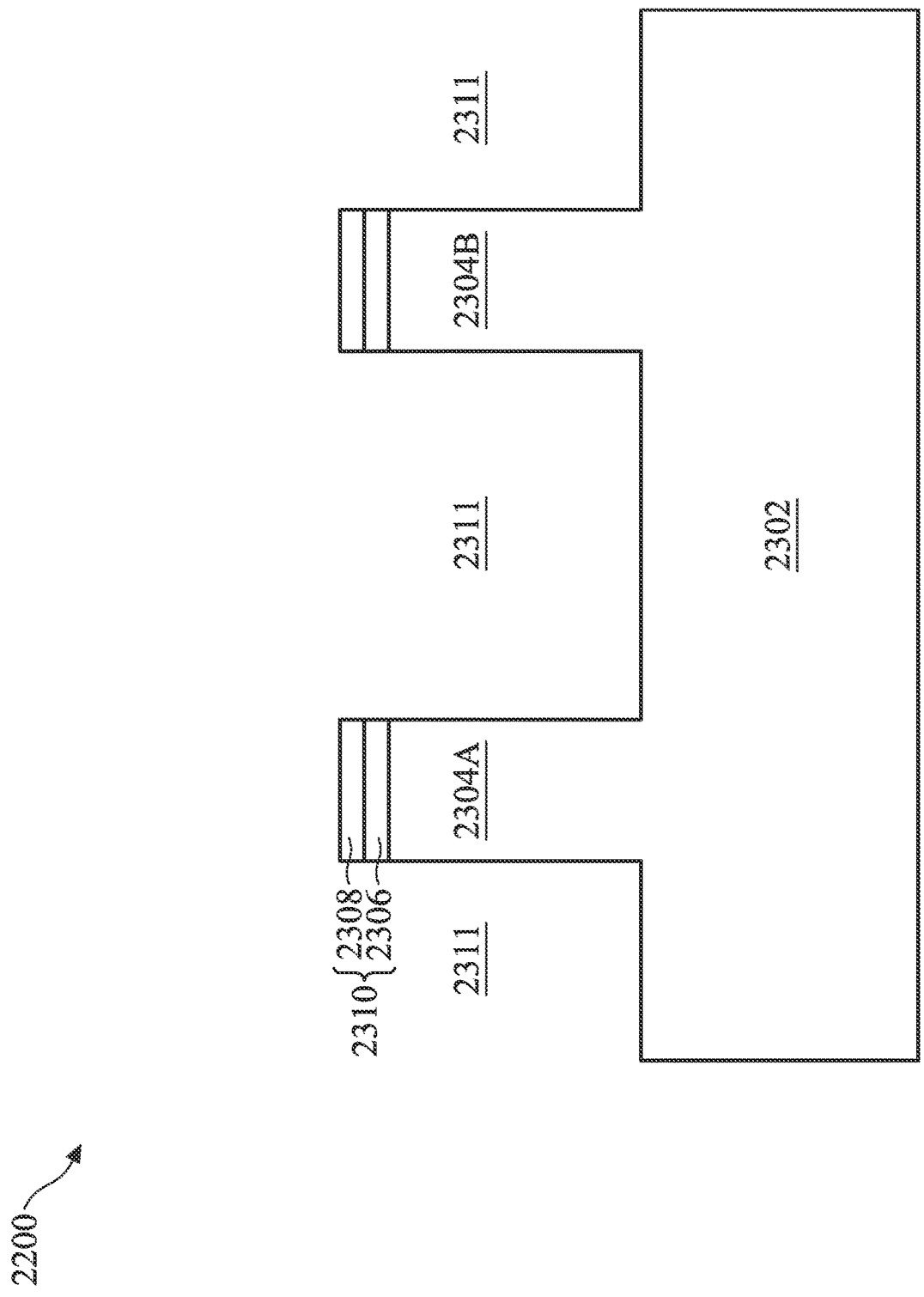

Corresponding to operation 2104 of FIG. 21, FIG. 4 is a cross-sectional view of the FinFET device 2200 including semiconductor fins 2304A and 2304B at one of the various stages of fabrication. The cross-sectional view of FIG. 23 is cut along the lengthwise direction of an active/dummy gate structure of the FinFET device 2200 (e.g., cross-section B-B indicated in FIG. 1).

The semiconductor fins 2304A-B may be each configured as an active fin, which will be adopted as an active (e.g., electrically functional) fin or channel in a respective completed FinFET. Hereinafter, the semiconductor fins 2304A-B may sometimes be referred to as "active fins 2304A-B." Although two semiconductor fins are shown in the illustrated example, it should be appreciated that the FinFET device 2200 can include any number of semiconductor fins while remaining within the scope of the present disclosure.

The semiconductor fins 2304A-B are formed by patterning the substrate 2202 using, for example, photolithography and etching techniques. For example, a mask layer, such as a pad oxide layer 2306 and an overlying pad nitride layer 2308, is formed over the substrate 2202. The pad oxide layer 2306 may be a thin film comprising silicon oxide formed, for example, using a thermal oxidation process. The pad oxide layer 2306 may act as an adhesion layer between the substrate 2202 and the overlying pad nitride layer 2308. In some embodiments, the pad nitride layer 2308 is formed of silicon nitride, silicon oxynitride, silicon carbonitride, the like, or combinations thereof. Although only one pad nitride layer 2308 is illustrated, a multilayer structure (e.g., a layer of silicon oxide on a layer of silicon nitride) may be formed as the pad nitride layer 2308. The pad nitride layer 2308 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 2306 and pad nitride layer 2308 to form a patterned mask 2310, as illustrated in FIG. 23.

The patterned mask 2310 is subsequently used to pattern exposed portions of the substrate 2202 to form trenches (or openings) 2311, thereby defining the active fins 2304A-B between adjacent trenches 2311 as illustrated in FIG. 23. When multiple fins are formed, such a trench may be disposed between any adjacent ones of the fins. In some embodiments, the active fins 2304A-B are formed by etching trenches in the substrate 2202 using, for example, reactive ion etch (RIE), neutral beam etch (NBE), the like, or combinations thereof. The etch may be anisotropic. In some embodiments, the trenches 2311 may be strips (viewed from the top) parallel to each other, and closely spaced with respect to each other. In some embodiments, the trenches 2311 may be continuous and surround the active fins 2304A-B.

The active fins 2304A-B may be patterned by any suitable method. For example, the active fins 2304A-B may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

FIGS. 22 and 23 illustrate an embodiment of forming the active fins 2304A-B, but a fin may be formed in various different processes. For example, a top portion of the substrate 2202 may be replaced by a suitable material, such as an epitaxial material suitable for an intended type (e.g., N-type or P-type) of semiconductor devices to be formed. Thereafter, the substrate 2202, with epitaxial material on top, is patterned to form the active fins 2304A-B that include the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the active fins 2304A-B may include silicon germanium ($Si_xGe_{1-x}$, where x can be between 0 and 1), silicon carbide, pure or pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 24:
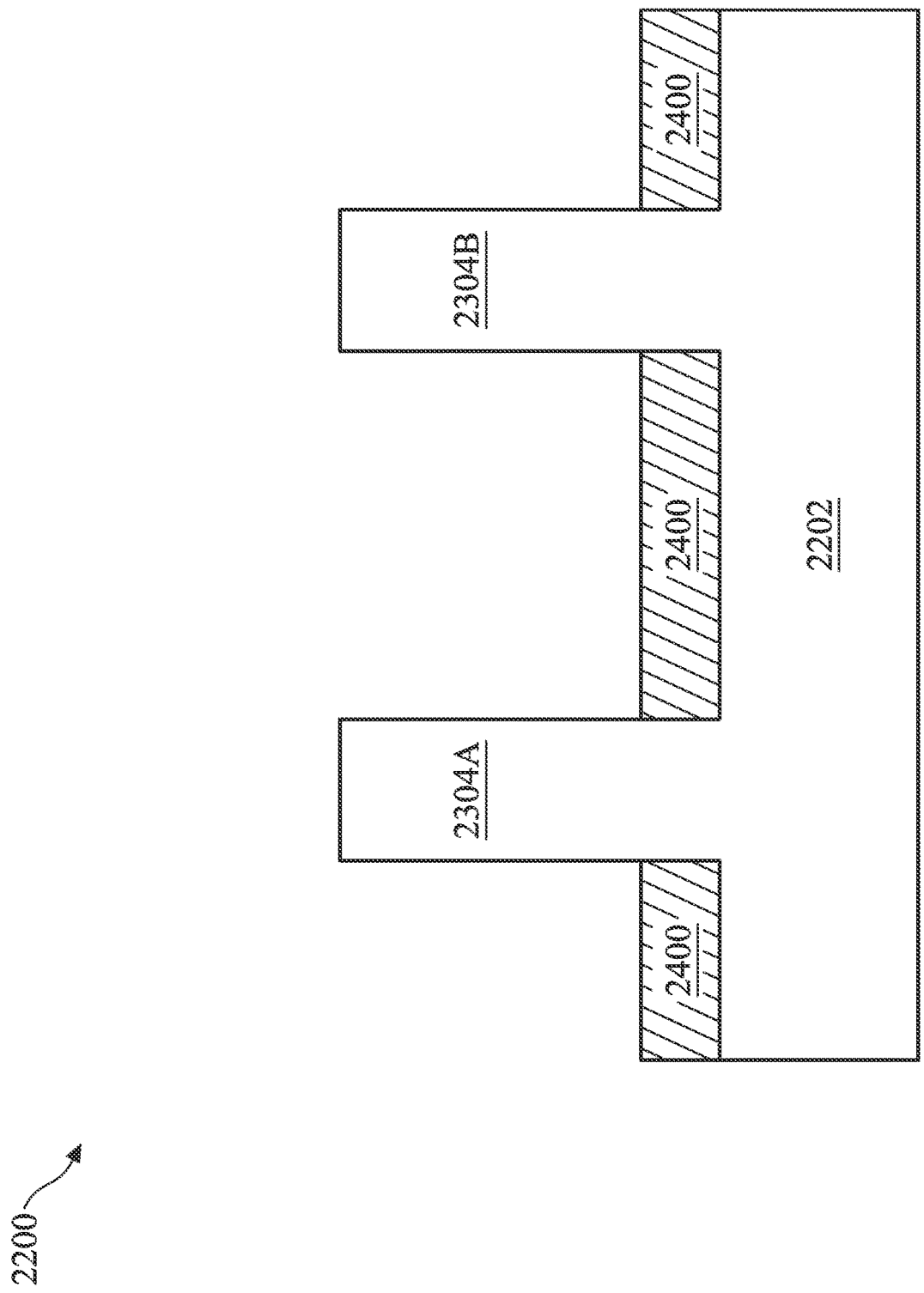

Corresponding to operation 2106 of FIG. 21, FIG. 24 is a cross-sectional view of the FinFET device 2200 including isolation regions 2400 at one of the various stages of fabrication. The cross-sectional view of FIG. 21 is cut along the lengthwise direction of an active/dummy gate structure of the FinFET device 2200 (e.g., cross-section B-B indicated in FIG. 1).

The isolation regions 2400, which are formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 2400 and a top surface of the active fins 2304A-B that are coplanar (not shown). The patterned mask 2310 (FIG. 23) may be removed by the planarization process, in some embodiments.

In some embodiments, the isolation regions 2400 include a liner, e.g., a liner oxide (not shown), at the interface between each of the isolation regions 2400 and the substrate 2202 (active fins 2304A-B). In some embodiments, the liner oxide is formed to reduce crystalline defects at the interface between the substrate 2202 and the isolation region 2400. Similarly, the liner oxide may also be used to reduce crystalline defects at the interface between the active fins 2304A-B and the isolation region 2400. The liner oxide (e.g., silicon oxide) may be a thermal oxide formed through a thermal oxidation of a surface layer of the substrate 2202, although other suitable method may also be used to form the liner oxide.

Next, the isolation regions 2400 are recessed to form shallow trench isolation (STI) regions 2400, as shown in FIG. 24. The isolation regions 2400 are recessed such that the upper portions of the active fins 2304A-B protrude from between neighboring STI regions 2400. Respective top surfaces of the STI regions 2400 may have a flat surface (as illustrated), a convex surface, a concave surface (such as dishing), or combinations thereof. The top surfaces of the STI regions 2400 may be formed flat, convex, and/or concave by an appropriate etch. The isolation regions 2400 may be recessed using an acceptable etching process, such as one that is selective to the material of the isolation regions 2400. For example, a dry etch or a wet etch using dilute hydrofluoric (DHF) acid may be performed to recess the isolation regions 2400.

Figure 25:
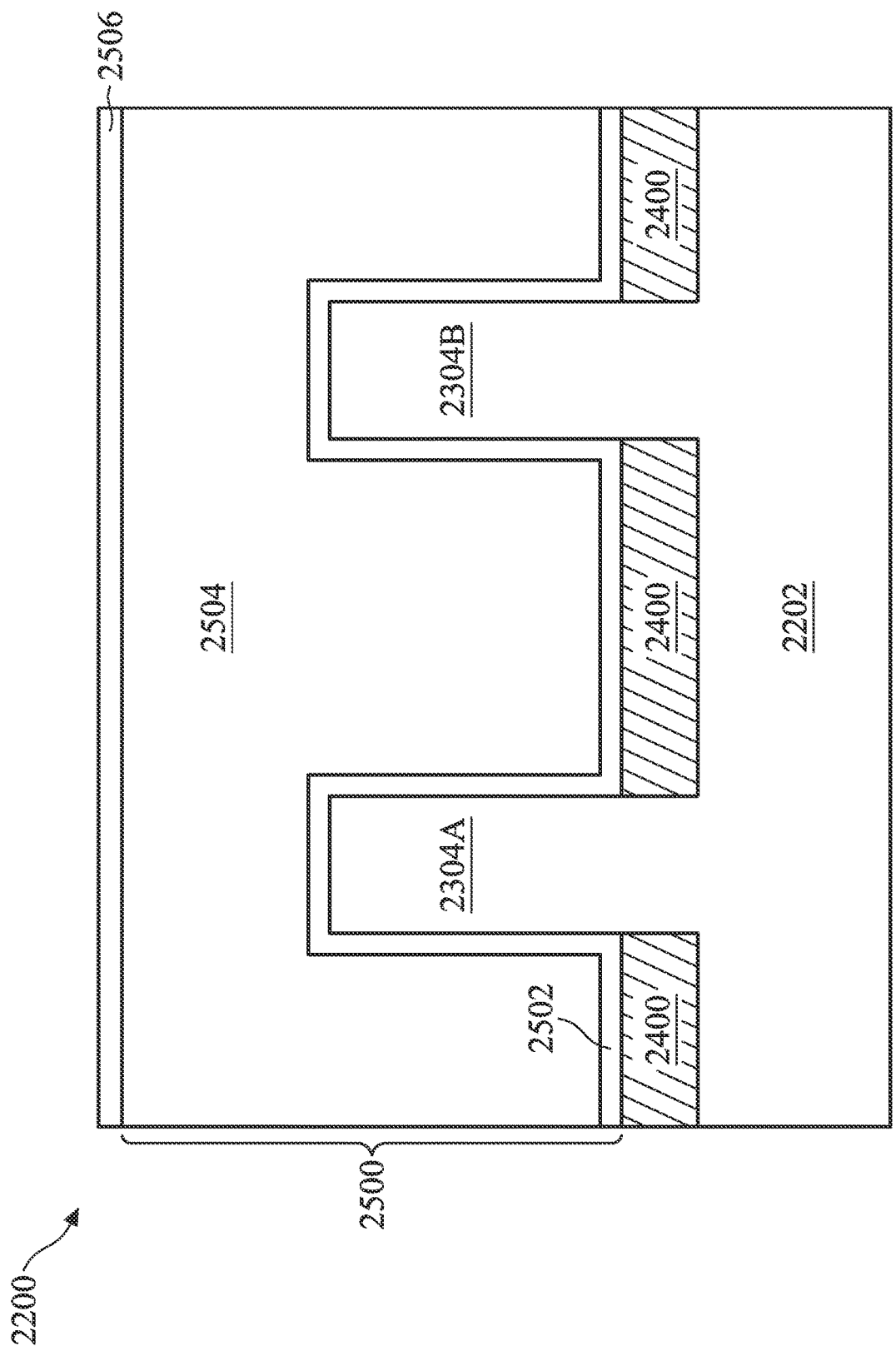

Corresponding to operation 2108 of FIG. 21, FIG. 25 is a cross-sectional view of the FinFET device 300 including a dummy gate structure 2500 at one of the various stages of fabrication. The cross-sectional view of FIG. 25 is cut along the lengthwise direction of the dummy gate structure 2500 (e.g., cross-section B-B indicated in FIG. 1).

The dummy gate structure 2500 includes a dummy gate dielectric 2502 and a dummy gate 2504, in some embodiments. A mask 2506 may be formed over the dummy gate structure 2500. To form the dummy gate structure 2500, a dielectric layer is formed on the active fins 2304A-B. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques to form the mask 2506. The pattern of the mask 2506 then may be transferred to the gate layer and the dielectric layer by a suitable etching technique to form the dummy gate 2504 and the underlying dummy gate dielectric 2502, respectively. The dummy gate 2504 and the dummy gate dielectric 2502 straddle or otherwise cover a respective portion (e.g., a channel region) of each of the active fins 2304A-B. For example, when one dummy gate structure is formed, a dummy gate and dummy gate dielectric of the dummy gate structure may straddle respective central portions of the fins. The dummy gate 2504 may also have a lengthwise direction (e.g., direction B-B of FIG. 1) perpendicular to the lengthwise direction (e.g., direction of A-A of FIG. 1) of the fins.

The dummy gate dielectric 2502 is shown to be formed over the active fins 2404A-B (e.g., over the respective top surfaces and the sidewalls of the fins) and over the STI regions 2400 in the example of FIG. 25. In other embodiments, the dummy gate dielectric 2502 may be formed by, e.g., thermal oxidization of a material of the fins, and therefore, may be formed over the fins but not over the STI regions 2400. It should be appreciated that these and other variations are still included within the scope of the present disclosure.

FIGS. 26-28 illustrate the cross-sectional views of further processing (or making) of the FinFET device 2200 along the lengthwise direction (e.g., cross-section A-A indicated in FIG. 1) of one of the active fins 2304A-B. As a representative example, one dummy gate structure (e.g., 2500) is illustrated over the active fin 2304B in FIGS. 26-28. It should be appreciated that more or less than one dummy gate structure can be formed over the fin 2304B (and each of the other fins, e.g., 2304A), while remaining within the scope of the present disclosure.

Corresponding to operation 2110 of FIG. 21, FIG. 26 is a cross-sectional view of the FinFET device 2200 including a gate spacer 2600 formed around (e.g., along and contacting the sidewalls of) the dummy gate structure 2500. The cross-sectional view of FIG. 11 is cut along the lengthwise direction of the active fin 2304B (e.g., cross-section A-A indicated in FIG. 1).

For example, the gate spacer 2600 may be formed on opposing sidewalls of the dummy gate structure 2500. Although the gate spacer 2600 is shown as a single layer in the example of FIG. 26 (and the following figures), it should be understood that the gate spacer can be formed to have any number of layers while remaining within the scope of the present disclosure. The gate spacer 2600 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 2600. The shapes and formation methods of the gate spacer 2600 as illustrated in FIG. 26 are merely non-limiting examples, and other shapes and formation methods are possible. These and other variations are fully intended to be included within the scope of the present disclosure.

Corresponding to operation 2112 of FIG. 21, FIG. 27 is a cross-sectional view of the FinFET device 2200 including a number (e.g., 2) of source/drain regions 2700 at one of the various stages of fabrication. The cross-sectional view of FIG. 27 is cut along the lengthwise direction of the active fin 2304B (e.g., cross-section A-A indicated in FIG. 1).

The source/drain regions 2700 are formed in recesses of the active fin 2304B adjacent to the dummy gate structures 2500, e.g., between adjacent dummy gate structures 1000 and/or next to a dummy gate structure 1000. The recesses are formed by, e.g., an anisotropic etching process using the dummy gate structures 2500 as an etching mask, in some embodiments, although any other suitable etching process may also be used.

The source/drain regions 2700 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 27, the epitaxial source/drain regions 2700 may have surfaces raised from the top surface of the active fin 2304B (e.g. raised above the non-recessed portions of the active fin 2304B) and may have facets. In some embodiments, the source/drain regions 2700 of the adjacent fins may merge to form a continuous epitaxial source/drain region (not shown). In some embodiments, the source/drain regions 2700 of the adjacent fins may not merge together and remain separate source/drain regions 2700 (not shown). In some embodiments, when the resulting FinFET device is an n-type FinFET, the source/drain regions 2700 can include silicon carbide (SiC), silicon phosphorous (SiP), phosphorous-doped silicon carbon (SiCP), or the like. In some embodiments, when the resulting FinFET device is a p-type FinFET, the source/drain regions 2700 comprise SiGe, and a p-type impurity such as boron or indium.

The epitaxial source/drain regions 2700 may be implanted with dopants to form source/drain regions 2700 followed by an annealing process. The implanting process may include forming and patterning masks such as a photoresist to cover the regions of the FinFET device 2200 that are to be protected from the implanting process. The source/drain regions 2700 may have an impurity (e.g., dopant) concentration in a range from about $1 \times 10^{19}$ cm$^{-3}$ to about $1 \times 10^{21}$ cm$^{-3}$. P-type impurities, such as boron or indium, may be implanted in the source/drain regions 2700 of a P-type transistor. N-type impurities, such as phosphorous or arsenide, may be implanted in the source/drain regions 2700 of an N-type transistor. In some embodiments, the epitaxial source/drain regions 2700 may be in situ doped during their growth.

Corresponding to operation 2114 of FIG. 21, FIG. 28 is a cross-sectional view of the FinFET device 2200 including an interlayer dielectric (ILD) 2800 at one of the various stages of fabrication. The cross-sectional view of FIG. 28 is cut along the lengthwise direction of the active fin 2304B (e.g., cross-section A-A indicated in FIG. 1).

In some embodiments, prior to forming the ILD 2800, a contact etch stop layer (CESL) 2802 is formed over the structure, as illustrated in FIG. 28. The CESL 2802 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 2800 is formed over the CESL 2802 and over the dummy gate structures 2500. In some embodiments, the ILD 2800 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 2800 is formed, an optional dielectric layer 2804 is formed over the ILD 2800. The dielectric layer 2804 can function as a protection layer to prevent or reduces the loss of the ILD 2800 in subsequent etching processes. The dielectric layer 2804 may be formed of a suitable material, such as silicon nitride, silicon carbonitride, or the like, using a suitable method such as CVD, PECVD, or FCVD. After the dielectric layer 2804 is formed, a planarization process, such as a CMP process, may be performed to achieve a level upper surface for the dielectric layer 2804. The CMP may also remove the mask 2506 and portions of the CESL 2802 disposed over the dummy gate 2504. After the planarization process, the upper surface of the dielectric layer 2804 is level with the upper surface of the dummy gate 2504, in some embodiments.

An example gate-last process (sometimes referred to as replacement gate process) can then performed to replace the dummy gate structure 2500 with an active gate structure (which may also be referred to as a replacement gate structure or a metal gate structure). Prior to replacing the dummy gate structure, a portion of the dummy gate structure disposed between the active fins can be replaced with an isolation structure so as to separate the active gate structure into different portions that are electrically coupled to the active fins, respectively. FIGS. 29A-35 illustrate the cross-sectional views of further processing (or making) of the FinFET device 2200, which will be discussed in more detail as follows.

Corresponding to operation 2116 of FIG. 21, FIGS. 29A, 29B, 29C, 29D, 30A, 30B, 30C, and 30D are each a cross-sectional view of the FinFET device 2200 in which the dummy gate structure 2500 is cut, intercepted, or otherwise disconnected to form a cavity (trench, or otherwise opening) 2900 at one of the various stages of fabrication.

The cross-sectional views of FIGS. 29A-D are each cut along the lengthwise direction of the dummy gate structure 2500 (e.g., cross-section B-B indicated in FIG. 1); and the cross-sectional views of FIGS. 30A-D are each cut along an extended direction of the isolation regions 2400 (e.g., a direction in parallel with the cross-section A-A indicated in FIG. 1). Specifically, FIGS. 14A-D illustrate various embodiments of the cavity 1400. The cross-sectional views of FIGS. 30A-D, cut along the extended direction of the isolation regions 2400, correspond to the cross-sectional views of FIGS. 29A-D, respectively.

Figure 29A:
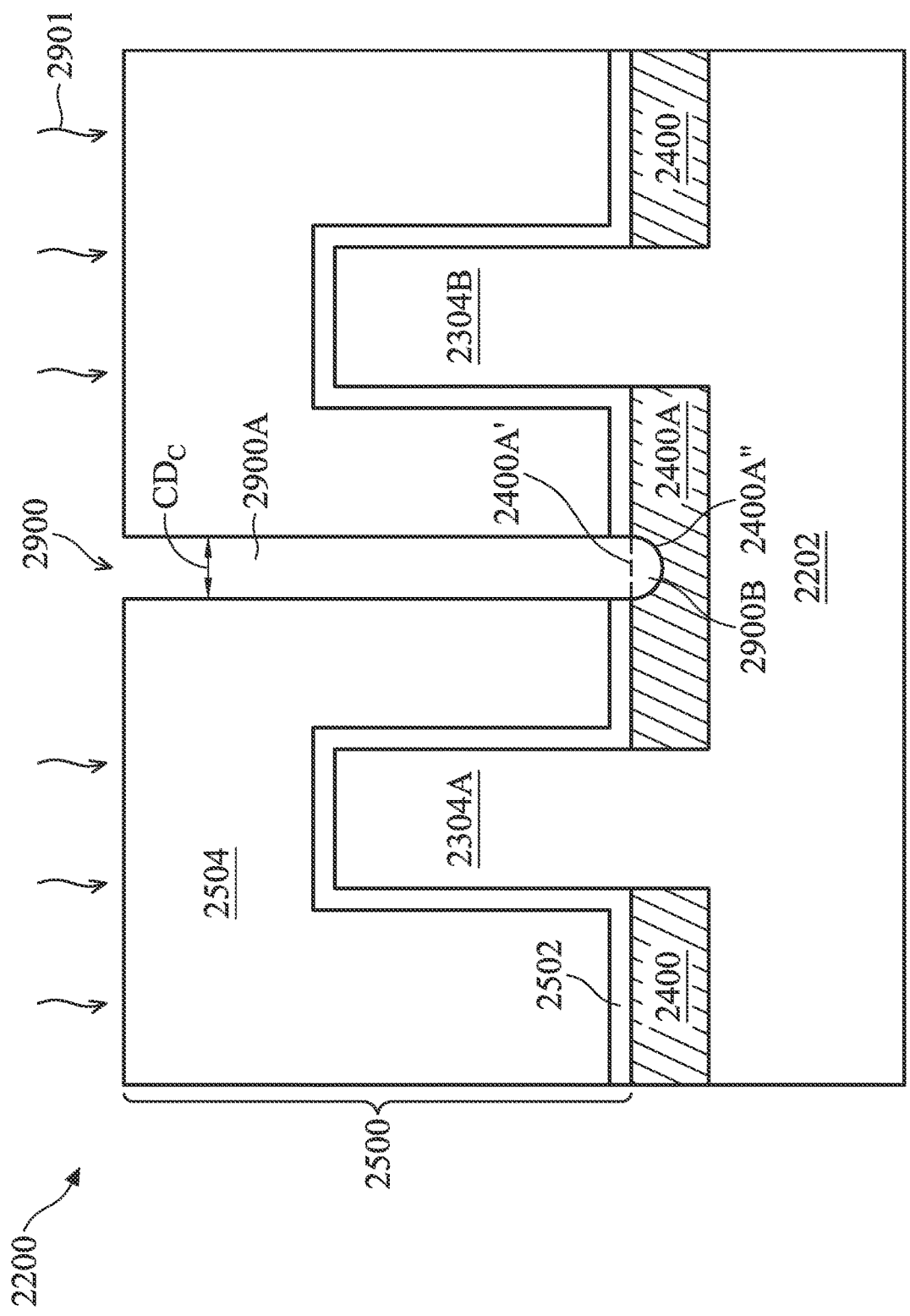
Figure 30A:
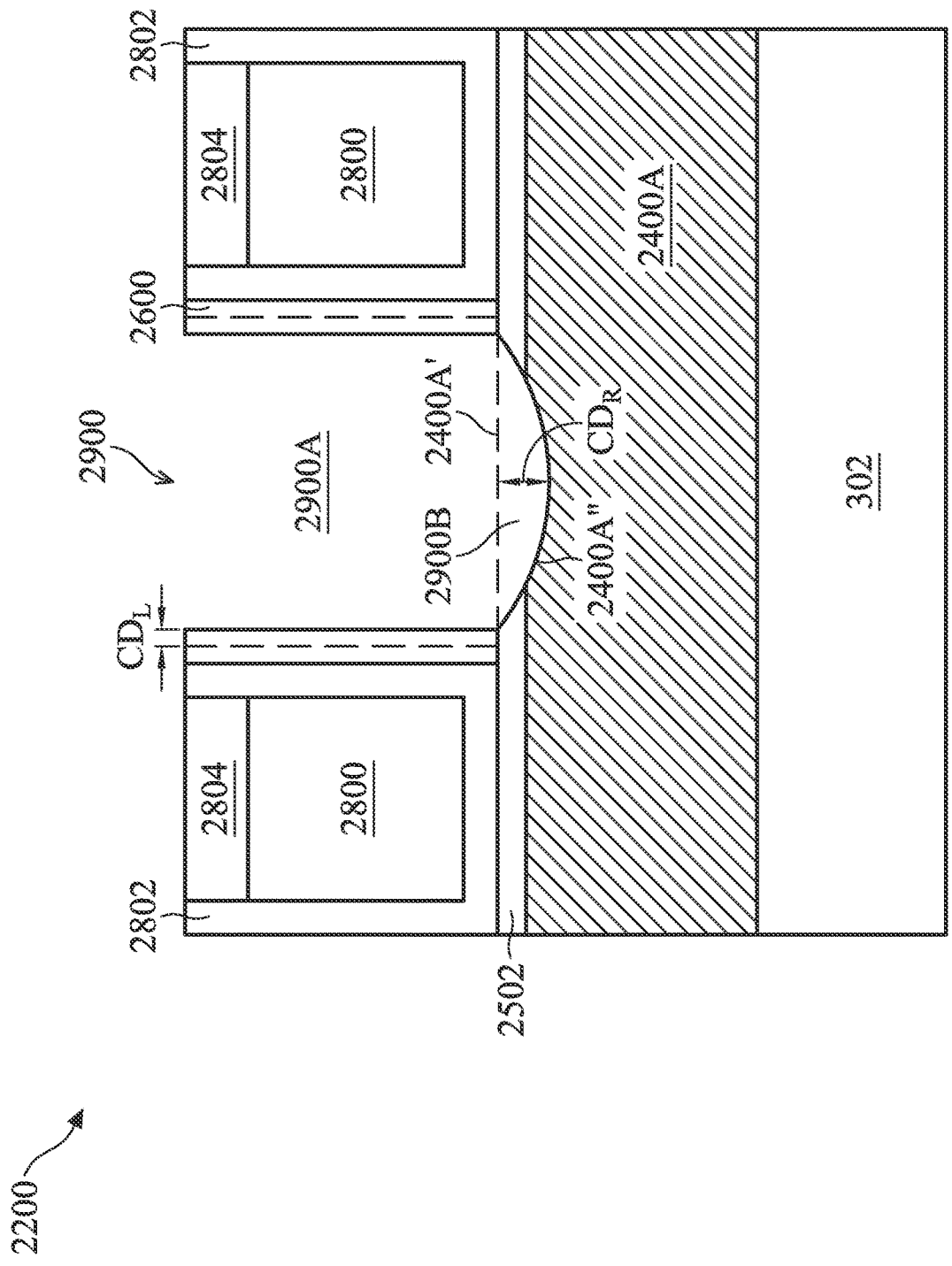

To form the cavity 2900, a mask (not shown) may be formed over the dummy gate structure 2800 to expose a portion of the dummy gate structure 2500 desired to be removed, followed by an etching processes 2901 to remove the portion of the dummy gate structure 2500, as illustrated in FIG. 29A. During the removal of the dummy gate structure 2500, at least one of the isolation regions 2400 (e.g., isolation region 2400A disposed between the active fins 2304A-B) may function as an "interim" etch stop layer to trigger a controlled amount of etch on the isolation region 2400. For example, the etching process 2901 may be configured to remove the portion of the dummy gate structure 2500 so as to partially expose a top surface 2400A' of the isolation region 2400A, which may be substantially flat along its lengthwise direction, as indicated by dotted lines in FIGS. 29A and 30A. Upon the top surface 2400A' being partially exposed, the etching process 2901 may be configured to further etch an upper portion of the isolation region 2400A to cause a portion of the top surface 2400A" (e.g., the portion being exposed) to recess or otherwise extend into the isolation region 2400A. Thus, the cavity 2900 may be formed to include a first portion 2900A and a second portion 2900B. As illustrated in FIG. 30A, the first portion 2900A can be disposed in a region surrounded by the gate spacer 2600; and the second portion 2900B can be disposed in a region below the gate spacer 2600.

The etching process 2901 may include one or more operations to collectively or respectively etch the dummy gate structure 2500 and the isolation region 2400A. For example, the etching process 2901 can include a single operation that first etches the dummy gate structure 2500 and then the isolation region 2400A. In another example, the etching process 2901 can include a first operation that etches the dummy gate structure 2500 and a second operation that etches the isolation region 2400A.

In existing technologies, the etching rate for the dummy gate structure 2500 is significantly higher than the isolation region 2400A, where almost only the dummy gate structure 2500 is etched. This can result in an undesired, large amount of lateral etch (e.g., along the lengthwise direction of the dummy gate structure 2500). For example when process variation occurs, a relatively large amount of lateral etch (or otherwise over etch) may occur to the dummy gate structure around the higher isolation regions while some shorter isolation regions still have not been exposed yet. As such, a critical dimension, $CD_C$, of the cavity 2900 may be disadvantageously increased, which may in turn reduce the respective critical dimensions of different portions of an active gate structure on the opposite sides of the cavity 2900 (or a gate isolation structure filling up the cavity 2900).

To control the etch amount on the isolation region 2400A, in some embodiments, the etching process 2901 may be configured to etch the dummy gate structure 2500 in a slightly higher etching rate than the isolation region 2400A (e.g., no more than 2 times higher). In some other embodiments, the etching process 2901 may be configured to etch the dummy gate structure 2500 and the isolation region 2400A in a substantially similar etching rate. In other words, the etching process 2901 may have an etching selectivity of the dummy gate structure to the isolation region not higher than a certain threshold. In this way, the over etch, if any, may be "embedded" into the isolation region, instead of laterally penetrating into the dummy gate structure, which can in turn cover the process variation while assuring that no residual dummy gate structure will be formed over the isolation region.

The etching process 2901 may be configured to have at least some anisotropic etching characteristic to limit the undesired lateral etch. For example, the etching process 2901 can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof to control the above-described etching rates. As a non-limiting example, a source power of 10 watts to 3000 watts, a bias power of 0 watts to 3000 watts, a pressure of 1 millitorr to 5 torr, and an etch gas flow of 0 standard cubic centimeters per minute to 5000 standard cubic centimeters per minute may be used in the etching process 2901. However, it is noted that source powers, bias powers, pressures, and flow rates outside of these ranges are also contemplated.

In another example, the etching process 2901 can include a wet etching process, which can have a certain amount of isotropic characteristic, in combination with the plasma etching process. In such a wet etching process, a main etch chemical such as hydrofluoric acid (HF), fluorine ($F_2$), and other suitable main etch chemicals and combinations thereof can be used with assistive etch chemicals such as sulfuric acid ($H_2SO_4$), hydrogen chloride (HCl), hydrogen bromide (HBr), ammonia ($NH_3$), phosphoric acid ($H_3PO_4$), and other suitable assistive etch chemicals and combinations thereof as well as solvents such as deionized water, alcohol, acetone, and other suitable solvents and combinations thereof to control the above-described etching rates.

The cross-sectional views of FIG. 29A and the corresponding FIG. 30A illustrate the cavity 2900 as having a curvature-based profile for at least a portion of its bottom surface (e.g., the top surface 2400A" of the isolation region 2400A) that recesses into the isolation region 2400A. For example, the portion of the bottom surface presents a convex profile. In some embodiments, any point of this portion of the bottom surface is on or below the pre-recessed top surface 2400A' of the isolation region 2400A, in which a critical dimension, $CD_R$ (FIG. 30A), is defined as a difference between the top surface 2400A' and 2400A". As a non-limiting example, $CD_R$ can range from about 3 Å to about 300 Å.

Figure 29B:
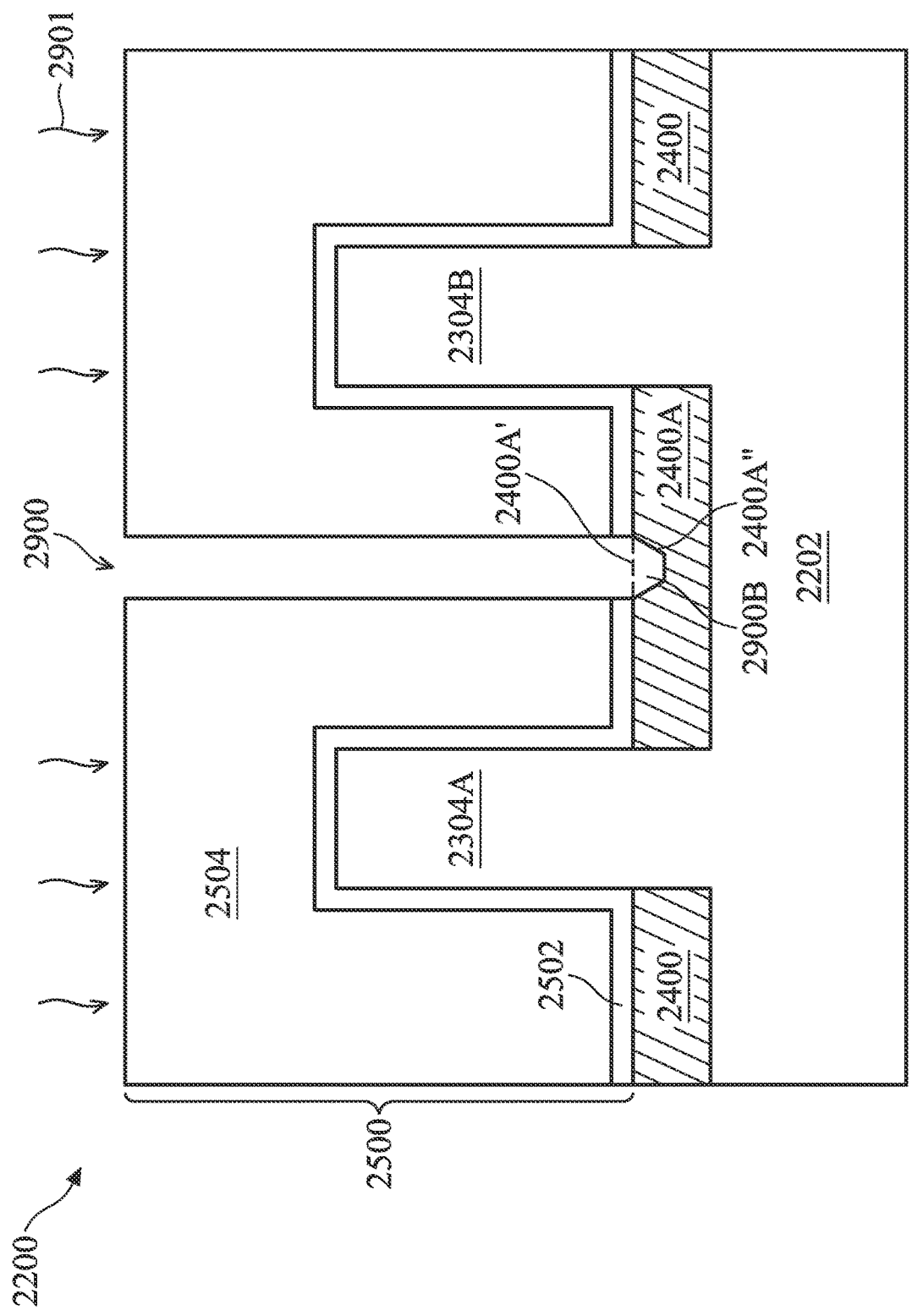
Figure 29C:
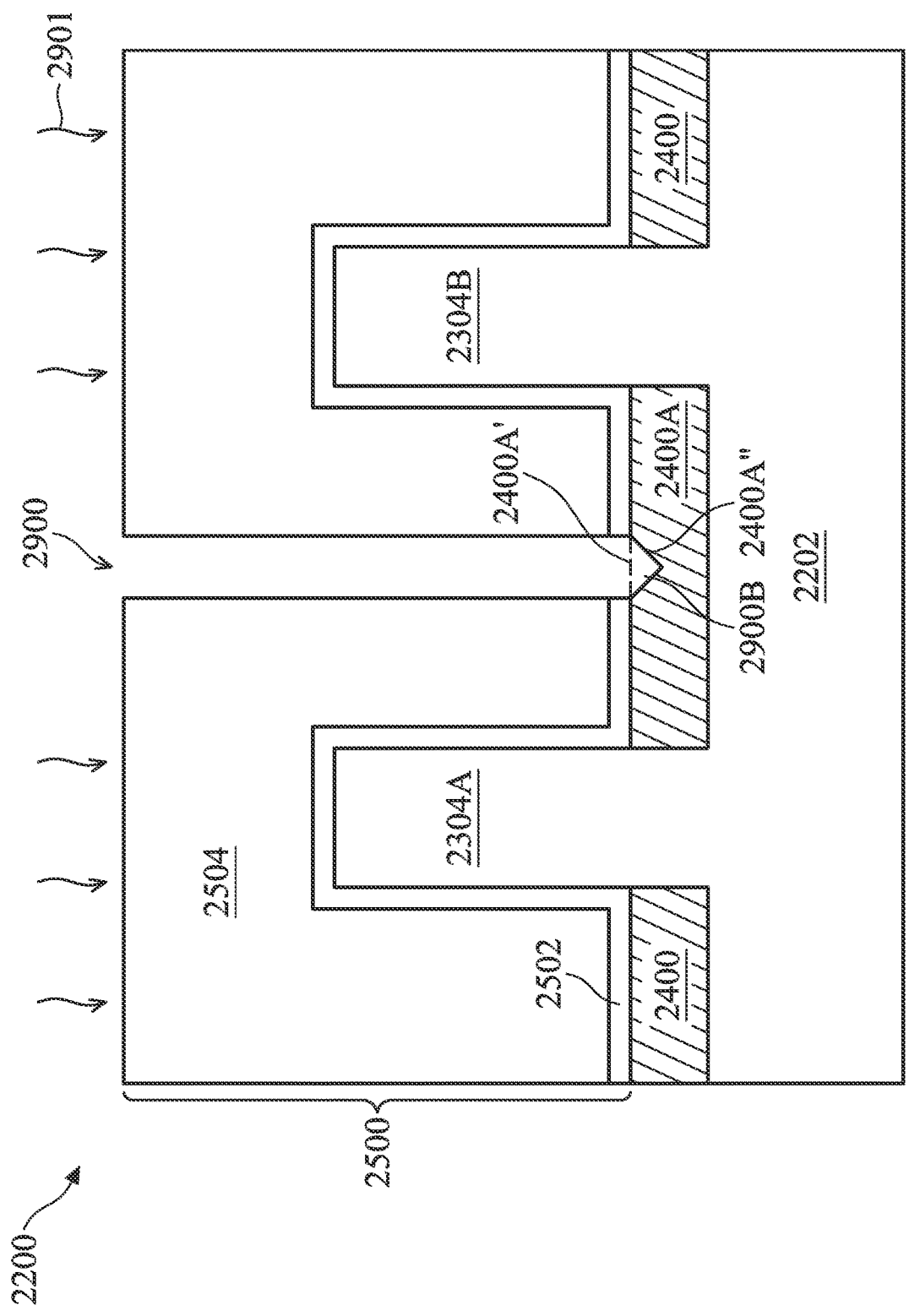
Figure 29D:
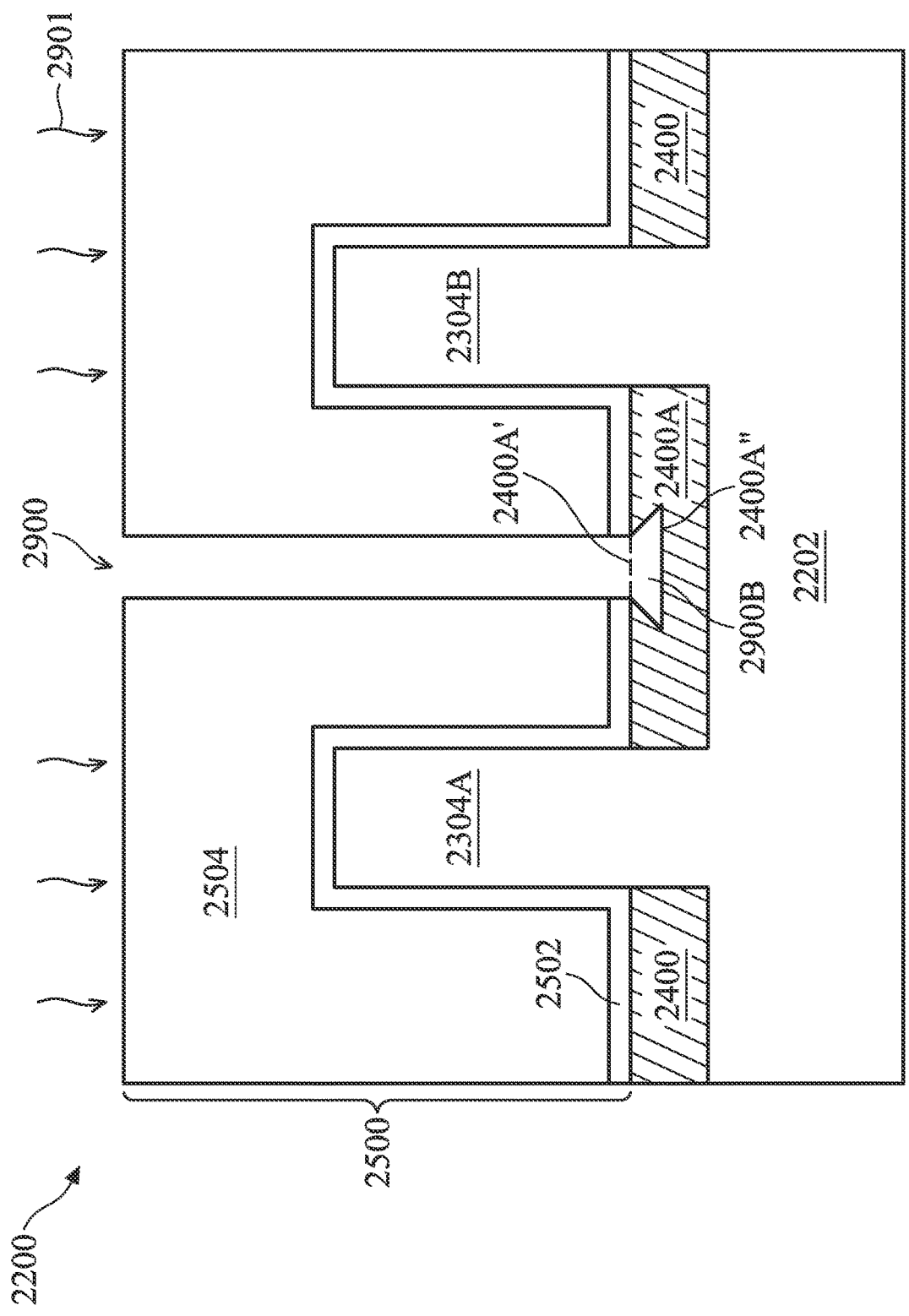
Figure 30B:
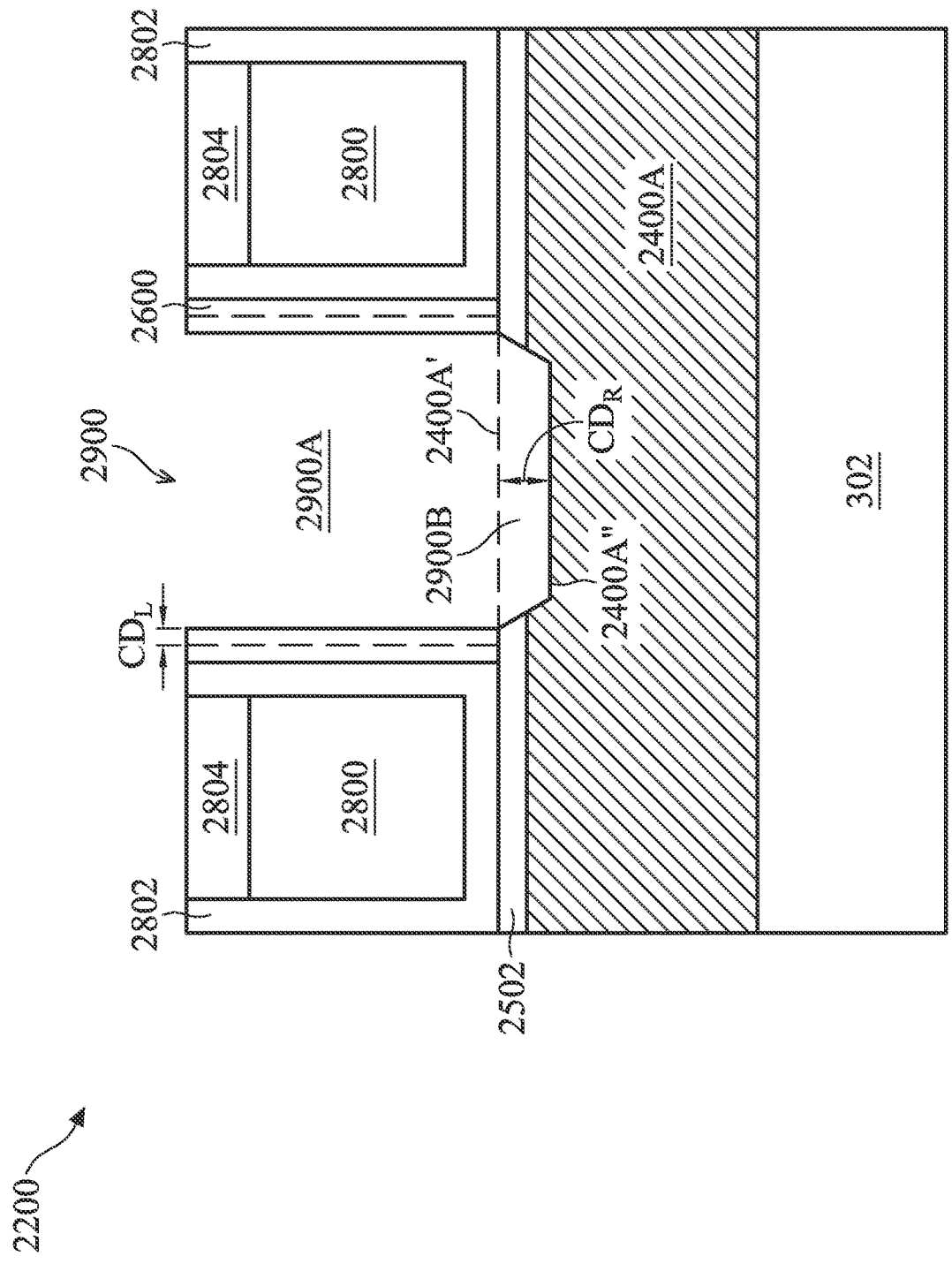
Figure 30C:
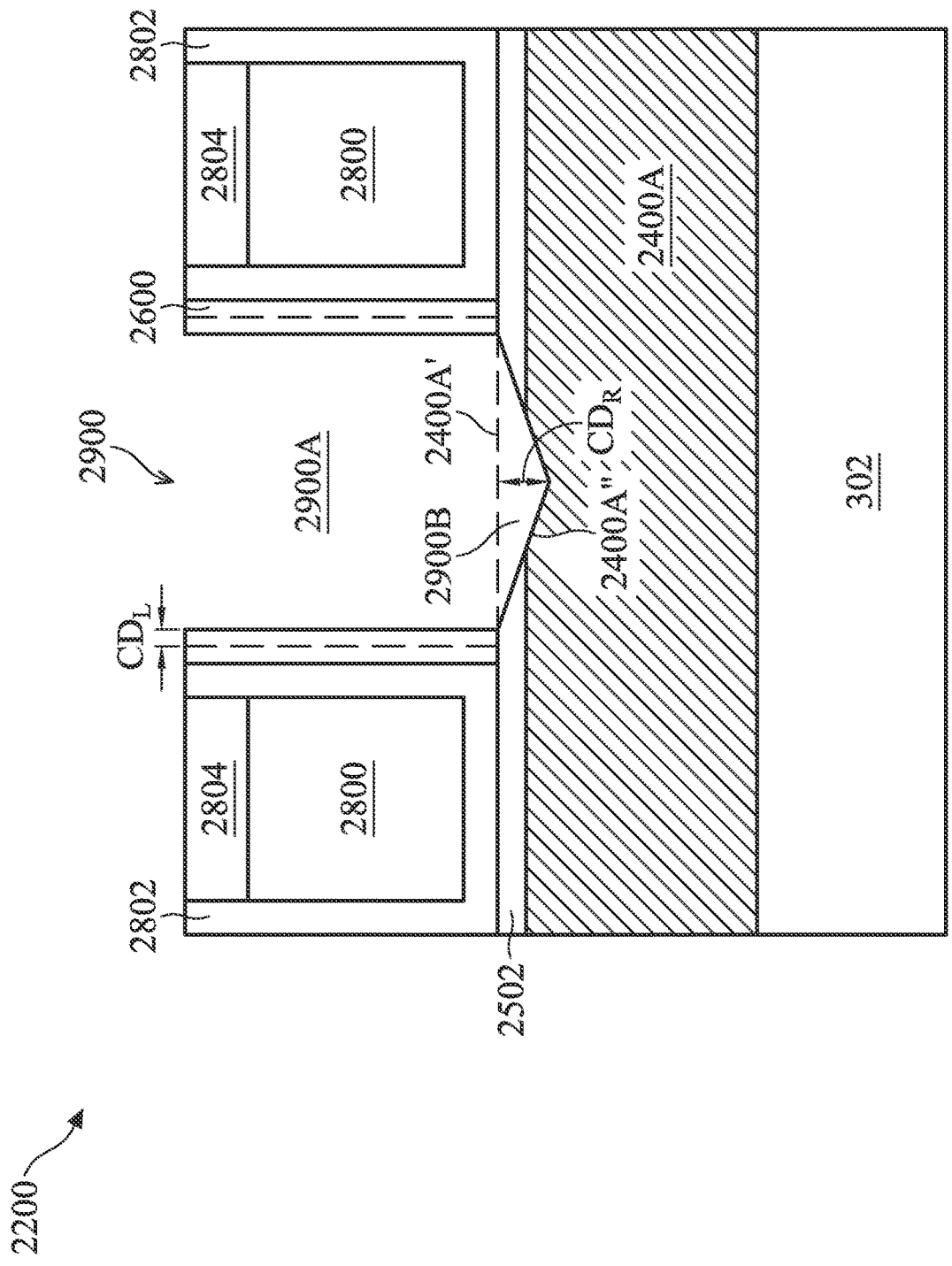
Figure 30D:
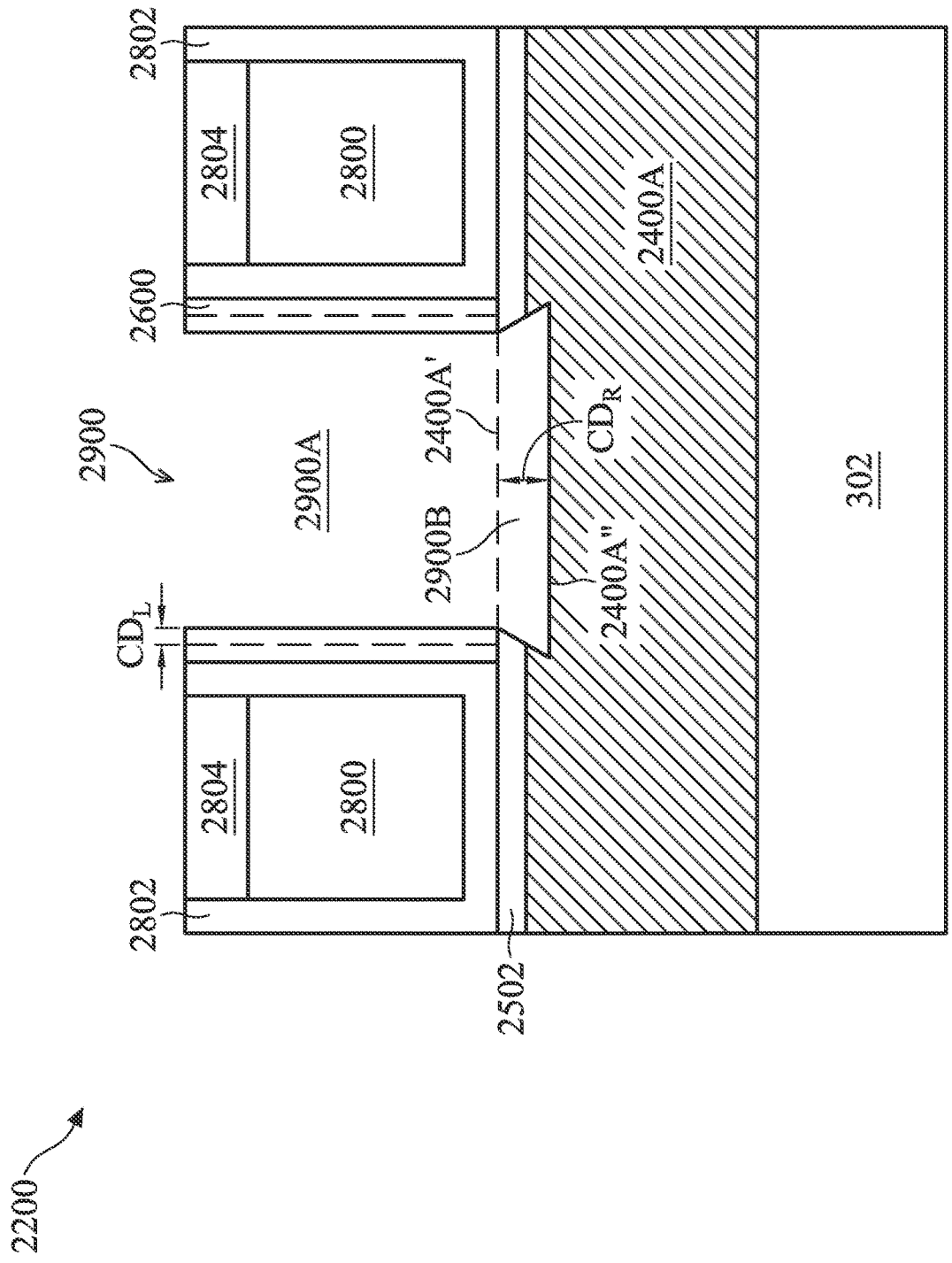

The cross-sectional views of FIGS. 29B-D illustrate various other embodiments of the cavity 2900, cut along the lengthwise direction of the dummy gate structure 2500, that have respective different profiles on their bottom surface; and the cross-sectional views of FIGS. 30B-D, cut along the extended direction of the isolation region 2400A, correspond to the cross-sectional views of FIGS. 29B-D, respectively.

For example in FIGS. 29B and 30B, the cavity 2900 has a portion of its bottom surface (e.g., the top surface 2400A") with a trapezoid-based profile that recesses into the isolation region 2400A. As illustrated, the portion of the bottom surface has a base and two legs, wherein the two legs are tilted away from each other. In some embodiments, any point of this portion of the bottom surface is on or below the pre-recessed top surface 2400A' of the isolation region 2400A, in which $CD_R$ (FIG. 30B), a difference between the top surface 2400A' and 2400A" can range from about 3 Å to about 300 Å, as a non-limiting example.

For example in FIGS. 29C and 30C, the cavity 2900 has a portion of its bottom surface (e.g., the top surface 2400A") with a valley-based profile that recesses into the isolation region 2400A. As illustrated, the portion of the bottom surface has two edges, wherein the two edges point to each other. In some embodiments, any point of this portion of the bottom surface is on or below the pre-recessed top surface 2400A' of the isolation region 2400A, in which $CD_R$ (FIG. 30C), a difference between the top surface 2400A' and 2400A" can range from about 3 Å to about 300 Å, as a non-limiting example.

For example in FIGS. 29D and 30D, the cavity 2900 has a portion of its bottom surface (e.g., the top surface 2900A") with another trapezoid-based profile that recesses into the isolation region 2400A. As illustrated, the portion of the bottom surface has a base and two legs, wherein the two legs are tilted toward each other. In some embodiments, any point of this portion of the bottom surface is on or below the pre-recessed top surface 2400A' of the isolation region 2400A, in which $CD_R$ (FIG. 30D), a difference between the top surface 2400A' and 2400A" can range from about 3 Å to about 300 Å, as a non-limiting example.

In some embodiments, during the process (e.g., the etching process 2901) of forming the cavity 2900, the gate spacer 2600 may be trimmed to have a thinner width, as indicated by dotted lines in FIGS. 30A-D. For example, when the gate spacer 2600 is formed of a material that has a relatively high etch selectivity with respect to the isolation region 2400A, the gate spacer 2600 may be trimmed less; and in comparison, when the gate spacer 2600 is formed of a material that has a relatively low etch selectivity with respect to the isolation region 2400A, the gate spacer 2600 may be trimmed more. Such loss of the gate spacer 2600 can be characterized with a critical dimension, $CD_L$ (FIGS. 30A-D), which can range from about 0 Å to about 500 Å, as a non-limiting example.

Figure 31:
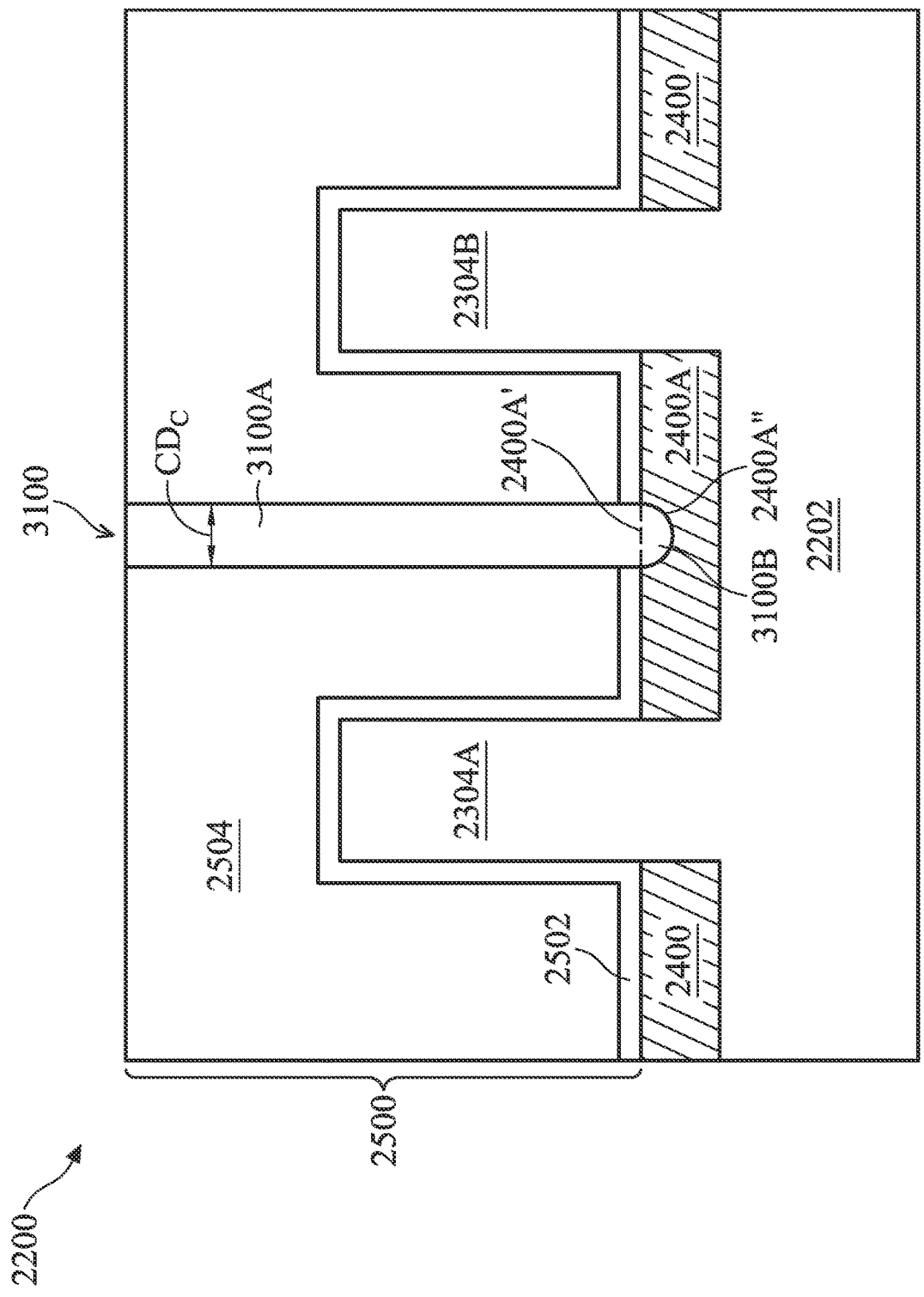
Figure 32:
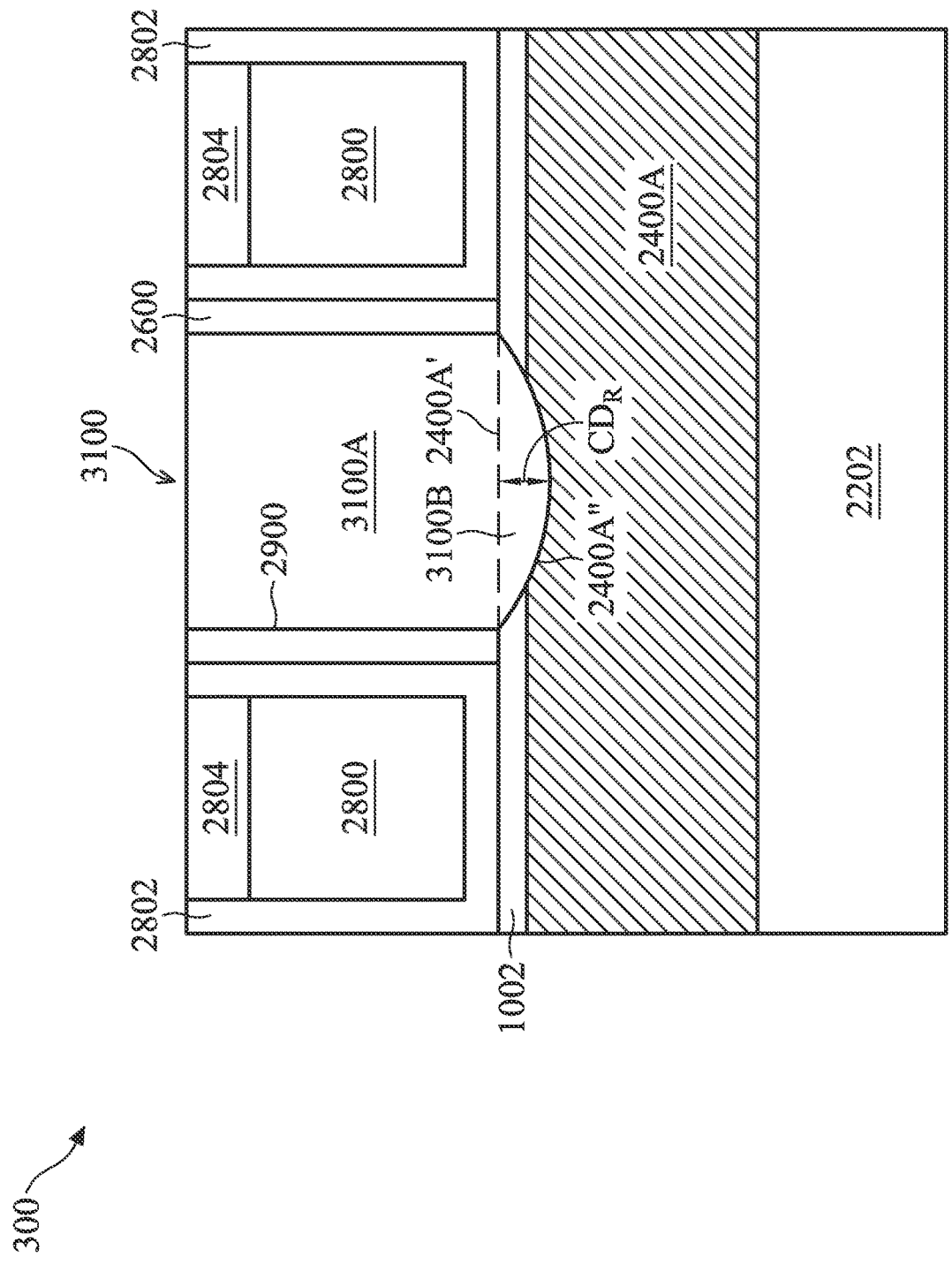

Corresponding to operation 2118 of FIG. 21, FIGS. 31 and 32 are cross-sectionals view of the FinFET device 2200 including a gate isolation structure 3100 at one of the various stages of fabrication. The cross-sectional view of FIG. 31 is cut along the lengthwise direction of the dummy gate structure 2500 (e.g., cross-section B-B indicated in FIG. 1); and the cross-sectional view of FIG. 32, corresponding to FIG. 31, is cut along the extended direction of the isolation region 2400A (e.g., a direction in parallel with cross-section A-A indicated in FIG. 1).

The gate isolation structure 3100 is formed by filling the cavity 2900 with a dielectric material, which can thus inherit the profile (or dimensions) of the cavity 2900. For example, the gate isolation structure 3100 can include a first portion 3100A and a second portion 3100B, wherein the second portion 3100B extends into the isolation region 2400A, as illustrated in FIGS. 31-32. Specifically, the gate isolation structure 3100 can also be characterized with $CD_C$ and $CD_R$. The example cavity 2900 shown in FIGS. 29A and 30A is used as a representative example for the following discussions of the gate isolation structure 3100. Accordingly, $CD_C$ may range from about 10 Å to about 5000 Å; the gate isolation structure 3100 also has a bottom surface with at least a portion of it having a curvature-based profile; and $CD_R$ may also range from about 3 Å to about 300 Å.

The dielectric material that is used to form the gate isolation structure 3100 may include, for example, silicon oxide, silicon nitride, silicon oxynitride, silicon carbide, silicon carbonitride, silicon oxycarbonitride, silicon oxycarbide, or combinations thereof. The gate isolation structure 3100 can be formed by depositing the dielectric material in the cavity 2900 using any suitable method, such as CVD, PECVD, or FCVD. After the deposition, a CMP may be performed to remove any excess dielectric material from the remaining dummy gate structure 2500.

Figure 33:
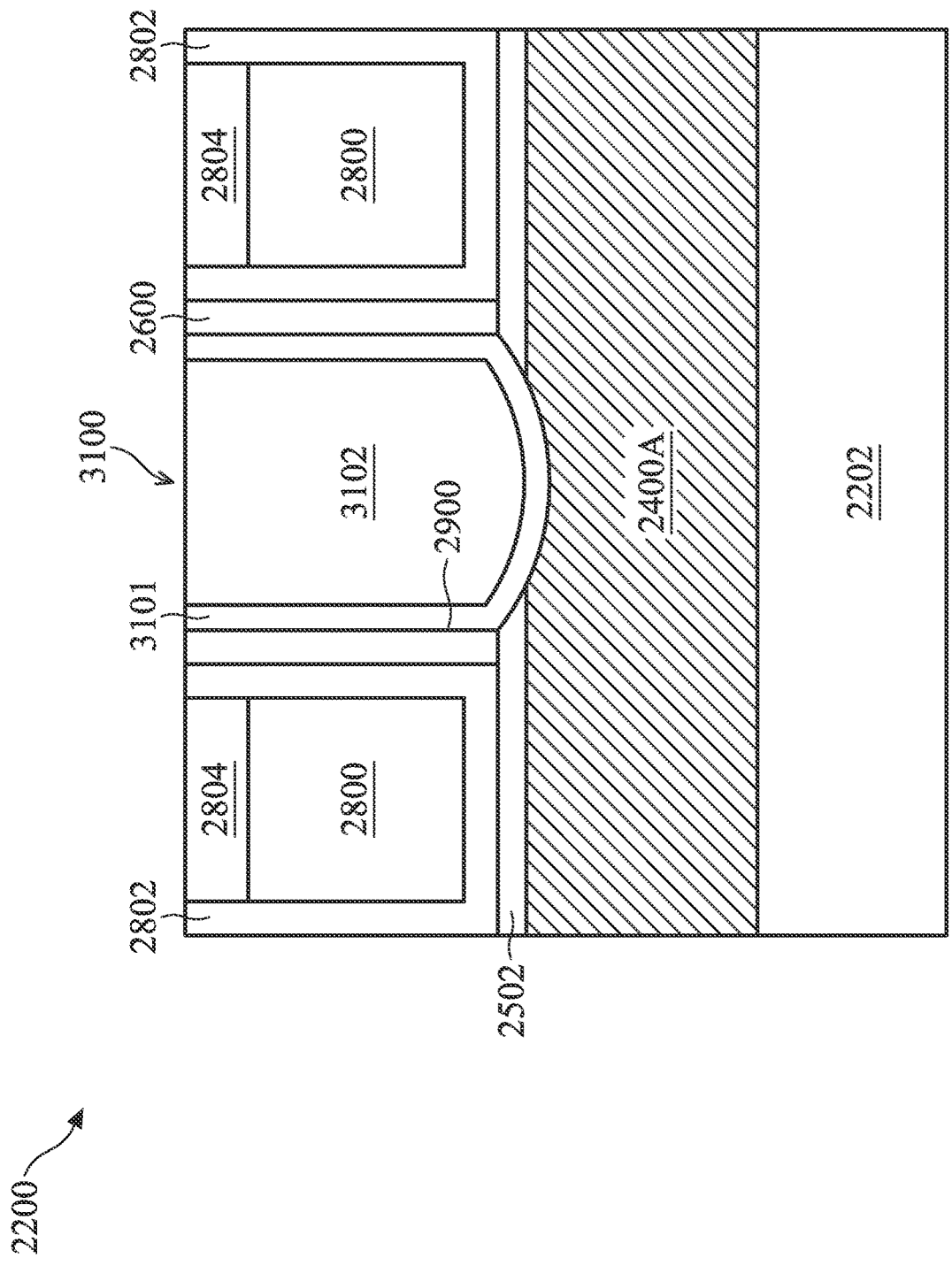
Figure 34:
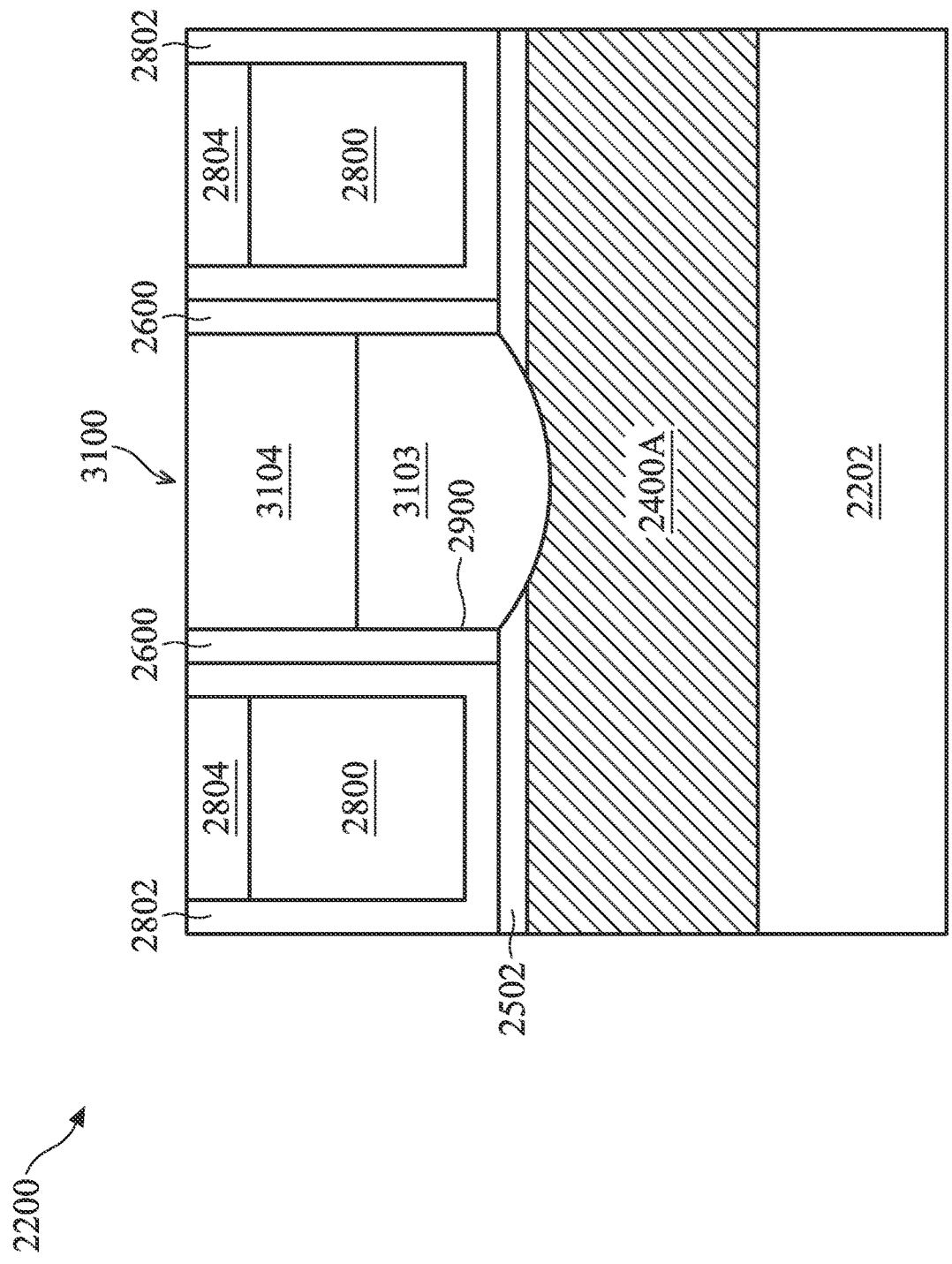

In comparison with the example of FIGS. 31-32 where the gate isolation structure 3100 fills the cavity 2900 with a single dielectric piece (which can include one or more dielectric materials listed above), FIGS. 33 and 34 illustrate various other embodiments of the gate isolation structure 3100 that includes multiple pieces, respectively. Each of the pieces may include, for example, silicon oxide, silicon nitride, silicon oxynitride, silicon carbide, silicon carbonitride, silicon oxycarbonitride, silicon oxycarbide, or combinations thereof. In the example of FIG. 33, the gate isolation structure 3100 includes a first piece 3101, which is formed as a conformal layer lining the cavity 2900, and a second piece 3102, which fills the cavity 2900 with the first piece coupled therebetween. In the example of FIG. 34, the gate isolation structure 3100 includes a first piece 3103, which fills a lower portion of the cavity 2900, and a second piece 3104, which fills an upper portion of the cavity 2900.

Figure 35:
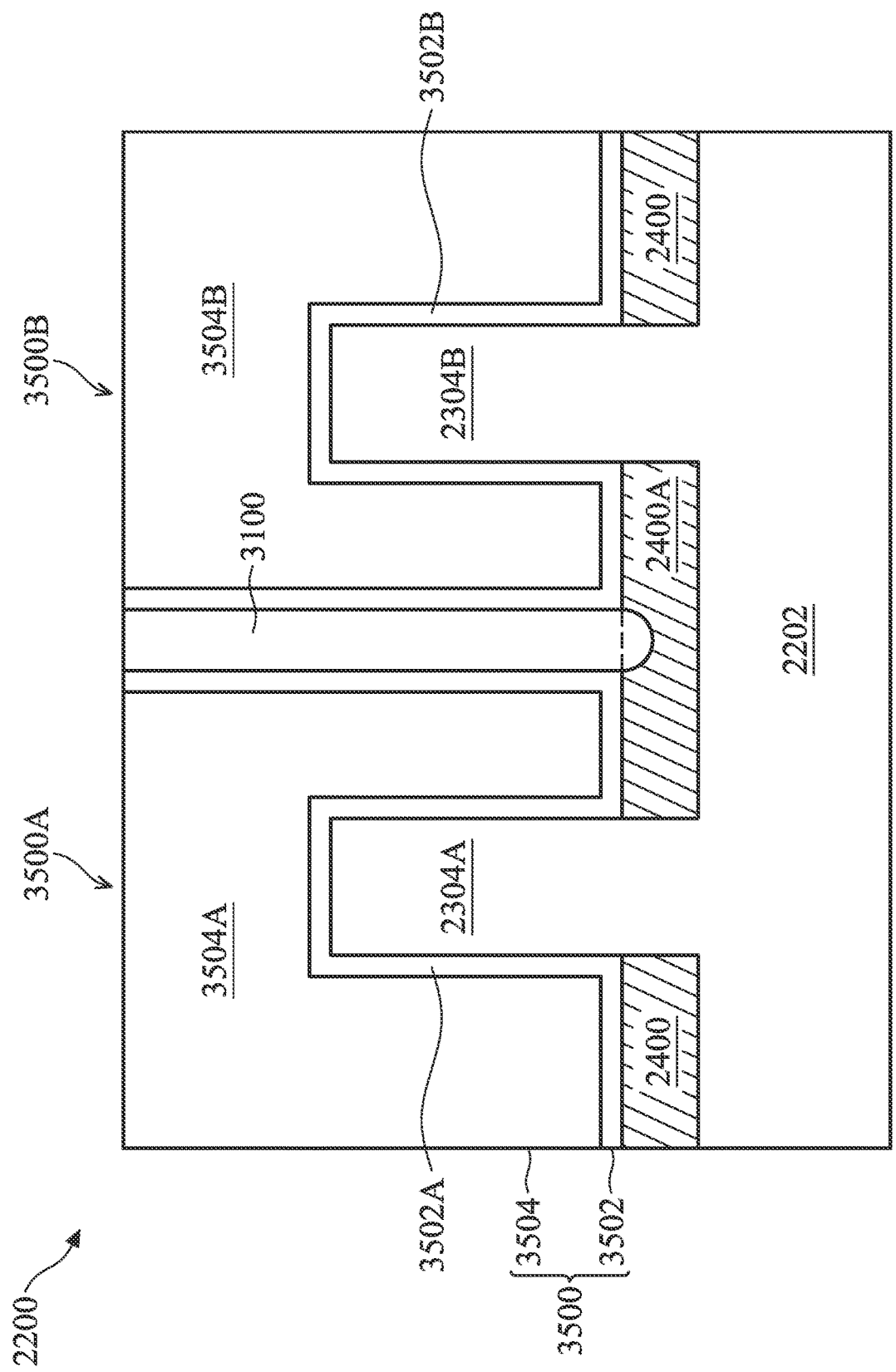

Corresponding to operation 2120 of FIG. 21, FIG. 35 is a cross-sectional view of the FinFET device 2200 including an active gate structure 3500 at one of the various stages of fabrication. The cross-sectional view of FIG. 35 is cut along a lengthwise direction of the active gate structure 3500 (e.g., cross-section B-B indicated in FIG. 1).

The active gate structure 3500 may be formed by replacing the dummy gate structure 2500. As illustrated, the active gate structure 3500 may include two portions 3500A and 3500B that are separated by the gate isolation structure 3100. The portion 3500A can overlay the active fin 2304A, and the portion 3500B can overlay the active fin 2304B. After the active gate structure 3500 is formed, the FinFET device 2200 can include a number of transistors. For example, a first active transistor, adopting the active fin 2304A as its conduction channel and portion 3500A as its active gate structure, may be formed; and a second active transistor, adopting the active fin 2304B as its conduction channel and portion 3500B as its active gate structure, may be formed.

The active gate structure 3500 can include a gate dielectric layer 3502, a metal gate layer 3504, and one or more other layers that are not shown for clarity. For example, the active gate structure 3500 may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layer 3502 is formed in a corresponding gate trench to surround (e.g., straddle) one or more fins. In an embodiment, the gate dielectric layer 3502 can be a remaining portion of the dummy gate dielectric 2502. In another embodiment, the gate dielectric layer 3502 can be formed by removing the dummy gate dielectric 2502, followed by conformal deposition or thermal reaction. In yet another embodiment, the gate dielectric layer 3502 can be formed by removing the dummy gate dielectric 2502, followed by no further processing step (i.e., the gate dielectric layer 3502 may be a native oxide over the active fins 2304A-B). The following discussions are directed to the gate dielectric layer 3502 that is formed by removing the dummy gate dielectric 2502 and performing conformal deposition. For example, the gate dielectric layer 3502 of the portion 3500A (sometimes referred to as "gate dielectric layer 3502A") is deposited in a gate trench that is formed by removing a portion of the dummy gate structure 2500 on the left-hand side of the gate isolation structure 3100. The gate dielectric layer 3502A can overlay the top surfaces and the sidewalls of the active fin 2304A. The gate dielectric layer 3502 of the portion 3500B (sometimes referred to as "gate dielectric layer 3502B") is deposited in a gate trench that is formed by removing a portion of the dummy gate structure 2500 on the right-hand side of the gate isolation structure 3100. The gate dielectric layer 3502B can overlay the top surfaces and the sidewalls of the active fin 2304B.

The gate dielectric layer 3502 includes silicon oxide, silicon nitride, or multilayers thereof. In example embodiments, the gate dielectric layer 3502 includes a high-k dielectric material, and in these embodiments, the gate dielectric layer 3502 may have a k value greater than about 7.0, and may include a metal oxide or a silicate of Hf, Al, Zr, La, Mg, Ba, Ti, Pb, or combinations thereof. The formation methods of gate dielectric layer 3502 may include molecular beam deposition (MBD), atomic layer deposition (ALD), PECVD, and the like. A thickness of the gate dielectric layer 3502 may be between about 8 Å and about 20 Å, as an example.

The metal gate layer 3504 is formed over the gate dielectric layer 3502. The metal gate layer 3504 of the portion 3500A (sometimes referred to as "metal gate layer 3504A") is deposited in the gate trench over the gate dielectric layer 3502A; and the metal gate layer 3504 of the portion 3500B (sometimes referred to as "metal gate layer 3504B") is deposited in the gate trench over the gate dielectric layer 3502B. The metal gate layer 3504 may be a P-type work function layer, an N-type work function layer, multi-layers thereof, or combinations thereof, in some embodiments. Accordingly, the metal gate layer 3504 is sometimes referred to as a work function layer. For example, the metal gate layer 3504 may be an N-type work function layer. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

By forming the gate isolation structure 3100 extending into the isolation region 2400A, the function of the gate isolation structure 3100, i.e., electrically isolating the metal gate layers 3504A and 3504B, can be assured. Extending the etching process (of forming the cavity 2900) to an upper portion of the isolation region 2400A can assure no void exists between the gate isolation structure 3100 and the isolation region 2400A, when forming the metal gate layers 3504A and 3504B. As such, a merge of these two metal gate layers 3504A and 3504B (e.g., below the gate isolation structure 3100) can be advantageously avoided. Accordingly, the gate isolation structure 3100 can remain electrically isolating the metal layers (of the respective active gate structures) disposed on the opposite sides of the gate isolation structure 3100.

In one aspect of the present disclosure, a semiconductor device is disclosed. The semiconductor device includes a first semiconductor fin extending along a first direction. The semiconductor device includes a second semiconductor fin also extending along the first direction. The semiconductor device includes a dielectric structure disposed between the first and second semiconductor fins. The semiconductor device includes a gate isolation structure vertically disposed above the dielectric structure. The semiconductor device includes a metal gate layer extending along a second direction perpendicular to the first direction, wherein the metal gate layer includes a first portion straddling the first semiconductor fin and a second portion straddling the second semiconductor fin. The gate isolation structure separates the first and second portions of the metal gate layer from each other and includes a bottom portion extending into the dielectric structure.

In another aspect of the present disclosure, a semiconductor device is disclosed. The semiconductor device includes a first transistor, formed over a substrate, that includes a first conduction channel, and a first portion of a metal gate layer over the first conduction channel. The semiconductor device includes a second transistor, formed over the substrate, that includes a second conduction channel, and a second portion of the metal gate layer over the second conduction channel. The semiconductor device includes a dielectric structure disposed between the first and second conduction channels. The semiconductor device includes a gate isolation structure vertically disposed above the dielectric structure. The gate isolation structure separates the first and second portions of the metal gate layer apart from each other and includes a bottom surface that is vertically lower than a top surface of the dielectric structure.

In yet another aspect of the present disclosure, a method for fabricating a semiconductor device is disclosed. The method includes forming a first semiconductor fin and a second semiconductor fin extending along a lateral direction on a substrate. The first and second semiconductor fins are separated apart from each other by a dielectric structure. The method includes forming a gate isolation structure vertically above the dielectric structure. The gate isolation structure separates apart a first portion of a metal gate layer, which is over the first semiconductor fin, and a second portion of the metal gate layer, which is over the second semiconductor fin, and includes a bottom portion extending into the dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first semiconductor fin extending along a first direction;
   a second semiconductor fin also extending along the first direction;
   an isolation region disposed between respective lower portions of the first and second semiconductor fins;
   a dielectric structure disposed between the first and second semiconductor fins and above the isolation region, with a bottom surface aligned with a top surface of the isolation region;
   a gate isolation structure vertically disposed above the dielectric structure;
   a metal gate layer extending along a second direction perpendicular to the first direction, wherein the metal gate layer includes a first portion straddling the first semiconductor fin and a second portion straddling the second semiconductor fin, wherein the gate isolation structure separates the first and second portions of the metal gate layer from each other and includes a top portion vertically extending above the dielectric structure and a bottom portion extending into the dielectric structure, and wherein a width of the top portion of the gate isolation is greater than a width of the dielectric structure; and
a gate spacer, wherein the gate spacer includes a first portion extending along sidewalls of the metal gate layer that are parallel with the second direction and a second portion along sidewalls of the gate isolation structure that are parallel with the second direction, a thickness of the second portion of the gate spacer along the first direction being less than a thickness of the first portion of the gate spacer along the first direction.

2. The semiconductor device of claim 1, wherein the dielectric structure includes a dielectric fin also extending along the first direction.

3. The semiconductor device of claim 1, wherein the bottom portion has a curve-based bottom surface.

4. The semiconductor device of claim 3, wherein the curve-based bottom surface is in direct contact with a recessed surface of the dielectric structure.

5. The semiconductor device of claim 1, further comprising a gate dielectric disposed between the metal gate layer and each of the first and second semiconductor fins.

6. The semiconductor device of claim 1, wherein when the dielectric structure includes a dielectric fin also extending along the first direction, the dielectric fin has a width along the second direction that is less than, equal to, or greater than a width of the gate isolation structure along the second direction.

7. The semiconductor device of claim 6, wherein when the width of the dielectric fin is less than the width of the gate isolation structure, the bottom portion having a curve-based bottom surface and line-based bottom surfaces connected to two ends of the curve-based bottom surface.

8. The semiconductor device of claim 1, wherein the bottom portion is located below a bottom surface of the gate spacer.

9. The semiconductor device of claim 6, wherein the dielectric fin protrudes from the isolation region.

10. The semiconductor device of claim 7, wherein the line-based bottom surfaces are aligned with a top surface of the dielectric fin, while the curve-based bottom surface is located below the top surface of the dielectric fin.

11. A semiconductor device, comprising:
a first transistor, formed over a substrate, that comprises:
a first conduction channel; and
a first portion of a metal gate layer over the first conduction channel;
a second transistor, formed over the substrate, that comprises:
a second conduction channel; and
a second portion of the metal gate layer over the second conduction channel;
an isolation region disposed between respective lower portions of the first and second semiconductor;
a dielectric structure disposed between the first and second conduction channels and above the isolation region, with a bottom surface aligned with a top surface of the isolation region;
a gate isolation structure vertically disposed above the dielectric structure, wherein the gate isolation structure separates the first and second portions of the metal gate layer apart from each other and includes a top portion vertically that extends above the dielectric structure and a bottom surface that is vertically lower than a top surface of the dielectric structure, wherein a width of the top portion of the gate isolation is greater than a width of the dielectric structure; and
a gate spacer, wherein the gate spacer includes a first portion extending along sidewalls of the first portion of the metal gate layer, a second portion extending along sidewalls of the second portion of the metal gate layer, and a third portion along sidewalls of the gate isolation structure, a thickness of the third portion of the gate spacer being less than a thickness of the first or second portion of the gate spacer.

12. The semiconductor device of claim 11, wherein each of the first and second conduction channel includes a semiconductor fin protruding from the substrate.

13. The semiconductor device of claim 11, wherein each of the first and second conduction channel includes a plurality of nanostructures vertically separated apart from each other.

14. The semiconductor device of claim 11, wherein the dielectric structure includes a dielectric fin protruding from the substrate.

15. The semiconductor device of claim 11, wherein the bottom surface of the gate isolation structure has a curve-based profile.

16. The semiconductor device of claim 11, wherein the bottom surface of the gate isolation structure is in direct contact with the top surface of the dielectric structure.

17. The semiconductor device of claim 11, wherein the bottom surface is located below a bottom surface of the gate spacer.

18. The semiconductor device of claim 14, wherein the dielectric fin protrudes from the isolation region.

19. A method of fabricating a semiconductor device, comprising:
forming a first semiconductor fin and a second semiconductor fin extending along a lateral direction on a substrate, wherein respective lower portions of the first and second semiconductor fins are separated apart from each other by an isolation region, wherein the first and second semiconductor fins are further separated apart from each other by a dielectric structure disposed above the isolation region, and wherein the dielectric structure has a bottom surface aligned with a top surface of the isolation region;
forming a gate isolation structure vertically above the dielectric structure;
forming a first portion of a metal gate layer over the first semiconductor fin; and
forming a second portion of the metal gate layer over the second semiconductor fin,
wherein the gate isolation structure separates apart the first portion of the metal gate layer and the second portion of the metal gate layer and includes a top portion vertically extending above the dielectric structure and a bottom portion extending into the dielectric structure, and wherein a width of the top portion of the gate isolation is greater than a width of the dielectric structure;
wherein a gate spacer includes a first portion extending along sidewalls of the first portion of the metal gate layer, a second portion extending along sidewalls of the second portion of the metal gate layer, and a third portion along sidewalls of the gate isolation structure, a thickness of the third portion of the gate spacer being less than a thickness of the first or second portion of the gate spacer.

20. The method of claim 19, wherein the dielectric structure includes a dielectric fin also extending along the lateral direction.

\* \* \* \* \*